(12) United States Patent
Jeong et al.

(10) Patent No.: US 11,037,996 B2
(45) Date of Patent: *Jun. 15, 2021

(54) DISPLAY DEVICE HAVING AN INPUT SENSING UNIT

(71) Applicant: Samsung Display Co., Ltd., Yongin-si (KR)

(72) Inventors: Hwan-Hee Jeong, Cheonan-si (KR); Sungjae Moon, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/654,913

(22) Filed: Oct. 16, 2019

(65) Prior Publication Data

US 2020/0052044 A1 Feb. 13, 2020

Related U.S. Application Data

(63) Continuation of application No. 16/053,477, filed on Aug. 2, 2018, now Pat. No. 10,475,862.

(30) Foreign Application Priority Data

Aug. 14, 2017 (KR) .......................... 10-2017-0103237

(51) Int. Cl.
  *H01L 27/32* (2006.01)
  *H01L 51/52* (2006.01)
  (Continued)

(52) U.S. Cl.
  CPC .......... *H01L 27/323* (2013.01); *G06F 3/0443* (2019.05); *G06F 3/0446* (2019.05); *G06F 3/0448* (2019.05); *G06F 3/04164* (2019.05); *H01L 27/3223* (2013.01); *H01L 27/3262* (2013.01); *H01L 51/5256* (2013.01); *H01L 51/5281* (2013.01); *G06F 3/0412* (2013.01); *G06F 2203/04102* (2013.01); *G06F 2203/04107* (2013.01); *G06F 2203/04111* (2013.01); *H01L 27/3276* (2013.01)

(58) Field of Classification Search
  CPC ...... G06F 3/0412; G06F 3/0416; G06F 3/044; G06F 2203/04102; G06F 2203/04107; G06F 2203/04111; H01L 27/3223; H01L 27/323; H01L 27/3262; H01L 51/5256; H01L 51/5281; H01L 27/3276
  See application file for complete search history.

(56) References Cited

U.S. PATENT DOCUMENTS 10,475,862 B2 * 11/2019 Jeong .................. H01L 27/3262
2016/0092004 A1 3/2016 Yoshiki
(Continued)

FOREIGN PATENT DOCUMENTS

JP 6219226 B2 10/2017
KR 10-2013-0044432 A 5/2013
(Continued)

*Primary Examiner* — Stacy Khoo
(74) *Attorney, Agent, or Firm* — Lewis Roca Rothgerber Christie LLP

(57) ABSTRACT

A display device includes a display panel and an input-sensing unit located on the display panel. The input-sensing unit includes a plurality of sensor portions. At least one of the sensor portions is different from the others in terms of area or distance.

14 Claims, 46 Drawing Sheets

(51) Int. Cl.
  *G06F 3/041*   (2006.01)
  *G06F 3/044*   (2006.01)

(56) References Cited

U.S. PATENT DOCUMENTS

| | | |
|---|---|---|
| 2016/0147375 A1 | 5/2016 | Bok et al. |
| 2016/0170523 A1 | 6/2016 | Park et al. |
| 2016/0282992 A1 | 9/2016 | Song |
| 2018/0120988 A1 | 5/2018 | Kim et al. |
| 2018/0348929 A1* | 12/2018 | Rhe ...................... G06F 3/0412 |

FOREIGN PATENT DOCUMENTS

| | | |
|---|---|---|
| KR | 10-2016-0063540 A | 6/2016 |
| KR | 10-2016-0072909 A | 6/2016 |
| KR | 10-2016-0115521 A | 10/2016 |
| KR | 10-2018-0046442 A | 5/2018 |

\* cited by examiner

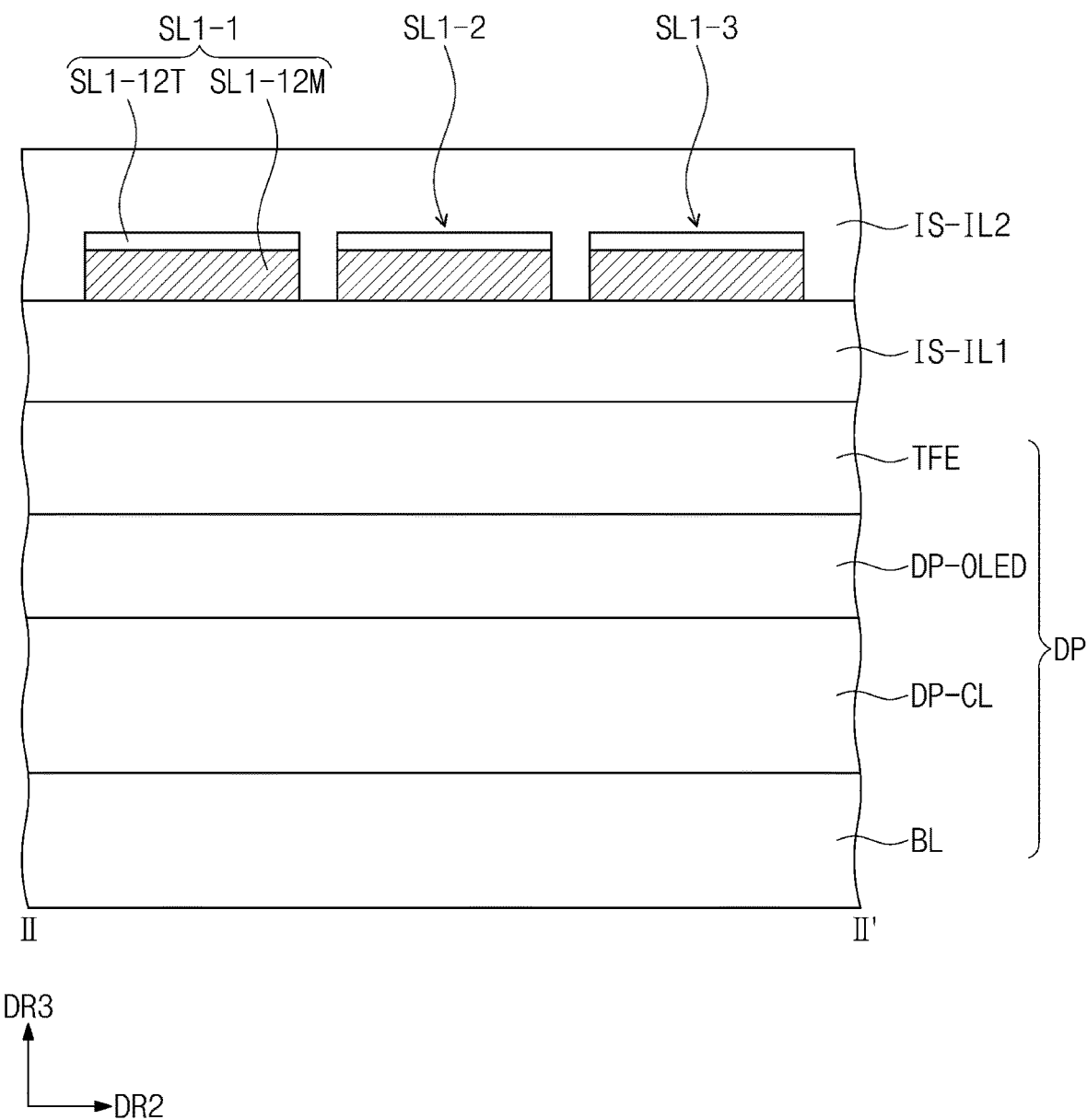

DISPLAY DEVICE HAVING AN INPUT SENSING UNIT

CROSS-REFERENCE TO RELATED APPLICATION

This application is a continuation of U.S. patent application Ser. No. 16/053,477, filed on Aug. 2, 2018, which claims priority to and the benefit of Korean Patent Application No. 10-2017-0103237, filed on Aug. 14, 2017, in the Korean Intellectual Property Office, the entire contents of each of which are hereby incorporated by reference.

BACKGROUND

The present disclosure relates to a display device, in which an input-sensing unit capable of sensing a touch event from a user is provided.

Various display devices are being developed for use in multimedia devices such as televisions, mobile phones, tablet computers, navigation systems, gaming machines, and the like. A keyboard or mouse may be used as an input device of the display device. In certain embodiments, an input-sensing unit may be used as the input device of the display device.

The input-sensing unit may be configured to sense whether an object (e.g., a finger of a human) is in contact or touch with a screen of the display device. In the input-sensing unit, a touch event may be detected by various methods (e.g., a resistance-layer method, a photo-sensing method, a capacitance-sensing method, and an ultrasonic wave sensing method). In the capacitance-sensing method, a change in capacitance, which is caused when the object is touching the screen of the display device, is used to determine whether a touch event occurs.

SUMMARY

Some embodiments of the inventive concept provide a display device including an input-sensing unit, in which capacitance between sensors is uniform.

According to some embodiments of the inventive concept, a display device may include a display panel and an input-sensing unit on the display panel.

In some embodiments, the input-sensing unit may include a plurality of first electrodes extending in a first direction and a plurality of second electrodes extending in a second direction crossing the first direction.

In some embodiments, each of the plurality of first electrodes may include a plurality of first sensor portions and a plurality of first connecting portions connecting the plurality of first sensor portions to each other, and each of the plurality of second electrodes may include a plurality of second sensor portions and a plurality of second connecting portions connecting the plurality of second sensor portions to each other.

In some embodiments, the plurality of first sensor portions of one of the plurality of first electrodes may include a first normal sensor portion having a first area and being spaced apart from an adjacent one of the second sensor portions by a first distance and a first severed sensor portion having a second area smaller than the first area and being spaced apart from an adjacent one of the second sensor portions by a second distance that is smaller than the first distance.

In some embodiments, the first severed sensor portion may have a shape which can be made by removing a portion of a shape of the first normal sensor portion.

In some embodiments, the second area may be less than or larger than half the first area.

In some embodiments, the plurality of first sensor portions of the one of the first electrodes may include a plurality of the first normal sensor portions, and the plurality of the first normal sensor portions may be arranged in the first direction. The first severed sensor portion may be placed outside the plurality of the first normal sensor portions in the first direction.

In some embodiments, the display device may further include an optical dummy electrode located between the plurality of first sensors and the plurality of second sensors and electrically disconnected from the plurality of first sensors and the plurality of second sensors. A width of the optical dummy electrode between the first severed sensor portion and the second sensor portion adjacent to the first severed sensor portion may be smaller than a width of the optical dummy electrode between the first normal sensor portion and the second sensor portion adjacent to the first normal sensor portion.

In some embodiments, a length from an end of the first severed sensor portion to another end of a first sensor portion adjacent to the first severed sensor portion measured in the first direction may be smaller than a length from an end of a first normal sensor portion of the plurality of normal sensor portions to another end of a first sensor portion adjacent to the first normal sensor portion measured in the first direction, and an area of the first sensor portion adjacent to the first severed sensor portion may be substantially the same as the second area.

In some embodiments, the plurality of first electrodes may include another first electrode with a length in the first direction that is different from a length in the first direction of the one of the first electrodes, and which includes a plurality of first sensor portions. The plurality of first sensor portions of the another first electrode may include a second normal sensor portion having the first area and a second severed sensor portion having a third area different from the first area and the second area.

In some embodiments, an end of the first severed sensor portion may be connected to an end of an adjacent one of the plurality of first sensor portions of the one of the first electrodes by a corresponding one of the first connecting portions, and an end of the second severed sensor portion may be connected to an end of an adjacent one of the plurality of first sensor portions of the another first electrode by a corresponding one of the first connecting portions. A length from another end of the first severed sensor portion to another end of the adjacent one of the plurality of first sensor portions of the one of the first electrodes may be smaller than a length from another end of the second severed sensor portion to another end of the adjacent one of the plurality of first sensor portions of the another first electrode.

In some embodiments, the third area may be half the first area.

In some embodiments, the display device may further include an auxiliary electrode connected to the first severed sensor portion. A side edge of the auxiliary electrode may face a side edge of the second sensor portion adjacent to the first severed sensor portion.

In some embodiments, the auxiliary electrode may have a rod shape, and a length of the auxiliary electrode may be smaller than a width of the normal sensor portion.

In some embodiments, the input-sensing unit may further include a plurality of signal lines, which are connected to the plurality of second electrodes, and a compensation electrode, which is connected to the first severed sensor portion, the compensation electrode being on a layer different from that for the plurality of signal lines, and overlapped with at least one of the plurality of signal lines.

In some embodiments, the compensation electrode and the first severed sensor portion may be integrally formed.

In some embodiments, when viewed in a plan view, a side edge of the first severed sensor portion may have a curved shape, and the compensation electrode may extend at the side edge of the first severed sensor portion.

In some embodiments, one of the plurality of first connecting portions which is used to connect adjacent ones of the first normal sensor portions may have a width smaller than that of another of the plurality of first connecting portions which is used to connect the first severed sensor portion to a first normal sensor portion adjacent to the first severed sensor portion.

In some embodiments, the display device may further include a first electrostatic discharge pattern connected to the first severed sensor portion and overlapped with at least one of the plurality of second electrodes and a second electrostatic discharge pattern connected to the first normal sensor portion and overlapped with at least one of the plurality of second electrodes. The first electrostatic discharge pattern may have a first width, and the second electrostatic discharge pattern may have a second width smaller than the first width.

In some embodiments, the display panel includes corners, the corners having a rounded shape, the input-sensing unit includes corners having a rounded shape corresponding to that of the corners of the display panel, and the first severed sensor portion is adjacent to the corner of the input-sensing unit.

In some embodiments, the input-sensing unit may include a sensing region, in which the plurality of first electrodes and the plurality of second electrodes are located, and a non-sensing region, in which the plurality of first electrodes and the plurality of second electrodes are not located. A boundary may be defined between the non-sensing region and the sensing region, and a side edge of the first severed sensor portion may correspond to the boundary.

According to some embodiments of the inventive concept, a display device may include a plurality of first sensors including a normal sensor portion and a severed sensor portion and a plurality of second sensors crossing the plurality of first sensor portions. The normal and severed sensor portions may have first and second areas, respectively, and the second area may be 0.05-0.45 times the first area. A capacitance between the normal sensor portion and one of the second sensors adjacent thereto may be substantially the same as a capacitance between the severed sensor portion and one of the second sensors adjacent thereto.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 10D and 10E are sectional views taken along line II-II' of FIG. 9 according to embodiments of the inventive concept.

Figure 1:
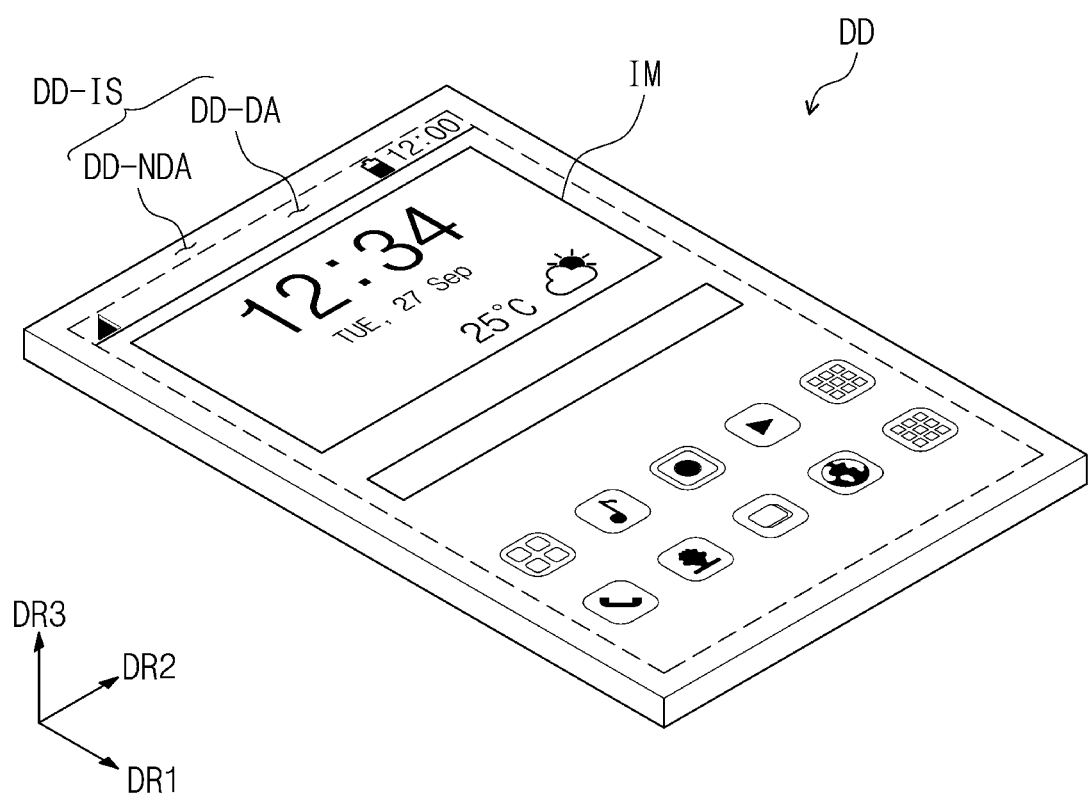
FIG. 1 is a perspective view illustrating a display device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

FIG. 1 is a perspective view illustrating a display device DD according to some embodiments of the inventive concept. As shown in FIG. 1, the display device DD may include a display surface DD-IS, which is used to display an image IM. The display surface DD-IS may be defined to be parallel to a first direction axis DR1 and a second direction axis DR2. A normal direction of the display surface DD-IS (i.e., a thickness direction of the display device DD) will be referred to as a third direction axis DR3.

Hereinafter, the third direction axis DR3 may be used to differentiate a front or top surface of each element from a back or bottom surface. However, directions indicated by the first to third direction axes DR1, DR2, and DR3 may be relative concepts and may not be limited to the above example, and, in some embodiments, they may be changed to indicate other directions. Hereinafter, first to third directions may be directions indicated by the first to third direction axes DR1, DR2, and DR3, respectively, and will be identified with the same reference numbers.

In FIG. 1, the display device DD is illustrated to have a flat display surface, but the inventive concept is not limited thereto. The display surface of the display device DD may have a curved or three-dimensional shape. In the case where the display device DD has the three-dimensional display surface, the display surface may include a plurality of display regions that are oriented in different directions. For example, the display device DD may have a display surface that is shaped like a polygonal pillar.

In the present embodiment, the display device DD may be a rigid display device. However, the inventive concept is not limited thereto, and in some embodiments, the display device DD may be a flexible display device. In the present embodiment, the display device DD, which can be used for a cellphone terminal, is exemplarily illustrated. Although not shown, a mainboard mounted with electronic modules, a camera module, a power module, and so forth, along with the display device DD, may be provided in a bracket or case to constitute a cellphone terminal. The display device DD may be used for large-sized electronic devices (e.g., television sets and monitors) or small- or medium-sized electronic devices (e.g., tablets, car navigation systems, game machines, and smart watches).

As shown in FIG. 1, the display surface DD-IS may include a display region DD-DA, which is used to display the image IM, and a non-display region DD-NDA, which is provided to be adjacent to the display region DD-DA. In some embodiments, the non-display area DD-NDA is not used to display an image. As an example of the image IM, icon images are shown in FIG. 1.

As shown in FIG. 1, the display region DD-DA may have a rectangular shape. The non-display region DD-NDA may be provided to surround the display region DD-DA. However, the inventive concept is not limited to this example, and in some embodiments, shapes of the display and non-display regions DD-DA and DD-NDA may be variously changed in a complementary manner.

FIGS. 2A to 2F are sectional views illustrating display devices according to some embodiments of the inventive concept. FIGS. 2A to 2F illustrate vertical sections, each of which is taken on a plane defined by the second and third directions DR2 and DR3. In FIGS. 2A to 2F, the display device DD is illustrated in a simplified manner in order to describe a stacking structure of a functional panel and/or functional units therein.

In some embodiments, the display device DD may include a display panel, an input-sensing unit, an anti-reflection unit, and a window unit. At least two of the display panel, the input-sensing unit, the anti-reflection unit, and the window unit may be successively formed by a successive process or may be combined with each other (e.g., attached) by an adhesive member. FIGS. 2A to 2F illustrate examples in which an optically clear adhesive OCA is used as the adhesive member. In various embodiments to be described below, the adhesive member may be an adhesive material or a gluing agent. In certain embodiments, the anti-reflection unit and the window unit may be replaced with other unit or may be omitted.

In FIGS. 2A to 2F, if a unit (e.g., the input-sensing unit, the anti-reflection unit, or the window unit) is formed on another element by a successive process, the unit will be expressed using a term "layer". If a unit (e.g., the input-sensing unit, the anti-reflection unit, or the window unit) is combined with (e.g., attached to) another element by an adhesive member, the unit will be expressed using a term "panel". The unit expressed using the term "panel" may include a base layer (e.g., a synthetic resin film, a composite film, or a glass substrate) providing a base surface, but the unit expressed using the term "layer" may omit the base layer. In other words, the unit expressed using the term "panel" may be placed on a base surface that is provided by another element or unit.

The input-sensing unit, the anti-reflection unit, and the window unit may be referred to as an input-sensing panel ISP, an anti-reflection panel RPP, and a window panel WP or to as an input-sensing layer ISL, an anti-reflection layer RPL, and a window layer WL, according to whether the units are formed on another element by successive process or are combined with another element by an adhesive member, and/or according to the presence or absence of a base layer.

Figure 2A:
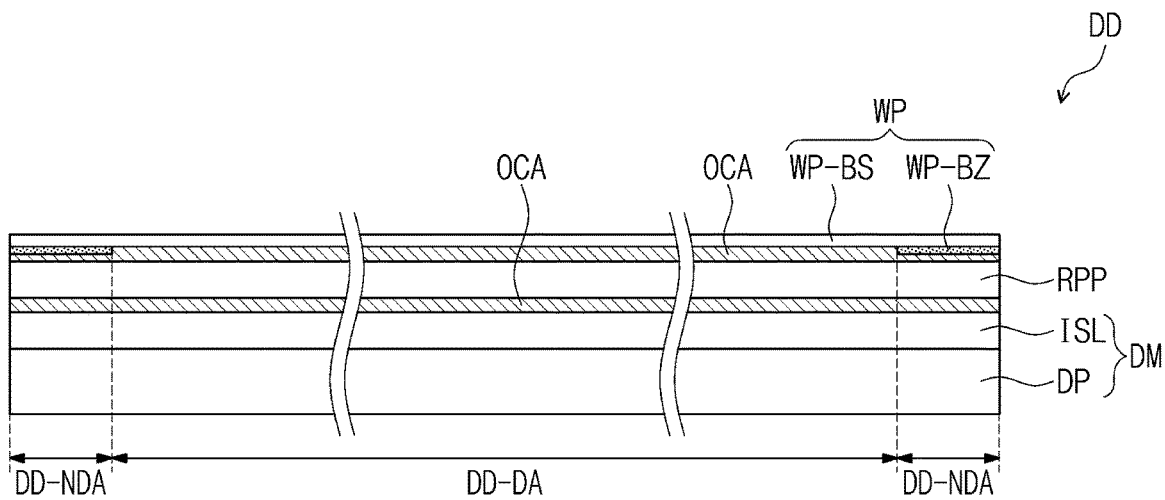
FIGS. 2A to 2F are sectional views illustrating display devices according to some embodiments of the inventive concept.

As shown in FIG. 2A, the display device DD may include a display panel DP, an input-sensing layer ISL, an anti-reflection panel RPP, and a window panel WP. The input-sensing layer ISL may be directly provided on the display panel DP. In this specification, the expression "an element B may be directly provided on an element A" may mean that an adhesive layer or an adhesive member is not provided between the elements A and B or that the element B is in direct contact with the element A. After the formation of the element A, the element B may be formed on a base surface, which is provided by the element A, through a continuous process.

The display panel DP and the input-sensing layer ISL, which is directly provided on the display panel DP, may be referred to as a display module DM. An optically clear adhesive OCA may be provided between the display module DM and the anti-reflection panel RPP and between the anti-reflection panel RPP and the window panel WP.

The display panel DP may be configured to generate an image to be displayed to the outside (e.g., display an image), and the input-sensing layer ISL may be configured to obtain coordinate information regarding an external input (e.g., a touch event). Although not shown, the display module DM may further include a protection member provided on a bottom surface of the display panel DP. The protection member and the display panel DP may be combined with (e.g., attached to) each other by an adhesive member. The display devices DD which will be described with reference to FIGS. 2B to 2F, may further include a protection member.

According to some embodiments of the inventive concept, the display panel DP may be a light-emitting type display panel, but the inventive concept is not limited to a specific type of the display panel DP. For example, the display panel DP may be an organic light emitting display panel or a quantum dot light-emitting display panel. A light emitting layer of the organic light emitting display panel may be formed of or include an organic light emitting material. The light emitting layer of the quantum dot light-emitting display panel may include quantum dots and/or quantum rods. For the sake of simplicity, the description that follows will refer to an example in which the display panel DP is the organic light emitting display panel.

The anti-reflection panel RPP may be configured to reduce reflectance of an external light that is incident on the anti-reflection panel RPP from an outer space (e.g., from outside the display device DD) to the window panel WP. In some embodiments, the anti-reflection panel RPP may include a phase retarder and a polarizer. The phase retarder may be of a film type or a liquid crystal coating type and may include a λ/2 and/or λ/4 phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection films thereof may be used as a base layer of the anti-reflection panel RPP.

In some embodiments, the anti-reflection panel RPP may include color filters. The color filters may be arranged in a specific manner. The arrangement of the color filters may be determined in consideration of colors of lights to be emitted from pixels in the display panel DP (e.g., the arrangement of the color filters may be determined to cause the light emitted from pixels in the display panel DP to correspond to particular colors). The anti-reflection panel RPP may further include a black matrix that is adjacent to the color filters.

In some embodiments, the anti-reflection panel RPP may include a destructive interference structure. For example, the destructive interference structure may include a first reflection layer and a second reflection layer which are provided on different layers. The first reflection layer and the second reflection layer may be configured to allow a first reflection light reflected by the first reflection layer and a second reflection light reflected by the second reflection layer to destructively interfere with each other, which may reduce reflectance of the external light.

In some embodiments, the window panel WP may include a base film WP-BS and a light-blocking pattern WP-BZ. The base film WP-BS may include a glass substrate and/or a synthetic resin film. In some embodiments, the base film WP-BS may be a single-layered structure. In other embodiments, the base film WP-BS may have multiple layers. For example, in some embodiments, the base film WP-BS may include two or more films that are combined with (e.g., attached to) each other by an adhesive film.

The light-blocking pattern WP-BZ may be partially overlapped with the base film WP-BS. The light-blocking pattern WP-BZ may be provided on a rear surface of the base film WP-BS to define a bezel region of the display device DD (e.g., the non-display region DD-NDA of FIG. 1).

The light-blocking pattern WP-BZ may be a colored organic layer and may be formed by, for example, a coating method. Although not shown, the window panel WP may further include a functional coating layer provided on the front surface of the base film WP-BS. The functional coating layer may include an anti-fingerprint layer, an anti-reflection layer, a hard coating layer, and so forth. In FIGS. 2B to 2F, the window panel WP and the window layer WL may be illustrated in a simplified manner (e.g., without distinctly illustrating the base film WP-BS and the light-blocking pattern WP-BZ).

Figure 2B:
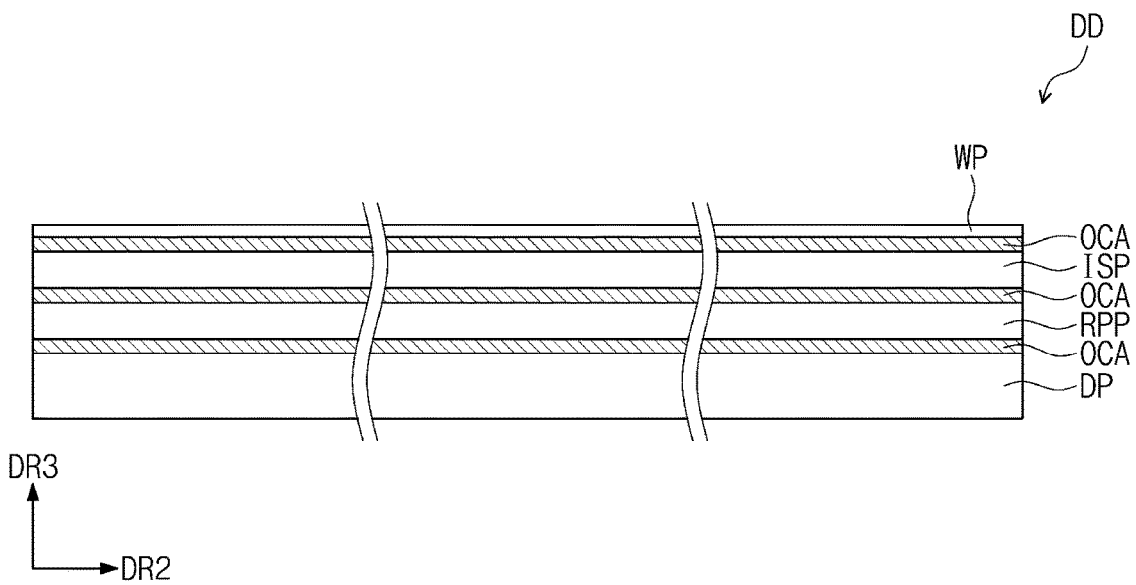
Figure 2C:
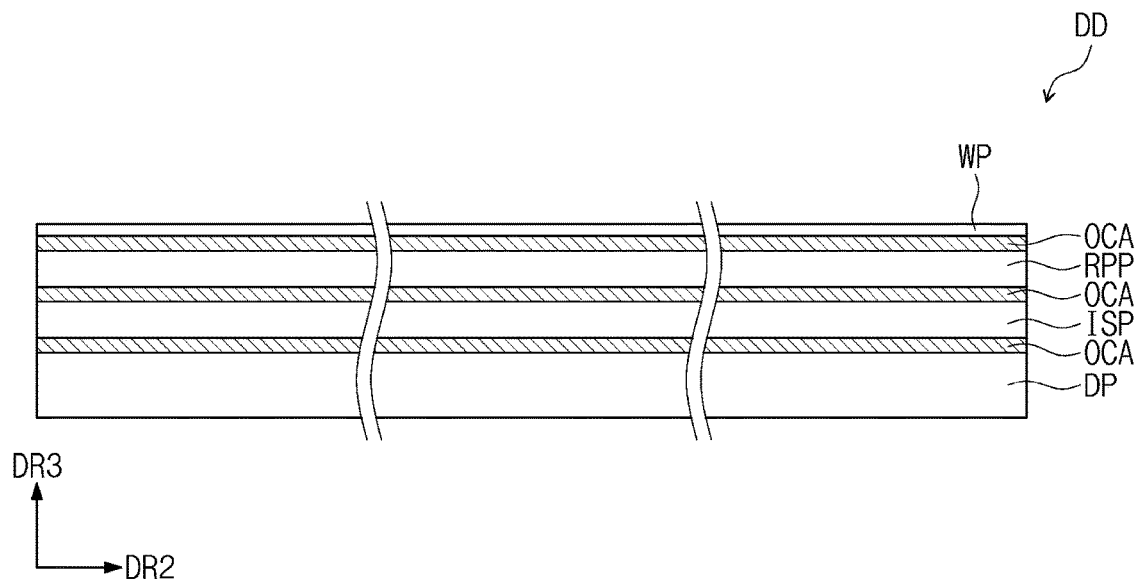

As shown in FIGS. 2B and 2C, the display device DD may include a display panel DP, an input-sensing panel ISP, an anti-reflection panel RPP, and a window panel WP. A stacking order of the input-sensing panel ISP and the anti-reflection panel RPP may be changed (e.g., the input-sensing panel ISP may be above the anti-reflection panel RPP as showin in FIG. 2B, or the anti-reflection panel RPP may be above the input-sensing panel ISP as showin in FIG. 2C).

Figure 2D:
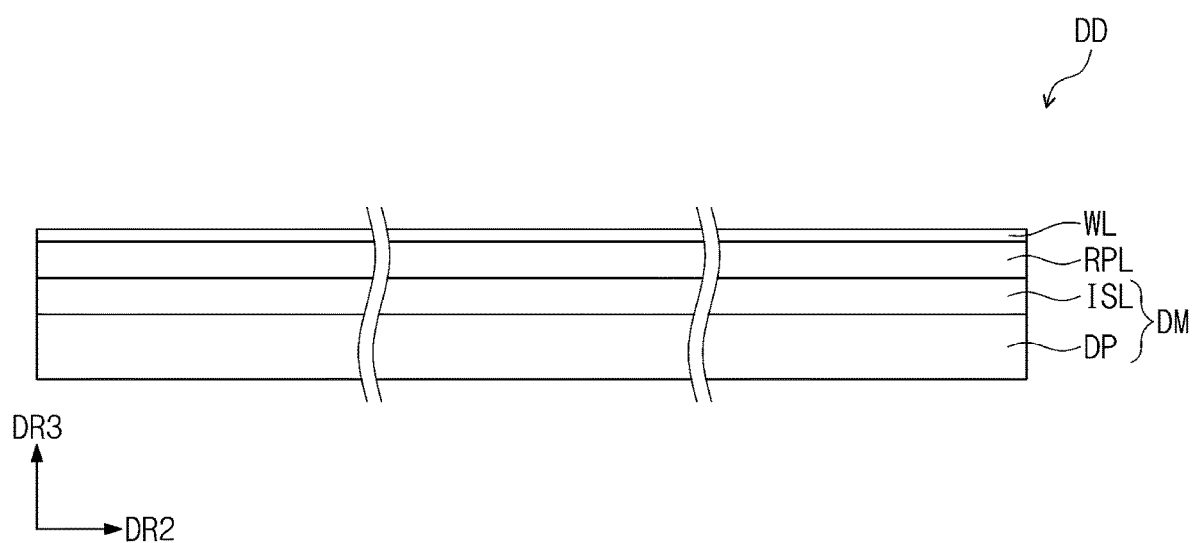

As shown in FIG. 2D, the display device DD may include a display panel DP, an input-sensing layer ISL, an anti-reflection layer RPL, and a window layer WL. Adhesive members may be omitted from the display device DD, and the input-sensing layer ISL, the anti-reflection layer RPL, and the window layer WL may be formed on a base surface, which is provided by the display panel DP, by a successive process (e.g., the input-sensing layer ISL can be formed on the display panel DP, the anti-reflection layer RPL can be formed on the input-sensing layer ISL, and the window layer WL can be formed on the anti-reflection layer RPL). In other embodiments, a stacking order of the input-sensing layer ISL and the anti-reflection layer RPL may be changed (e.g., anti-reflection layer RPI can be formed on the display panel DP, input-sensing layer ISL can be formed on the anti-reflection layer RPL, and the window layer WL can be formed on the input-sensing layer ISL).

Figure 2E:
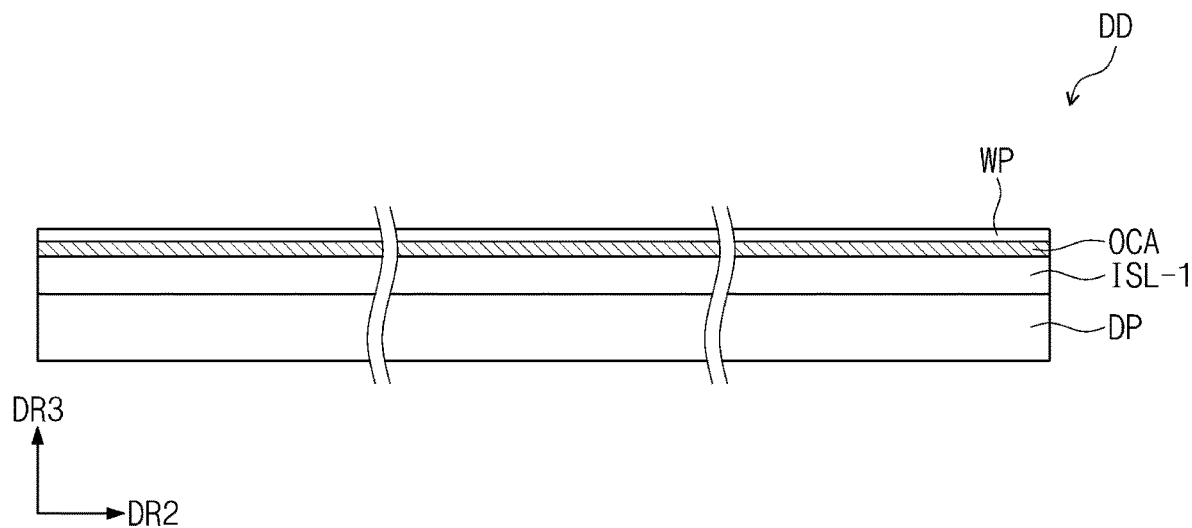
Figure 2F:
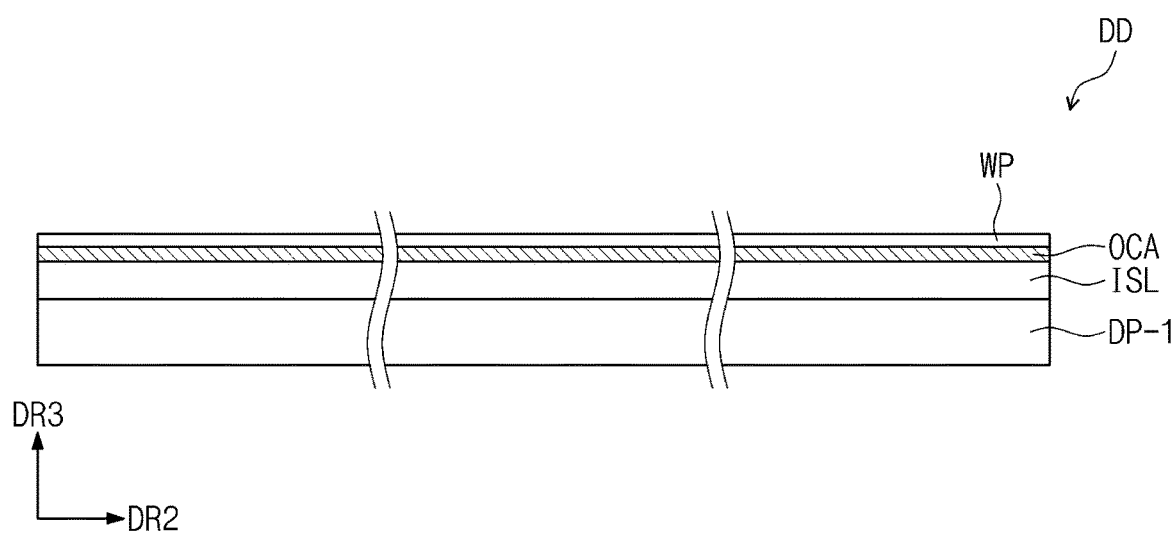

As shown in FIGS. 2E and 2F, in some embodiments, the display device DD does not include an anti-reflection unit.

As shown in FIG. 2E, the display device DD may include a display panel DP, an input-sensing layer ISL-1, and a window panel WP. The input-sensing layer ISL-1 according to the present embodiment may be configured to further have an anti-reflection function.

As shown in FIG. 2F, the display device DD may include a display panel DP-1, an input-sensing layer ISL, and a window panel WP. The display panel DP-1 according to the present embodiment may be configured to further have an anti-reflection function.

The input-sensing layer ISL-1 and the display panel DP-1 having the anti-reflection function will be described in detail below. In some embodiments, a display device may include an input-sensing panel ISP which may be configured to further have an anti-reflection function as described with respect to the input sensing layer ISL-1, which will also be described in detail below.

In FIGS. 2A to 2F, the input-sensing unit is illustrated to be fully overlapped with the display panel. As shown in FIG. 2A, the input-sensing unit may be fully overlapped with the display region DD-DA.

However, in some embodiments, the input-sensing unit may be overlapped with only a portion of the display region DD-DA or with only the non-display region DD-NDA. The input-sensing unit may be a touch-sensing panel, which is configured to sense a touch event from a user, or a fingerprint-sensing panel, which is configured to read a fingerprint of a user's finger. The input-sensing unit may include a plurality of sensing electrodes (i.e. sensors), and a pitch or width of the sensing electrodes may be changed according to an intended use of the input-sensing unit. For the touch-sensing panel, the sensing electrodes may have a width ranging from several millimeters to several tens of millimeters, whereas for the fingerprint-sensing panel, the sensing electrodes may have a width ranging from several tens of micrometers to several hundreds of micrometers.

Figure 3:
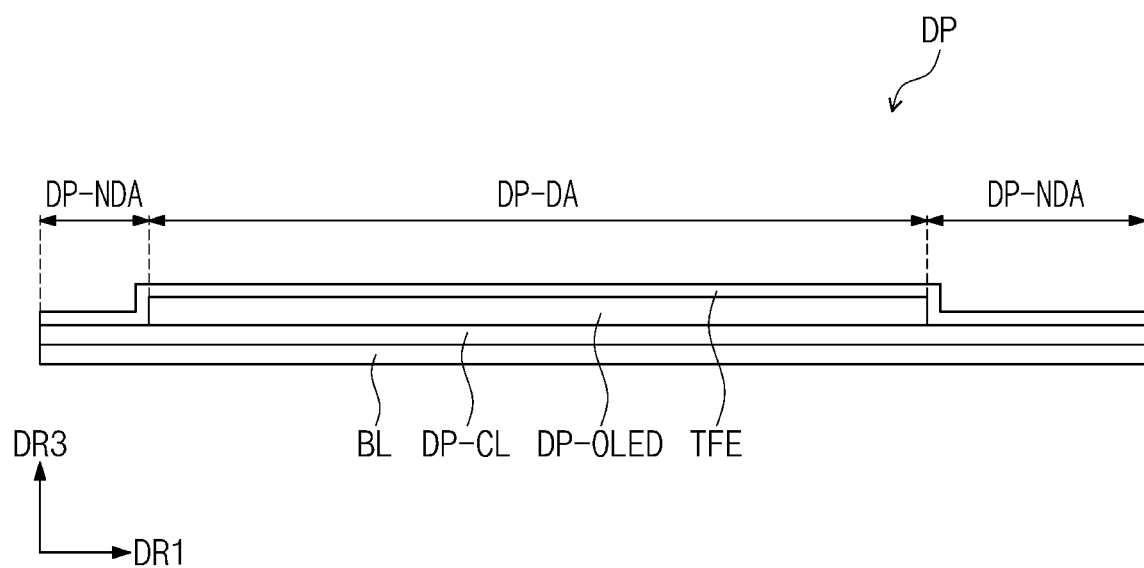
FIG. 3 is a sectional view illustrating a display module according to some embodiments of the inventive concept.
Figure 4A:
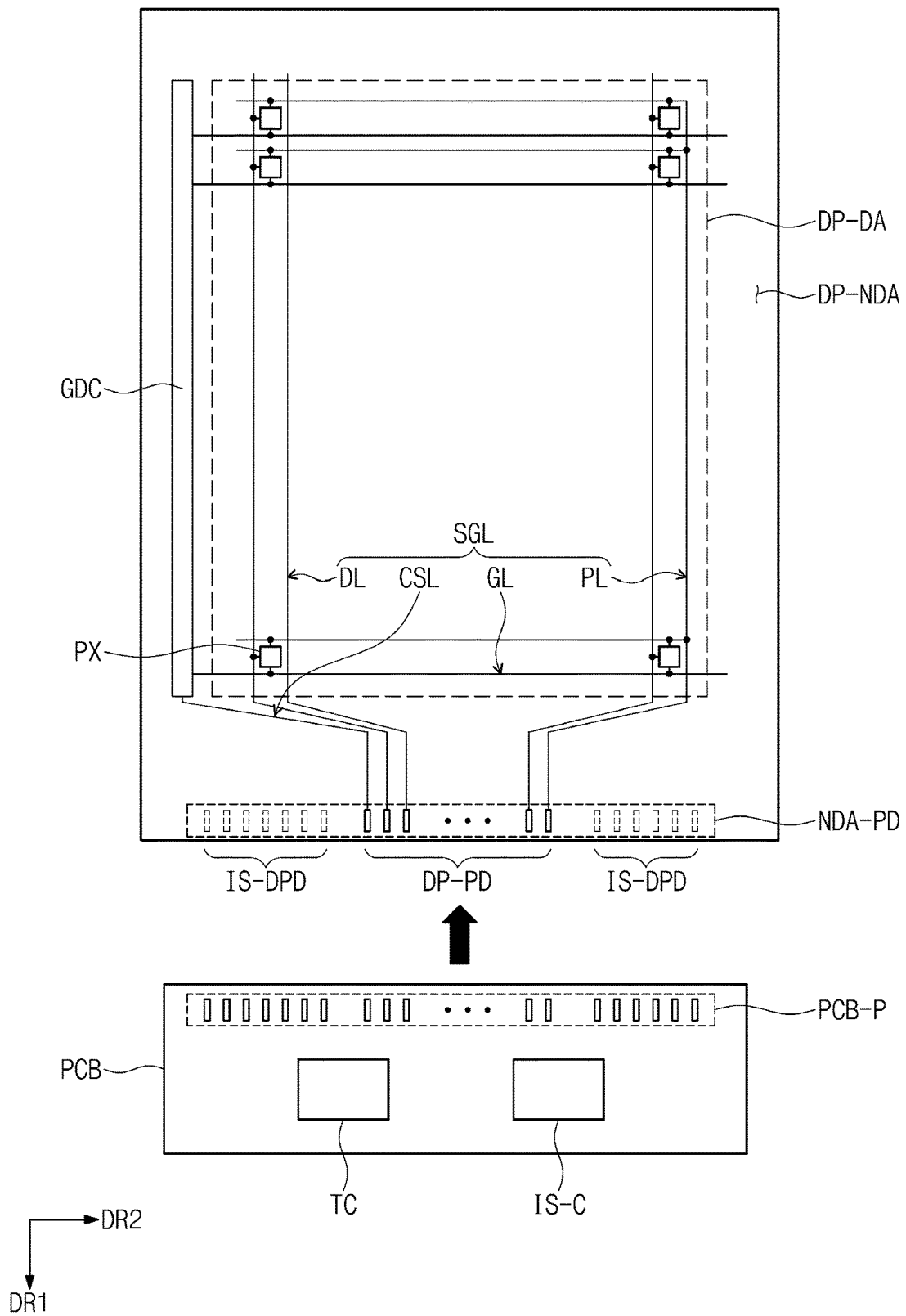
FIGS. 4A and 4B are plan views illustrating display panels according to some embodiments of the inventive concept.
Figure 4B:
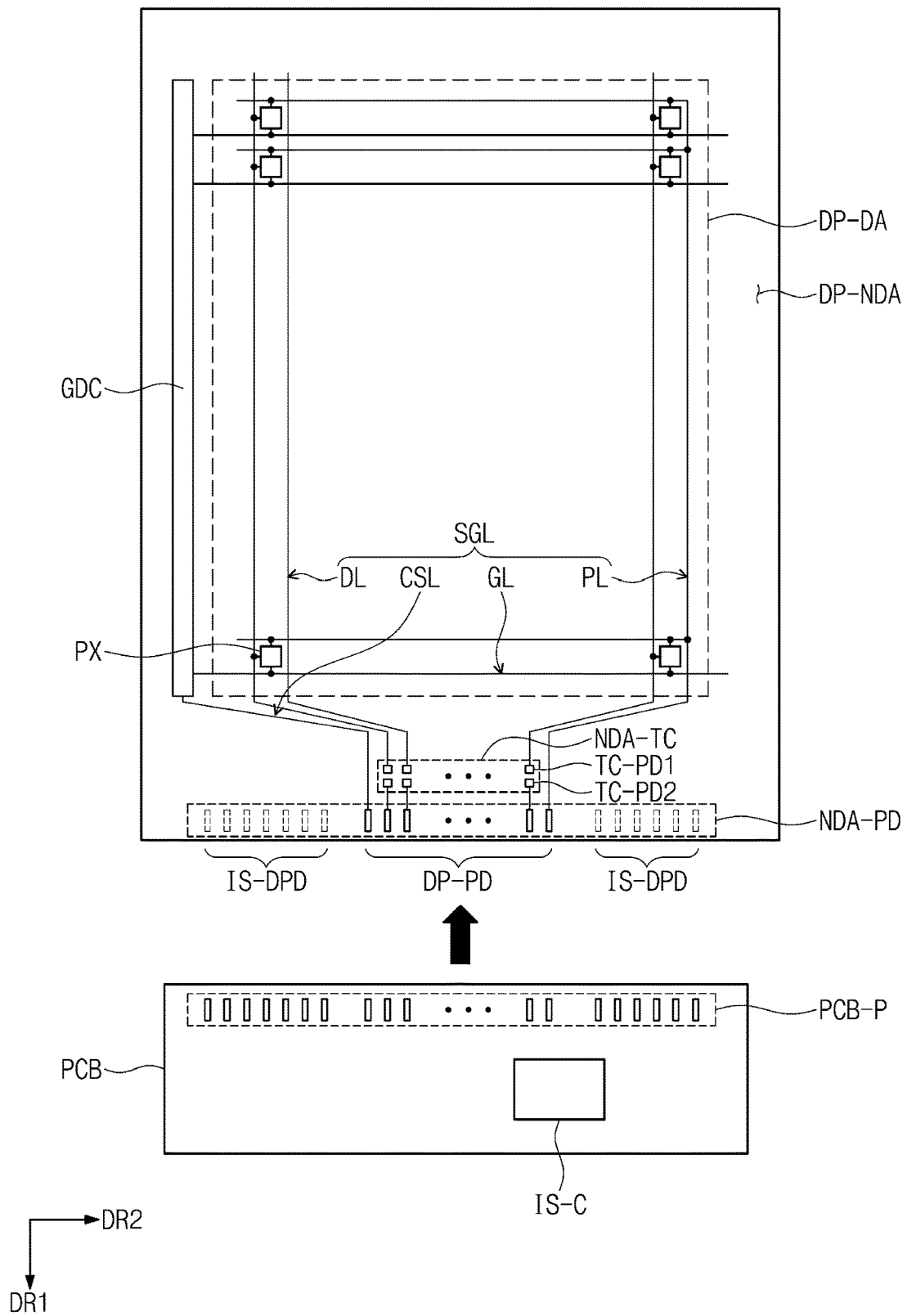
Figure 5:
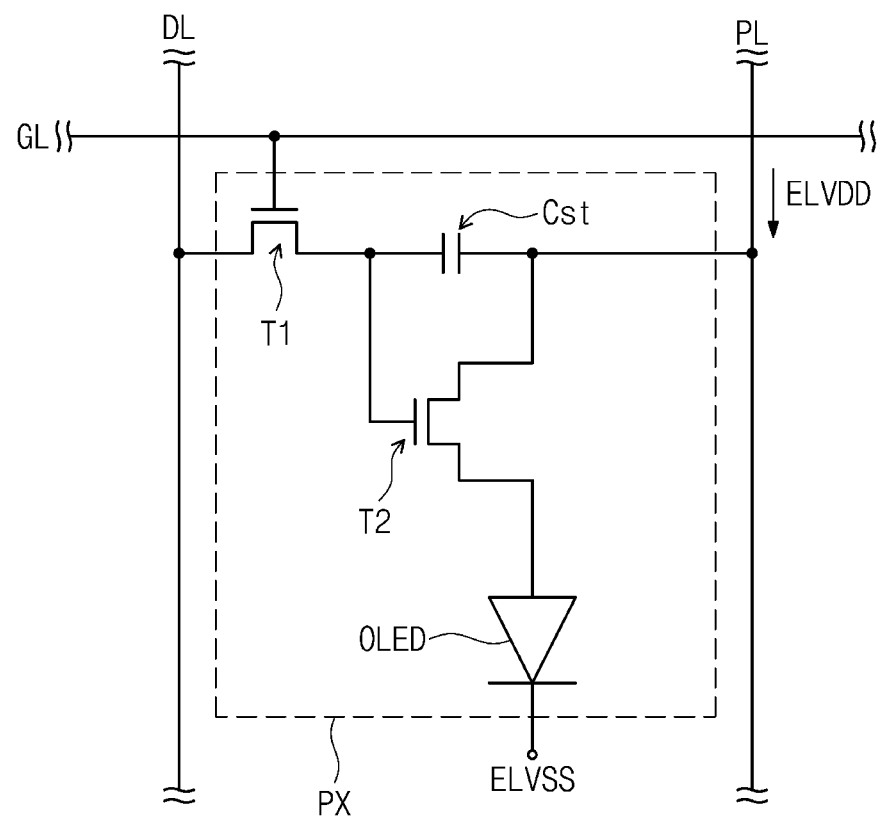
FIG. 5 is an equivalent circuit diagram illustrating a pixel according to some embodiments of the inventive concept.
Figure 6:
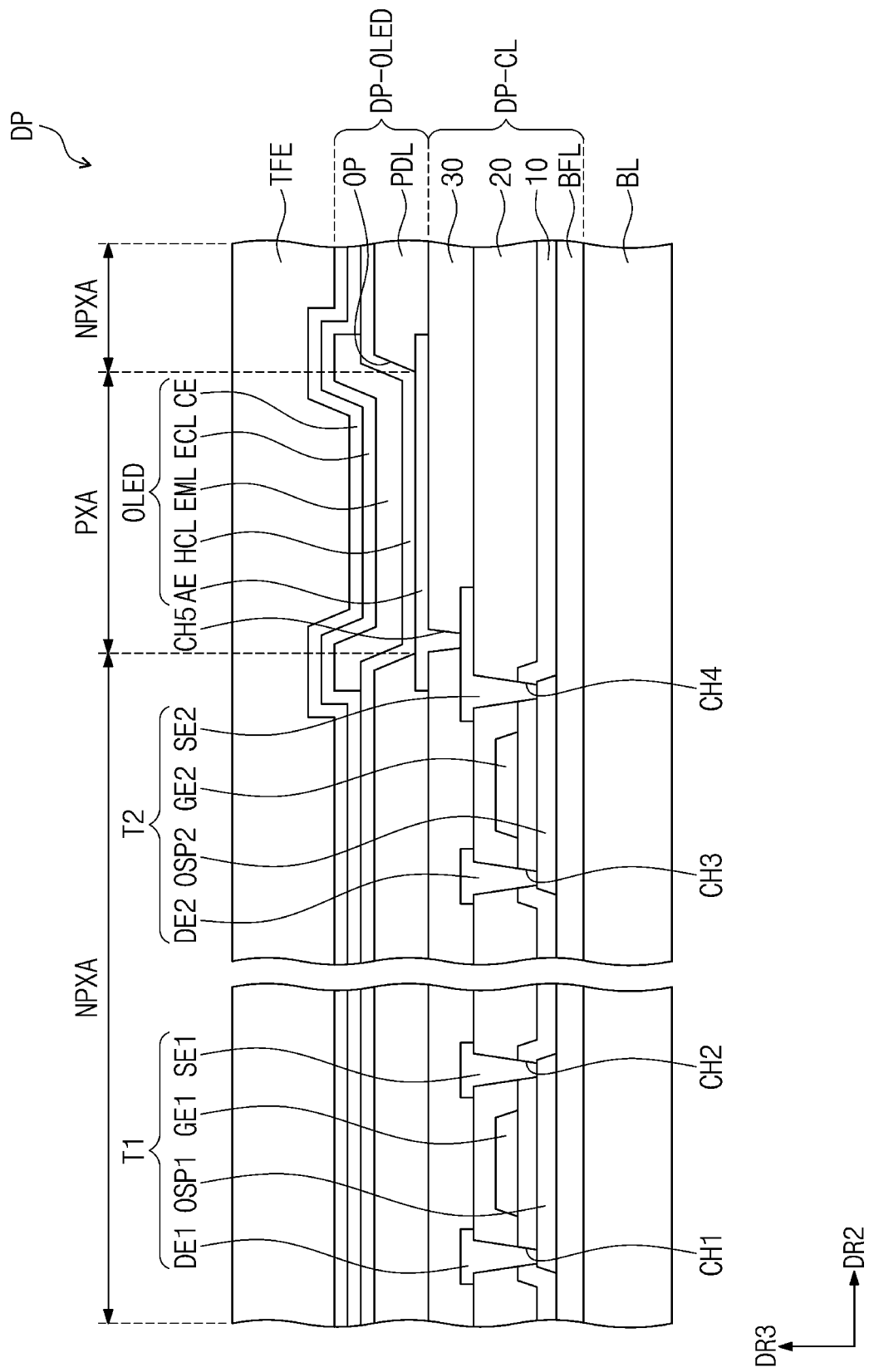
FIG. 6 is an enlarged sectional view illustrating a display panel according to some embodiments of the inventive concept.

FIG. 3 is a sectional view illustrating a display panel DP according to some embodiments of the inventive concept. FIGS. 4A and 4B are plan views illustrating display panels DP according to some embodiments of the inventive concept. FIG. 5 is an equivalent circuit diagram illustrating a pixel PX according to some embodiments of the inventive concept. FIG. 6 is an enlarged sectional view illustrating a display panel DP according to some embodiments of the inventive concept. Technical features of the display panel DP to be described below may also apply to the display devices DD described with reference to FIGS. 2A to 2F.

As shown in FIG. 3, the display panel DP may include a base layer BL, and a circuit device layer DP-CL, a display device layer DP-OLED, and a thin-film encapsulation layer TFE, which are provided on the base layer BL. Although not shown, the display panel DP may further include functional layers, such as an anti-reflection layer and a refractive index controlling layer.

The base layer BL may include a synthetic resin film. The synthetic resin layer may be formed on a working substrate, which is used to fabricate the display panel DP. Thereafter, a conductive layer, an insulating layer, and so forth may be formed on the synthetic resin layer. If the working substrate is removed, the synthetic resin layer may be used as the base layer BL. In some embodiments, the synthetic resin layer may be a polyimide-based resin layer, but the inventive concept is not limited to a specific material to be used for the base layer BL. For example, in some embodiments, the base layer BL may include a glass substrate, a metal substrate, and/or an organic/inorganic composite substrate.

The circuit device layer DP-CL may include at least one insulating layer and at least one circuit device. Hereinafter, an insulating layer in the circuit device layer DP-CL will be referred to as an intermediate insulating layer. The intermediate insulating layer may include at least one intermediate inorganic layer and/or at least one intermediate organic layer. The circuit device may include signal lines, pixel driving circuits, and so forth. The formation of the circuit device layer DP-CL may include forming an insulating layer, a semiconductor layer, and a conductive layer (e.g., using a coating or deposition process) and then patterning the insulating layer, the semiconductor layer, and the conductive layer (e.g., using a photolithography and etching process).

The display device layer DP-OLED may include a light-emitting device. The display device layer DP-OLED may include a plurality of organic light emitting diodes. The display device layer DP-OLED may further include an organic layer, such as a pixel definition layer.

The thin-film encapsulation layer TFE may be provided to seal the display device layer DP-OLED. The thin-film encapsulation layer TFE may include at least one insulating layer. In some embodiments, the thin-film encapsulation layer TFE may include at least one inorganic layer (hereinafter, an inorganic encapsulation layer). In some embodiments, the thin-film encapsulation layer TFE may include at least one organic layer (hereinafter, an organic encapsulation layer) and at least one inorganic encapsulation layer.

The inorganic encapsulation layer may be used to protect the display device layer DP-OLED from moisture or oxygen, and the organic encapsulation layer may be used to protect the display device layer DP-OLED from a contamination material such as dust particles. The inorganic encapsulation layer may include at least one of a silicon nitride layer, a silicon oxynitride layer, a silicon oxide layer, a titanium oxide layer, or an aluminum oxide layer, but the inventive concept is not limited thereto. The organic encapsulation layer may include an acrylic organic layer, but the inventive concept is not limited thereto.

As shown in FIG. 4A, the display panel DP may include a display region DP-DA and a non-display region DP-NDA, when viewed in a plan view. In the present embodiment, the non-display region DP-NDA may be defined along an edge or circumference of the display region DP-DA. The display and non-display regions DP-DA and DP-NDA of the display panel DP may correspond to the display and non-display regions DD-DA and DD-NDA, respectively, of the display device DD shown in FIGS. 1 and 2A.

The display panel DP may include a driving circuit GDC, a plurality of display signal lines SGL, a plurality of signal pads DP-PD, and a plurality of pixels PX. The pixels PX may be placed in the display region DP-DA. Each of the pixels PX may include an organic light emitting diode and a pixel driving circuit connected thereto. The driving circuit GDC, the display signal lines SGL, the signal pads DP-PD, and the pixel driving circuit may be included in the circuit device layer DP-CL shown in FIG. 3.

The driving circuit GDC may include a scan driving circuit. The scan driving circuit may be configured to generate a plurality of scan signals and sequentially output the scan signals to a plurality of scan lines GL to be described below. In addition, the scan driving circuit may be configured to output other control signals to a driving circuit of the pixel PX.

The scan driving circuit may include a plurality of thin-film transistors that are formed by the same process as that for the driving circuit of the pixel PX (e.g., by a low temperature polycrystalline silicon (LTPS) process or a low temperature polycrystalline oxide (LTPO) process).

The display signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may be used to provide control signals to the scan driving circuit.

The display signal lines SGL may be overlapped with the display and non-display regions DP-DA and DP-NDA. Each of the display signal lines SGL may include a pad portion and a line portion. The line portion may be overlapped with the display and non-display regions DP-DA and DP-NDA. The pad portion may be connected to an end of the line portion. The pad portion may be provided on the non-display region DP-NDA and may be overlapped with a corresponding one of the signal pads DP-PD. This will be in more detail described below. A portion of the non-display region DP-NDA, on which the signal pads DP-PD are provided, will be referred to as a pad region NDA-PD of the display panel DP.

The line portion, which may be substantially connected to pixels PX, may constitute most of each of the display signal lines SGL. The line portion may be connected to one of transistors T1 and T2 (e.g., see FIG. 5) of a pixel PX. The line portion may have a single- or multi-layered structure, and may be provided in the form of a single body, or may include two or more portions. In the case where the line portion includes two or more portions, the two or more portions may be provided at different layers and may be connected to each other through a contact hole, which is formed to penetrate an insulating layer therebetween.

The display panel DP may further include dummy pads IS-DPD that are provided on the pad region NDA-PD. The dummy pads IS-DPD may be formed by the same process as that for the display signal lines SGL, and in this case, the dummy pads IS-DPD and the display signal lines SGL may be formed on the same layer or at the same level. The dummy pads IS-DPD may be selectively provided in a display device DD including the input-sensing layer ISL or ISL-1 shown in FIGS. 2A and 2D to 2F, and the dummy pads IS-DPD may be omitted from a display device DD including an input-sensing panel ISP shown in FIGS. 2B and 2C.

The dummy pads IS-DPD may be overlapped with pad portions of signal lines, which may be provided in the input-sensing layer ISL or ISL-1 shown in FIGS. 2A and 2D to 2F. The dummy pads IS-DPD may be floating electrodes. For example, the dummy pads IS-DPD may be electrically disconnected from the display signal lines SGL of the display panel.

As shown in FIG. 4A, a circuit board PCB may be electrically connected to the display panel DP. The circuit board PCB may be a rigid or flexible circuit board. The circuit board PCB may be directly bonded to the display panel DP or may be connected to the display panel DP through another circuit board.

A timing control circuit TC for controlling operations of the display panel DP may be provided on the circuit board PCB. In addition, an input-sensing circuit IS-C for controlling the input-sensing unit ISU (e.g., the input-sensing panel ISP or the input-sensing layer ISL) may be provided on the circuit board PCB. Each of the timing control circuit TC and the input-sensing circuit IS-C may be provided in the form of an integrated circuit chip and may be mounted on the circuit board PCB. In some embodiments, the timing control circuit TC and the input-sensing circuit IS-C may be integrated in a single chip and may be mounted on the circuit board PCB. The circuit board PCB may include circuit board pads PCB-P that are electrically connected to the display panel DP. Although not shown, the circuit board PCB may further include signal lines, which are provided to connect the circuit board pads PCB-P to the timing control circuit TC and/or the input-sensing circuit IS-C.

As shown in FIG. 4B, the display panel DP may further include a chip-mounting region NDA-TC placed on the non-display region DP-NDA. A timing control circuit TC (e.g., see FIG. 4A), which is provided in the form of a chip and is called 'a control circuit chip', may be mounted on the chip-mounting region NDA-TC.

First chip pads TC-PD1 and second chip pads TC-PD2 may be provided in the chip-mounting region NDA-TC. The first chip pads TC-PD1 may be connected to the data lines DL, and the second chip pads TC-PD2 may be connected to the signal pads DP (e.g., through the signal lines). Terminals of the control circuit chip TC may be connected to the first chip pads TC-PD1 and the second chip pads TC-PD2. As a result, the data lines DL may be electrically connected to the signal pads DP through the control circuit chip.

In some embodiments, at least one of the control signal line CSL and the power line PL may also be connected to the control circuit chip TC.

FIG. 5 illustrates an example, in which one scan line GL, one data line DL, one power line PL, and one pixel PX connected thereto are provided. However, the structure of the pixel PX is not limited to that shown in FIG. 5, and in some embodiments, it may be variously changed.

The organic light emitting diode OLED may be a top-emission type diode or a bottom-emission type diode. The pixel PX may include a first or switching transistor T1, a second or driving transistor T2, and a capacitor Cst, which may be used as a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

If a scan signal is applied to the scan line GL, the first transistor T1 may output a data signal applied to the data line DL in response to the scan signal. The capacitor Cst may be charged to have a voltage corresponding to the data signal, which is transmitted from the first transistor T1. The second transistor T2 may be connected to the organic light emitting diode OLED. The second transistor T2 may control a driving current flowing through the organic light emitting diode OLED, based on an amount of charge stored in the capacitor Cst (e.g., the voltage across the capacitor Cst).

The equivalent circuit in FIG. 5 is just one of possible embodiment of a circuit of the pixel, but the inventive concept is not limited thereto. The pixel PX may be configured to include at least one transistor or at least one capacitor. In certain embodiments, the organic light emitting diode OLED may be coupled to the power line PL and the second transistor T2.

The vertical section of FIG. 6 illustrates a portion of the display panel DP corresponding to the equivalent circuit diagram of FIG. 5.

The circuit device layer DP-CL, the display device layer DP-OLED, and the thin-film encapsulation layer TFE may be sequentially placed on the base layer BL. In0 the present embodiment, the circuit device layer DP-CL may include a buffer layer BFL made of an inorganic material, a first intermediate inorganic layer 10, a second intermediate inorganic layer 20, and an intermediate organic layer 30 made of an organic material. The inorganic and organic layers may not be limited to specific materials, and in some embodiments, the buffer layer BFL may be optionally provided or omitted.

The first transistor T1 and the second transistor T2 may include a semiconductor pattern OSP1 and a semiconductor pattern OSP2 (hereinafter, a first semiconductor pattern and a second semiconductor pattern), respectively, which are provided on the buffer layer BFL. The first semiconductor pattern OSP1 and the second semiconductor pattern OSP2 may be formed of or include at least one of amorphous silicon, poly silicon, or metal oxide semiconductor materials.

The first intermediate inorganic layer 10 may be provided on the first semiconductor pattern OSP1 and the second semiconductor pattern OSP2. The first transistor T1 and the second transistor T2 may include a control electrode GE1 and a control electrode GE2 (hereinafter, a first control electrode and a second control electrode), respectively, which are provided on the first intermediate inorganic layer 10. The first control electrode GE1 and the second control electrode GE2 may be formed using the same photolithography process as that for forming the scan lines GL of FIG. 5A.

The second intermediate inorganic layer 20 may be provided on the first intermediate inorganic layer 10 covering the first control electrode GE1 and the second control electrode GE2. The first transistor T1 may include an input electrode DE1 and an output electrode SE1 (hereinafter, a first input electrode and a first output electrode) provided on the second intermediate inorganic layer 20, and the second transistor T2 may include an input electrode DE2 and an output electrode SE2 (hereinafter, a second input electrode and a second output electrode) provided on the second intermediate inorganic layer 20.

A first through hole CH1 and a second through hole CH2 may be formed to penetrate both of the first and second intermediate inorganic layers 10 and 20, and the first input electrode DE1 and the first output electrode SE1 may be connected to two different portions of the first semiconductor pattern OSP1 through the first and second through holes CH1 and CH2, respectively. A third through hole CH3 and a fourth through hole CH4 may be formed to penetrate both of the first and second intermediate inorganic layers 10 and 20, and the second input electrode DE2 and the second output electrode SE2 may be connected to two different portions of the second semiconductor pattern OSP2 through the third and fourth through holes CH3 and CH4, respectively. In some embodiments, at least one of the first transistor T1 and the second transistor T2 may be modified to have a bottom gate structure.

The intermediate organic layer 30 may be provided on the second intermediate inorganic layer 20 to cover the first input electrode DE1, the second input electrode DE2, the first output electrode SE1, and the second output electrode SE2. The intermediate organic layer 30 may be provided to have a flat surface.

The display device layer DP-OLED may be provided on the intermediate organic layer 30. The display device layer DP-OLED may include a pixel definition layer PDL and an organic light emitting diode OLED. The pixel definition layer PDL may be formed of or include an organic material. A first electrode AE may be provided on the intermediate organic layer 30. The first electrode AE may be connected to the second output electrode SE2 through a fifth through hole CH5 penetrating the intermediate organic layer 30. An opening OP may be defined in the pixel definition layer PDL. The opening OP of the pixel definition layer PDL may be provided to expose at least a portion of the first electrode AE. In some embodiments, the pixel definition layer PDL may be omitted.

The pixel PX may be placed in the display region DP-DA. The display region DP-DA may include a light-emitting region PXA and a non-light-emitting region NPXA adjacent to the light-emitting region PXA. The non-light-emitting region NPXA may be provided to surround the light-emitting region PXA. In the present embodiment, the light-emitting region PXA may be defined to correspond to a region of the first electrode AE exposed by the opening OP.

In some embodiments, the light-emitting region PXA may be overlapped with at least one of the first and second transistors T1 and T2. The opening OP may be enlarged, and the first electrode AE and/or a light emitting layer EML to be described below may also be enlarged.

A hole control layer HCL may be provided in common on the light-emitting region PXA and the non-light-emitting region NPXA. Although not shown, a common layer, such as the hole control layer HCL, may be provided in common in a plurality of the pixels PX (e.g., see FIG. 4A).

The light emitting layer EML may be provided on the hole control layer HCL. The light emitting layer EML may be provided on a region corresponding to the opening OP. In other words, the light emitting layer EML may have an isolated structure that is provided for each of the pixels PX. The light emitting layer EML may include an organic material and/or an inorganic material. The light emitting layer EML may be configured to generate a specific color light.

In the present embodiment, the light emitting layer EML is illustrated to have a patterned structure, but in some embodiments the light emitting layer EML may be provided in common on a plurality of the pixels PX. Here, the light emitting layer EML may be configured to generate a white-color light. Also, the light emitting layer EML may have a multi-layered structure called 'tandem'.

An electron control layer ECL0 may be provided on the light emitting layer EML. Although not shown, the electron control layer ECL may be provided in common in the plurality of pixels PX (e.g., see FIG. 4A). A second electrode CE may be provided on the electron control layer ECL. The second electrode CE may be provided in common on a plurality of the pixels PX.

The thin-film encapsulation layer TFE may be provided on the second electrode CE. The thin-film encapsulation layer TFE may be provided in common on a plurality of the pixels PX. In the present embodiment, the thin-film encapsulation layer TFE may be provided to directly cover the second electrode CE. In some embodiments, a capping layer may be further provided between the thin-film encapsulation layer TFE and the second electrode CE, thereby covering the second electrode CE. Here, the thin-film encapsulation layer TFE may be provided to directly cover the capping layer.

In some embodiments, the organic light emitting diode OLED may further include a resonance structure, which is used to control a resonance distance of light emitted from the light emitting layer EML. The resonance structure may be provided between the first electrode AE and the second electrode CE, and a thickness of the resonance structure may be determined depending on a wavelength of light to be emitted from the light emitting layer EML.

FIGS. 7A to 7D are sectional views illustrating thin-film encapsulation layers TFE according to some embodiments of the inventive concept. The thin-film encapsulation layers TFE of FIGS. 7A to 7D may be configured to have substantially the same technical features as those of the thin-film encapsulation layer TFE described with reference to FIG. 3.

Figure 7A:
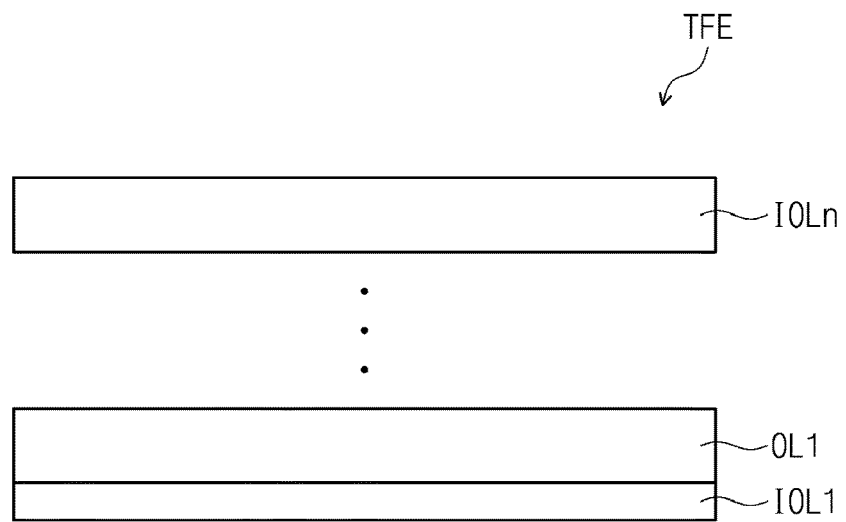
FIGS. 7A to 7D are sectional views illustrating thin-film encapsulation layers according to some embodiments of the inventive concept.

As shown in FIG. 7A, the thin-film encapsulation layer TFE may include n inorganic encapsulation layers IOL1 to IOLn, where n is a natural number larger than 2. Here, the first one (i.e., IOL1) of the inorganic encapsulation layers may be in contact with the second electrode CE (e.g., see FIG. 6).

The thin-film encapsulation layer TFE may further include (n−1) organic encapsulation layers OL1, and in some embodiments, the (n−1) organic encapsulation layers OL1 and the n inorganic encapsulation layers IOL1 to IOLn may be alternately provided. Each of the (n−1) organic encapsulation layers OL1 may have a thickness that is larger than a mean thickness of the n inorganic encapsulation layers IOL1 to IOLn.

Each of the n inorganic encapsulation layers IOL1 to may be a single layer made of a single material or may be a multi-layered structure, in which at least two layers made of different materials are included. The (n−1) organic encapsulation layers OL1 may be formed by a process of depositing organic monomers. The organic monomers may include, for example, at least one of acryl-based monomers, but the inventive concept is not limited thereto.

In some embodiments, the thin-film encapsulation layer TFE may include a silicon oxynitride layer, an organic monomer layer, and a silicon nitride layer, which are sequentially stacked on the second electrode CE. In certain embodiments, another inorganic layer may be provided on the silicon nitride layer, and the silicon nitride layer may be a double layered structure (e.g., including two layers, which are formed by deposition processes under different conditions).

Figure 7B:
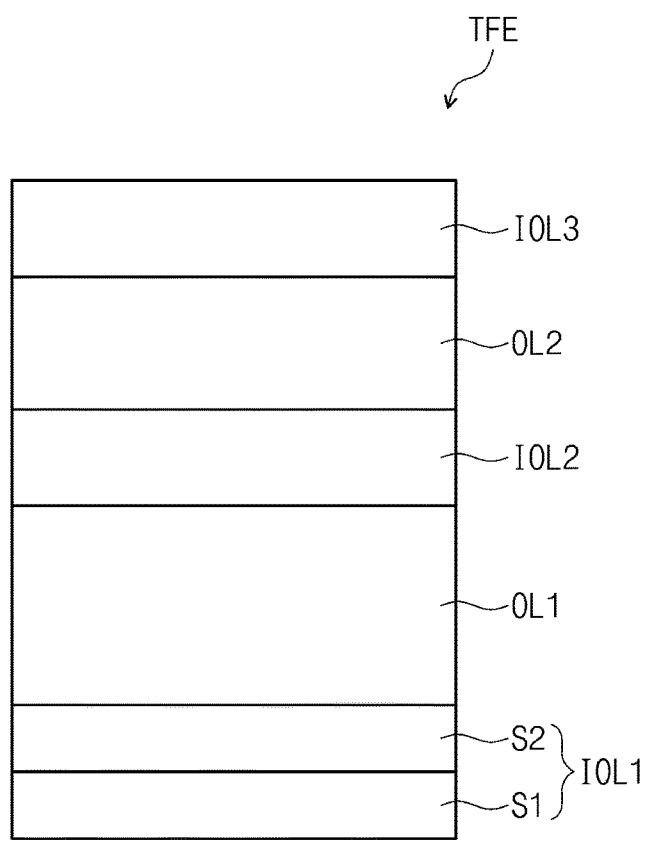

As shown in FIG. 7B, the thin-film encapsulation layer TFE may include a first inorganic encapsulation layer IOL1, a first organic encapsulation layer OL1, a second inorganic encapsulation layer IOL2, a second organic encapsulation layer OL2, and a third inorganic encapsulation layer IOL3, which are sequentially stacked.

The first inorganic encapsulation layer IOL1 may have a double-layered structure. A first sub-layer S1 may be a lithium fluoride layer, and a second sub-layer S2 may be an aluminum oxide layer. The first organic encapsulation layer OL1 may be a first organic monomer layer, the second inorganic encapsulation layer IOL2 may be a first silicon nitride layer, the second organic encapsulation layer OL2 may be a second organic monomer layer, and the third inorganic encapsulation layer IOL3 may be a second silicon nitride layer.

Figure 7C:
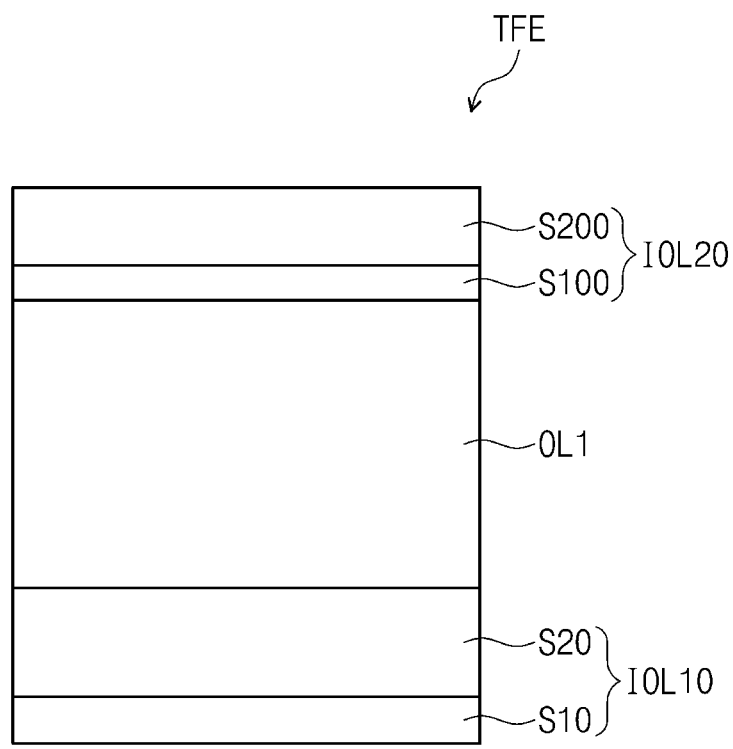

As shown in FIG. 7C, the thin-film encapsulation layer TFE may include a first inorganic encapsulation layer IOL10, the first organic encapsulation layer OL1, and a second inorganic encapsulation layer IOL20, which are sequentially stacked. Each of the first and second inorganic encapsulation layers IOL10 and IOL20 may have a double-layered structure. A first sub-layer S10 may be a lithium fluoride layer, and a second sub-layer S20 may be a silicon oxide layer. The second inorganic encapsulation layer IOL20 may include a first sub-layer S100 and a second sub-layer S200, which are deposited under different deposition environments. The first sub-layer S100 may be deposited under a low power condition, and the second sub-layer S200 may be deposited under a high power condition. Each of the first sub-layer S100 and the second sub-layer S200 may be a silicon nitride layer.

Figure 7D:
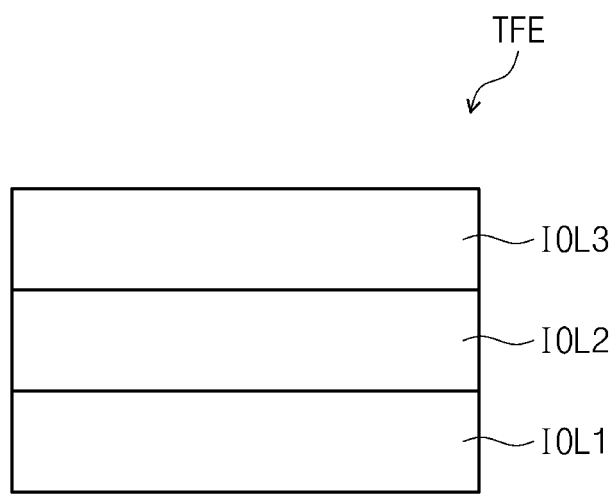

As shown in FIG. 7D, the thin-film encapsulation layer TFE may include a plurality of inorganic encapsulation layers, which are sequentially stacked. The thin-film encapsulation layer TFE may include a first inorganic encapsulation layer IOL1, a second inorganic encapsulation layer IOL2, and a third inorganic encapsulation layer IOL3. At least one of the inorganic encapsulation layers may be or include a silicon nitride layer, a silicon oxynitride layer, a silicon oxide layer, a titanium oxide layer, or an aluminum oxide layer. For example, at least one of the first and third inorganic encapsulation layers IOL1 and IOL3 may include a silicon nitride layer, a silicon oxynitride layer, a silicon oxide layer, a titanium oxide layer, or an aluminum oxide layer.

At least one of the inorganic encapsulation layers may be or may include a hexamethyldisiloxane (HMDSO) layer. The HMDSO layer may have a stress-absorption property. The second inorganic encapsulation layer IOL2 may be the HMDSO layer. The second inorganic encapsulation layer IOL2 may be used to absorb stress of the first and third inorganic encapsulation layers IOL1 and IOL3. Accordingly, the thin-film encapsulation layer TFE may become more flexible.

In the case where the thin-film encapsulation layer TFE has only the inorganic encapsulation layers, it may be possible to form the thin-film encapsulation layer TFE within a single chamber through a successive deposition process, and thus to simplify a process of forming the thin-film encapsulation layer TFE. In the case where the thin-film encapsulation layer TFE has at least one organic encapsulation layer and at least one inorganic encapsulation layer, it is necessary to change a process chamber at least one time. In the case where one of the inorganic encapsulation layers is an HMDSO layer, the thin-film encapsulation layer TFE may have increased flexibility.

Figure 8:
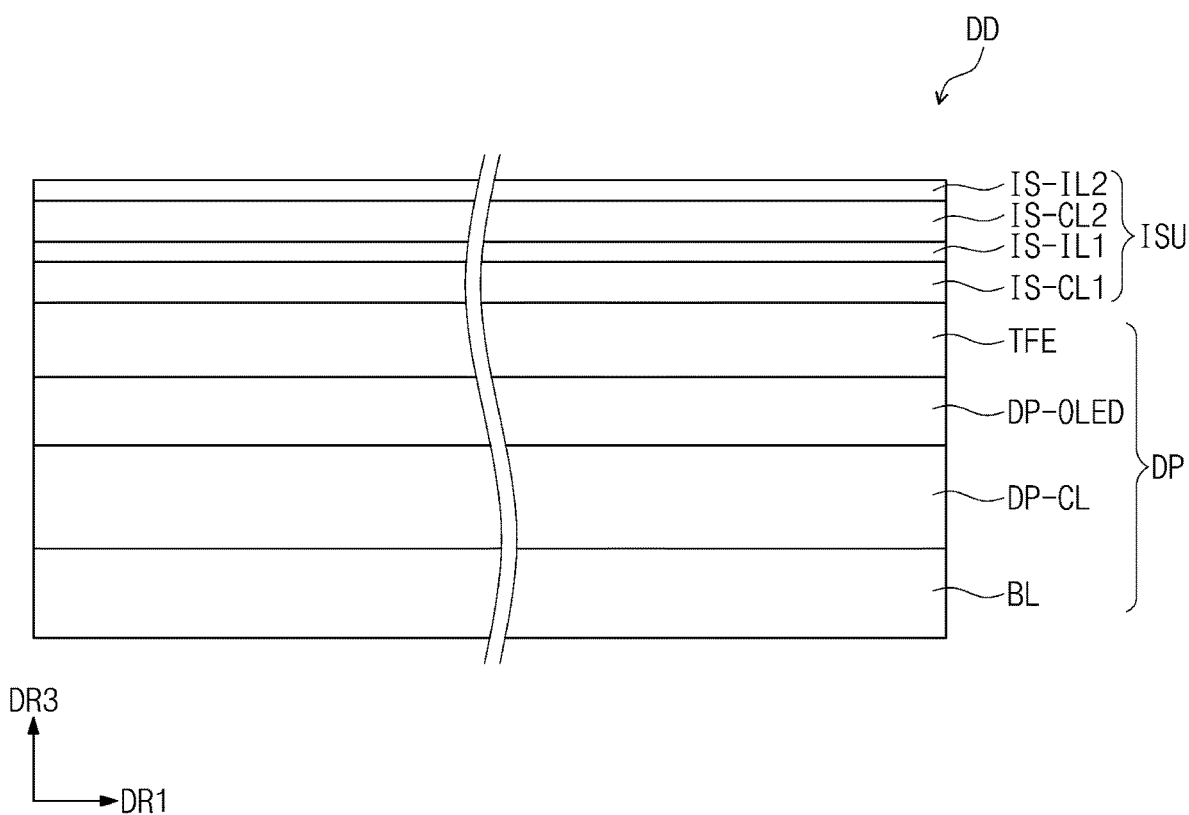
FIG. 8 is a sectional view illustrating a display device according to some embodiments of the inventive concept.
Figure 9:
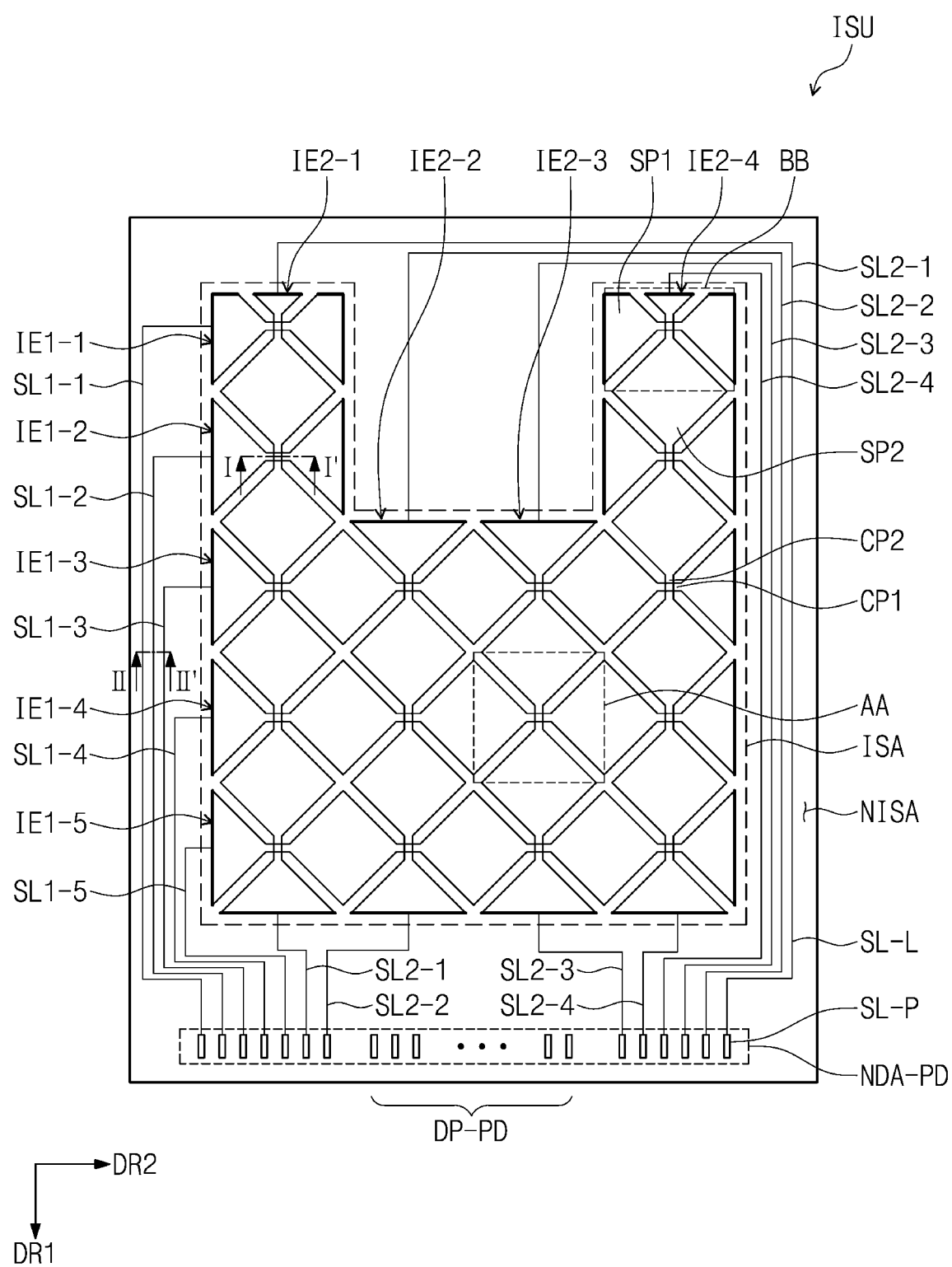
FIG. 9 is a plan view illustrating an input-sensing unit ISU according to some embodiments of the inventive concept.
Figure 10A:
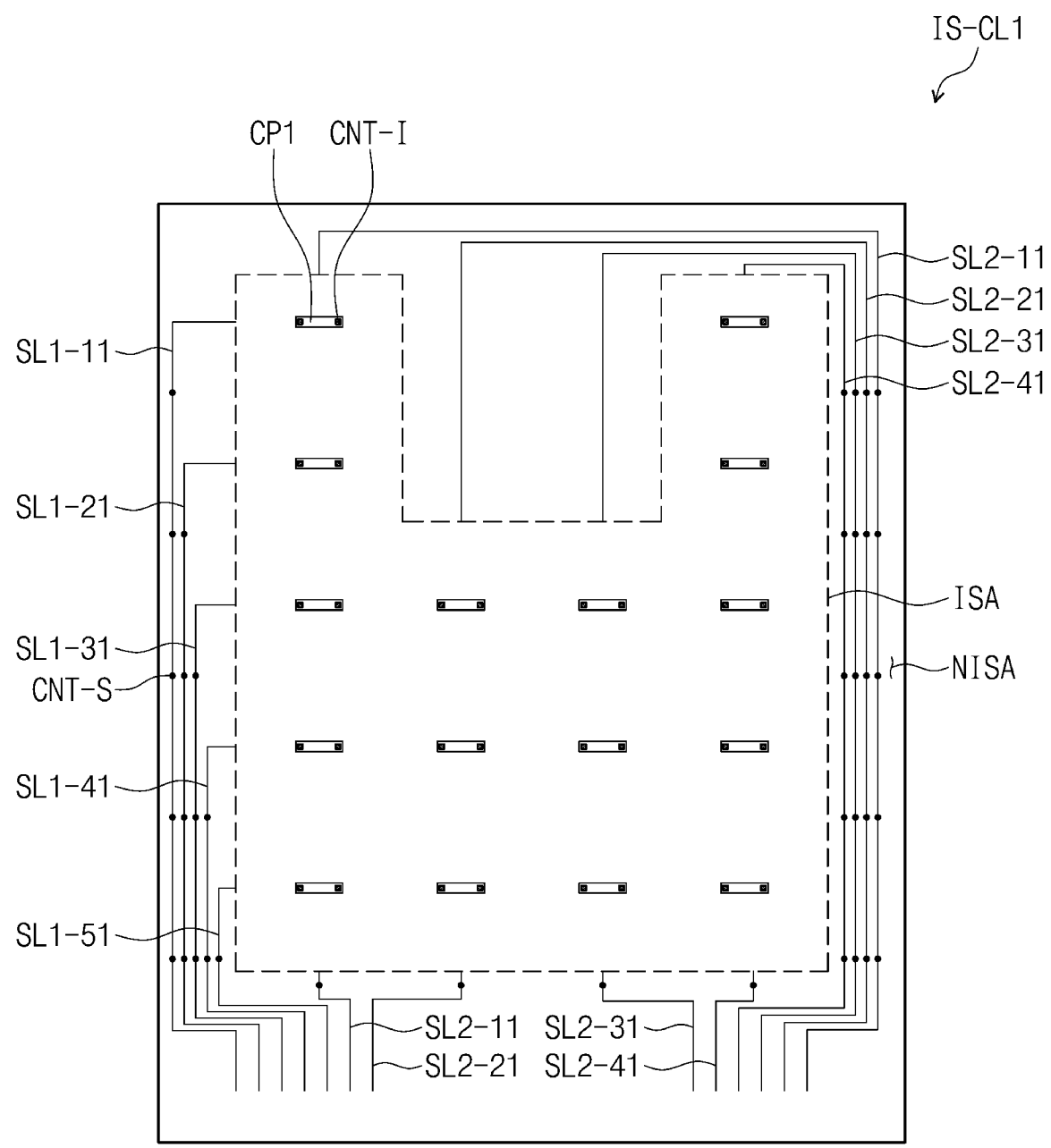
FIG. 10A is a plan view illustrating a first conductive layer of an input-sensing unit according to some embodiments of the inventive concept.
Figure 10B:
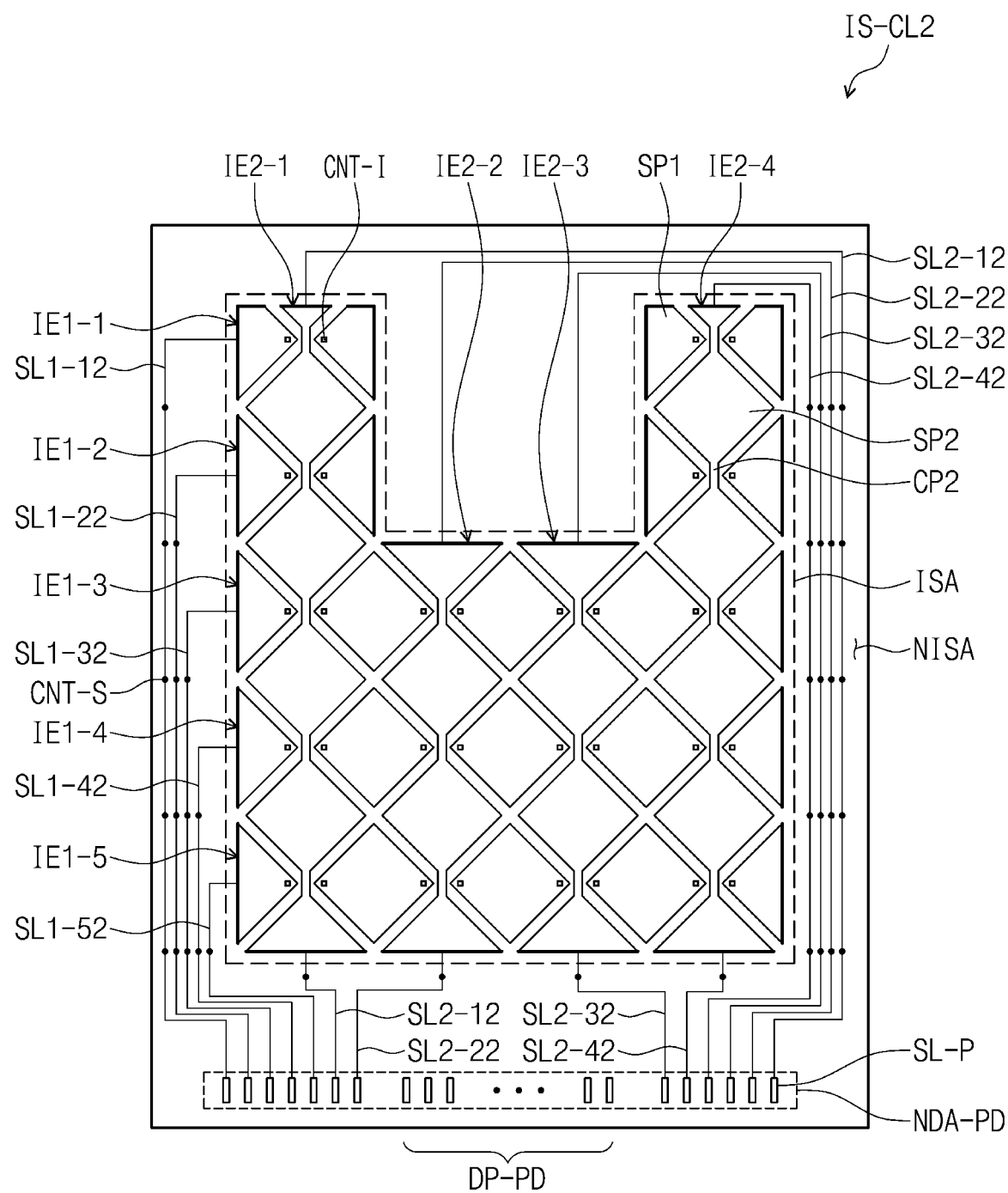
FIG. 10B is a plan view illustrating a second conductive layer of an input-sensing unit according to some embodiments of the inventive concept.
Figure 10C:
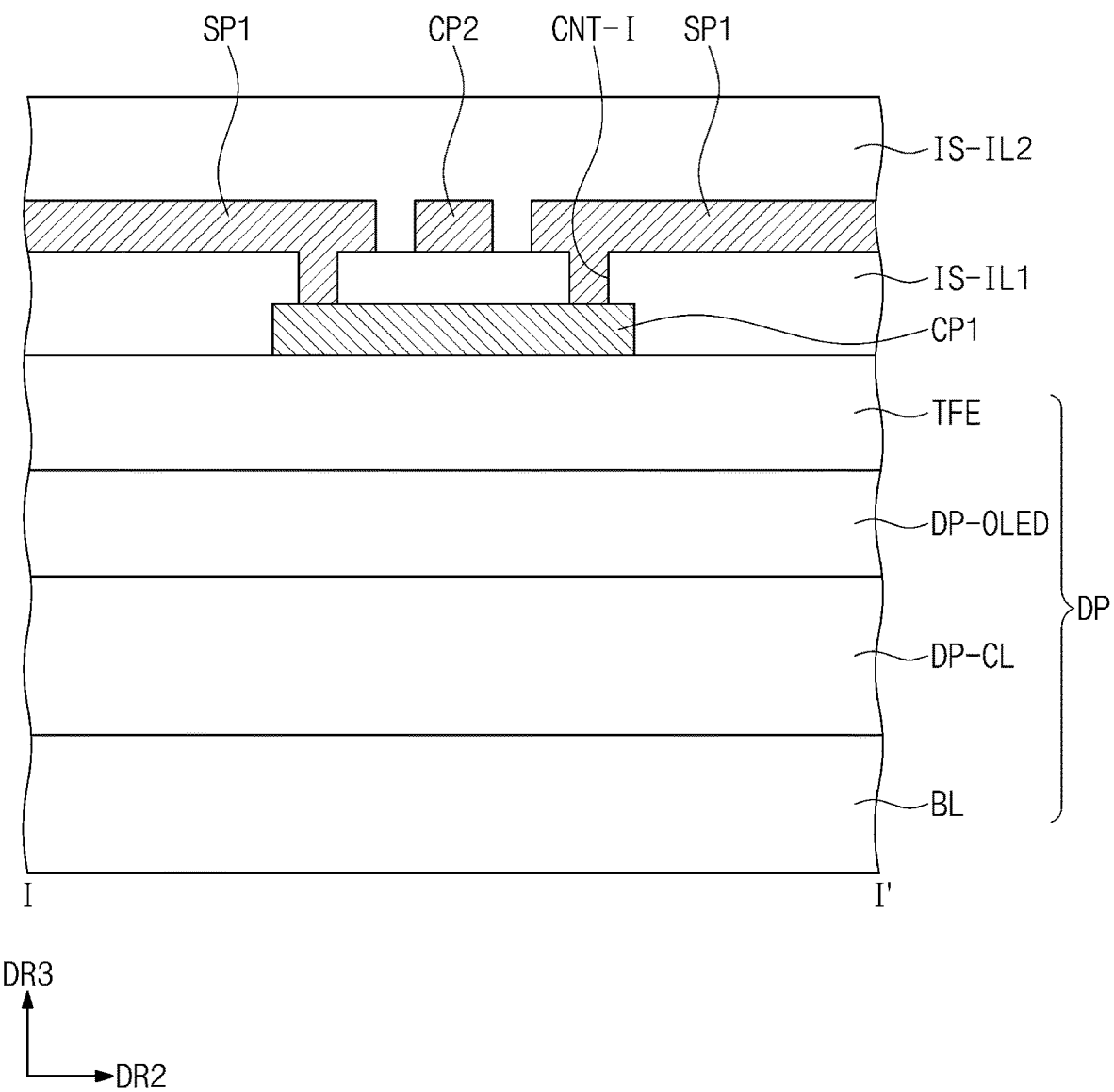
FIG. 10C is a sectional view taken along line I-I' of FIG. 9.
Figure 10D:
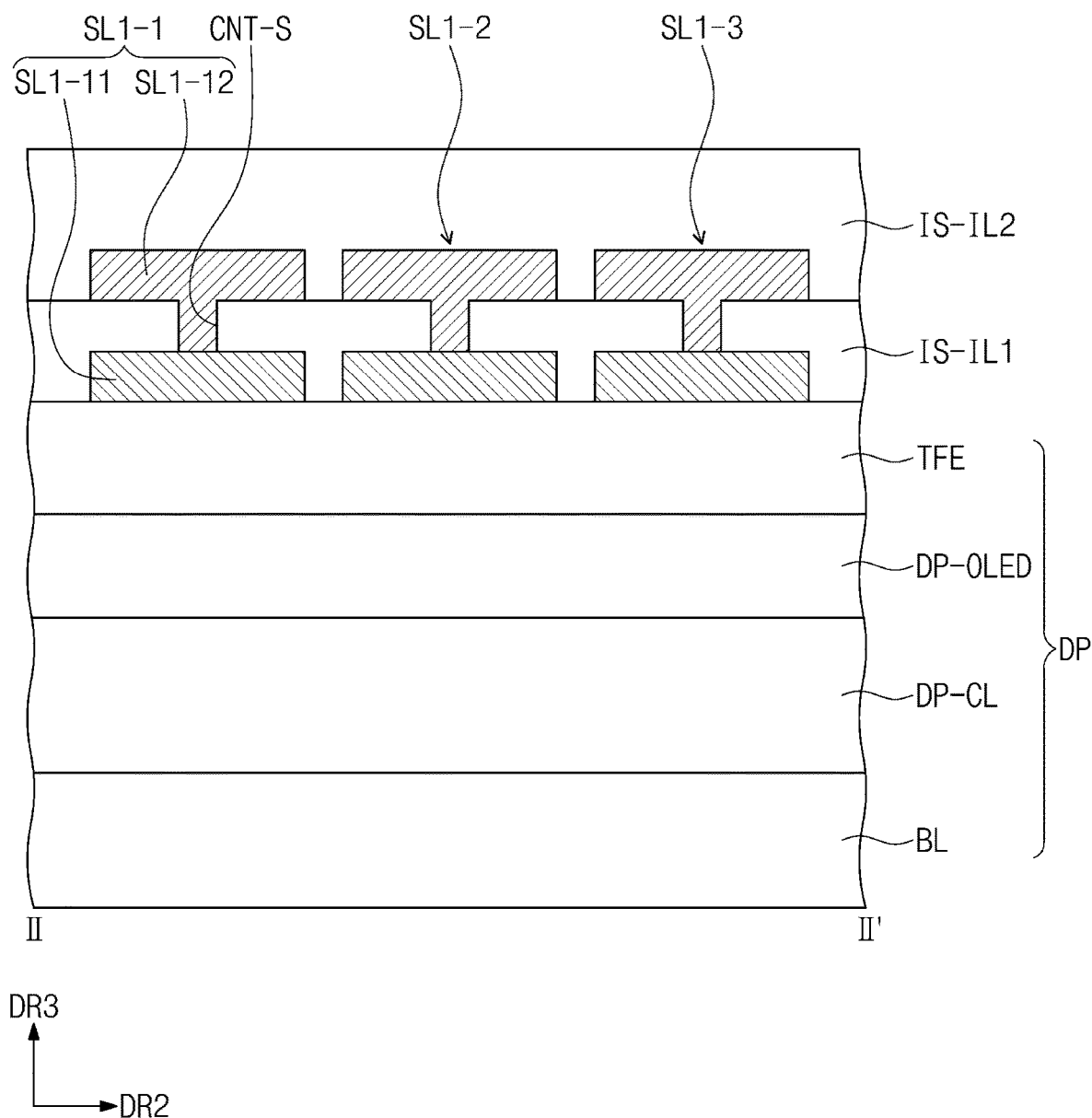

FIG. 8 is a sectional view illustrating a display device DD according to some embodiments of the inventive concept. FIG. 9 is a plan view illustrating an input-sensing unit ISU according to some embodiments of the inventive concept. FIG. 10A is a plan view illustrating a first conductive layer IS-CL1 of the input-sensing unit ISU according to some embodiments of the inventive concept. FIG. 10B is a plan view illustrating a second conductive layer IS-CL2 of the input-sensing unit ISU according to some embodiments of the inventive concept. FIG. 10C is a sectional view taken along line I-I' of FIG. 9. FIGS. 10D and 10E are sectional views taken along line II-II' of FIG. 9.

In FIG. 8, the display panel DP is illustrated in a simplified manner to describe a stacking structure of the input-sensing unit ISU. For example, the anti-reflection unit and the window unit may be provided on the input-sensing unit ISU but they are not shown in FIG. 8.

In the present embodiment, the input-sensing unit ISU, which is of the "layer" shape described with reference to FIG. 2A, will be exemplarily described. Since the input-sensing unit ISU of the "layer" shape is directly provided on a base surface provided by the display panel DP, it may be possible to omit a base layer, and thus, it may be possible to reduce a thickness of the display module DM. In the present embodiment, the base surface may be a top surface of the thin-film encapsulation layer TFE.

The input-sensing unit ISU may have a multi-layered structure, regardless of its shape. For example, the input-sensing unit ISU may include a sensing electrode, a signal line connected to the sensing electrode, and at least one insulating layer. The input-sensing unit ISU may be configured to sense an external input, for example, in an capacitance sensing manner. The inventive concept is not limited to a specific sensing method of the input-sensing unit ISU, and in some embodiments, the input-sensing unit ISU may be configured to sense an external input in an electromagnetic induction manner or a pressure-sensing manner.

As shown in FIG. 8, the input-sensing unit ISU may include the first conductive layer IS-CL1, a first insulating layer IS-IL1, the second conductive layer IS-CL2, and a second insulating layer IS-IL2. Each of the first and second conductive layers IS-CL1 and IS-CL2 may have a single-layered structure or may have a multi-layered structure including a plurality of layers stacked in the third direction DR3. The conductive layer of the single-layered structure may be formed of or include a metal layer or a transparent conductive layer. The metal layer may include at least one of molybdenum, silver, titanium, copper, aluminum, or alloys thereof. The transparent conductive layer may include transparent conductive oxide, such as indium tin oxide (ITO), indium zinc oxide (IZO), zinc oxide (ZnO), or indium tin zinc oxide (ITZO). In some embodiments, the transparent conductive layer may include a conductive polymer (e.g., PEDOT), metal nanowires, or graphene.

In an embodiment where the conductive layer has the multi-layered structure, it may include a stack of metal layers. The stack of the metal layers may be a triple-layered structure of titanium/aluminum/titanium. The conductive layer of the multi-layered structure may include at least one metal layer and at least one transparent conductive layer.

Each of the first and second conductive layers IS-CL1 and IS-CL2 may include a plurality of patterns. The description that follows will refer to an example in which the first conductive layer IS-CL1 includes first conductive patterns and the second conductive layer IS-CL2 includes second conductive patterns. Each of the first and second conductive patterns may include at least one sensing electrode and at least one signal line.

A stacking structure and a material of the sensing electrode may be determined in consideration of technical requirements on sensing sensitivity. The sensing sensitivity may be affected by a resistive-capacitive (RC) delay, and a metal layer may have electric resistance lower than that of a transparent conductive layer. Thus, the sensing electrodes formed of the metal layer may have a reduced RC delay value, and a charging time taken to charge a capacitor defined between the sensing electrodes may be reduced. In embodiments where the sensing electrodes are formed of the transparent conductive layer, they may not be easily recognized by a user, compared with the sensing electrodes formed of the metal layer, and thus, it may be possible to increase an input area and an effective capacitance.

To prevent the sensing electrodes in the metal layer from being recognized by a user, the sensing electrodes may be provided in a mesh shape. A thickness of the thin-film encapsulation layer TFE may be adjusted (e.g., configured or designed) to prevent the input-sensing unit ISU from being affected by noise caused by elements of the display device layer DP-OLED. Each of the first and second insulating layers IS-IL1 and IS-IL2 may have a single- or multi-layered structure. Each of the first and second insulating layers IS-IL1 and IS-IL2 may include an inorganic material, an organic matter, or a composite material.

At least one of the first and second insulating layers IS-IL1 and IS-IL2 may include an inorganic layer. The inorganic layer may include at least one of aluminum oxide, titanium oxide, silicon oxide, silicon oxynitride, zirconium oxide, or hafnium oxide.

At least one of the first and second insulating layers IS-IL1 and IS-IL2 may include an organic layer. The organic layer may include at least one of acrylic resins, methacryl resins, polyisoprene resins, vinyl resins, epoxy resins, urethane resins, cellulose resins, siloxane resins, polyimide resins, polyamide resins, or perylene resins.

As shown in FIG. 9, the input-sensing unit ISU may include first sensing electrodes 1E1-1 to 1E1-5, first signal lines SL1-1 to SL1-5 connected to the first sensing electrodes 1E1-1 to 1E1-5, second sensing electrodes 1E2-1 to 1E2-4, and second signal lines SL2-1 to SL2-4 connected to the second sensing electrodes 1E2-1 to 1E2-4. Although not shown, the input-sensing unit ISU may further include an optical dummy electrode provided in a boundary region between the first and second sensing electrodes 1E1-1 to 1E1-5 and 1E2-1 to 1E2-4.

The thin-film encapsulation layer TFE shown in FIG. 8 may include at least one inorganic encapsulation layer, and thus, it may provide a base surface having an improved flatness. Accordingly, the failure rate of forming the elements of the input-sensing unit ISU may be reduced even when the elements of the input-sensing unit ISU are successively formed. The first signal lines SL1-1 to SL1-5 and the second signal lines SL2-1 to SL2-4 may be provided on the non-display region DD-NDA having a reduced height difference, and thus, each of them may be formed to have a uniform thickness. It may be possible to reduce a stress exerted on a region, at which height differences of the first signal lines SL1-1 to SL1-5 and the second signal lines SL2-1 to SL2-4 are superposed.

Referring to FIG. 9, the input-sensing unit ISU may include an input-sensing region ISA and a non-input-sensing region NISA. The first and second sensing electrodes 1E1-1 to 1E1-5 and 1E2-1 to 1E2-4 for sensing an external input may be provided on the input-sensing region ISA.

The first sensing electrodes 1E1-1 to 1E1-5 may be provided to cross the second sensing electrodes 1E2-1 to 1E2-4. The first sensing electrodes 1E1-1 to 1E1-5 may be arranged in the first direction DR1 and each of them may extend in the second direction DR2. The first and second sensing electrodes 1E1-1 to 1E1-5 and 1E2-1 to 1E2-4 may be configured to sense an external input in a mutual-capacitance manner and/or a self-capacitance manner. In some embodiments, during a first period, coordinates of an external input may be obtained in the mutual-capacitance manner, and during a second period, coordinates of the external input may be obtained in the self-capacitance manner.

Each of the first sensing electrodes 1E1-1 to 1E1-5 may include first sensor portions SP1 and first connecting portions CP1. Each of the second sensing electrodes 1E2-1 to 1E2-4 may include second sensor portions SP2 and second connecting portions CP2.

In some embodiments, the input-sensing region ISA does not have a rectangular shape. In FIG. 9, the input-sensing region ISA is illustrated to have a rectangular shape, from which a central top portion is removed, but the inventive concept is not limited thereto. For example, the shape of the input-sensing region ISA may be variously changed, as required. However, in the case where the shape of the input-sensing region ISA is changed, some of the first sensor portions SP1 or some of the second sensor portions SP2 may not have the minimum area required to sense an external input.

In some embodiments, two ones of the first sensor portions SP1, which are located at opposite ends of the first sensing electrode (or adjacent the edge of the input-sensing region ISA), may have a small area or size (e.g., half area), compared with a central one (e.g., not adjacent the edge of the input-sensing region ISA) of the first sensor portions SP1. Also, at least one of the first sensor portions SP1 may have an area that is smaller than half that of a central one of the first sensor portions SP1. In FIG. 9, the first sensor portions SP1 located at both ends of the first sensing electrode 1E1-1 (at the uppermost region of the input-sensing unit ISU) are illustrated to have an area smaller than half that of the central one of the first sensor portions SP1.

Two ones of the second sensor portions SP2, which are located at opposite ends of the second sensing electrode (or adjacent the edge of the input-sensing region ISA), may have a small area or size (e.g., half area), compared with a central one (e.g., not adjacent the edge of the input-sensing region) of the second sensor portions SP2. Also, at least one of the second sensor portions SP2 may have an area that is smaller than half that of a central one of the second sensor portions SP2. In FIG. 9, the second sensor portions SP2, which are located at one-side ends (e.g., one end) of the second sensing electrodes 1E2-1 and 1E2-4 (at left and right sides of the input-sensing unit ISU), are illustrated as having an area smaller than half that of a central one of the second sensor portions SP2.

FIG. 9 illustrates the first sensing electrodes 1E1-1 to 1E1-5 and the second sensing electrodes 1E2-1 to 1E2-4, according to some embodiments of the inventive concept, but the inventive concept is not limited to specific shapes thereof. In some embodiments, the first sensing electrodes 1E1-1 to 1E1-5 and the second sensing electrodes 1E2-1 to 1E2-4 may have a shape (e.g., a bar shape), in which the sensor portion and the connecting portion are not differentiated from each other. The first sensor portions SP1 and the second sensor portions SP2 are illustrated to have a diamond-like shape, but the inventive concept is not limited thereto. For example, each of the first and/or second sensor portions SP1 and SP2 may be provided to have other polygonal shapes. Furthermore, in some embodiments, at least one of the first and second sensor portions SP1 and SP2 may include a portion with a curved shape.

In one or each of the first sensing electrodes 1E1-1 to 1E1-5, the first sensor portions SP1 may be arranged in the second direction DR2, and in one or each of the second sensing electrodes 1E2-1 to 1E2-4, the second sensor portions SP2 may be arranged in the first direction DR1. Each of the first connecting portions CP1 may be provided to connect adjacent ones of the first sensor portions SP1 to each other (e.g., to connect adjacent ones of the first sensor portions SP1 in the same first sensing electrode), and each of the second connecting portions CP2 may be provided to connect adjacent ones of the second sensor portions SP2 to each other (e.g., to connect adjacent ones of the second sensor portions SP2 in the same second sensing electrode). In some embodiments, in at least one of the first sensing electrodes 1E1-1 to 1E1-5, at least one of the first sensor portions SP1 is not connected to an adjacent one of the first sensor portions SP1 in the same first sensing electrode, and/or in at least one of the second sensing electrodes, at least one of the second sensor portions SP2 is not connected to an adjacent one of the second sensor portions SP2 in the same second sensing electrode.

The first signal lines SL1-1 to SL1-5 may be connected to one-side ends (e.g., one end) of the first sensing electrodes 1E1-1 to 1E1-5, respectively. The second signal lines SL2-1 to SL2-4 may be connected to both ends of the second sensing electrodes 1E2-1 to 1E2-4. In some embodiments, the first signal lines SL1-1 to SL1-5 may be connected to both ends of the first sensing electrodes 1E1-1 to 1E1-5. In some embodiments, the second signal lines SL2-1 to SL2-4 may be connected to only one-side ends (e.g., one end) of the second sensing electrodes 1E2-1 to 1E2-4, respectively.

According to some embodiments of the inventive concept, it may be possible to improve the sensing sensitivity of an input-sensing unit ISU, compared with an input-sensing unit ISU in which the second signal lines SL2-1 to SL2-4 are connected to one-side ends (e.g., one end) of the second sensing electrodes 1E2-1 to 1E2-4, respectively. In some embodiments, since the second signal lines SL2-1 to SL2-4 which are connected to both ends of the second sensing electrodes 1E2-1 to 1E2-4 are used to transmit detection or transmission signals, it may be possible to prevent voltage drop of the detection or transmission signals and to prevent deterioration of the sensing sensitivity.

Each of the first and second signal lines SL1-1 to SL1-5 and SL2-1 to SL2-4 may include a line portion SL-L and a pad portion SL-P. The pad portions SL-P may be provided on the pad region NDA-PD of the input-sensing unit ISU and may be aligned with each other. The pad portions SL-P may be overlapped with the dummy pads IS-DPD shown in FIG. 4A.

The input-sensing unit ISU may include the signal pads DP-PD. The signal pads DP-PD may be provided on the pad region NDA-PD and may be aligned with each other.

In some embodiments, the first signal lines SL1-1 to SL1-5 and the second signal lines SL2-1 to SL2-4 may be replaced with a circuit board or the like, which is separately fabricated and is combined with the display panel DP.

In some embodiments, although not shown, the pad portion SL-P of the first signal lines SL1-1 to SL1-5 and the pad portion SL-P of the second signal lines SL2-1 to SL2-4 may be provided at different regions, and the signal pads DP-PD may be interposed between them. Since the two groups of the pad portions SL-P may be spaced apart from each other, it may be possible to easily connect the circuit board to them and to simplify the structure of the circuit board.

In some embodiments, positions of the first signal lines SL1-1 to SL1-5 may be exchanged with positions of the second signal lines SL2-1 to SL2-4. The first signal lines SL1-1 to SL1-5 may be provided at a left side, and the second signal lines SL2-1 to SL2-4 may be provided at a right side, or vice versa.

As shown in FIG. 10A, the first conductive layer IS-CL1 may include the first connecting portions CP1. In addition, the first conductive layer IS-CL1 may include first line portions SL1-11 to SL1-51 of the first signal lines SL1-1 to SL1-5 and first line portions SL2-11 to SL2-41 of the second signal lines SL2-1 to SL2-4.

In some embodiments, the first connecting portions CP1, the first line portions SL1-11 to SL1-51 of the first signal lines SL1-1 to SL1-5, and the first line portions SL2-11 to SL2-41 of the second signal lines SL2-1 to SL2-4 may be formed by the same process. The first connecting portions CP1, the first line portions SL1-11 to SL1-51 of the first signal lines SL1-1 to SL1-5, and the first line portions SL2-11 to SL2-41 of the second signal lines SL2-1 to SL2-4 may include the same material and may have the same stacking structure. In some embodiments, the first connecting portions CP1 may be formed by a process that is different from that for forming the first line portions SL1-11 to SL1-51 of the first signal lines SL1-1 to SL1-5 and the first line portions SL2-11 to SL2-41 of the second signal lines SL2-1 to SL2-4. Accordingly, the first line portions SL1-11 to SL1-51 of the first signal lines SL1-1 to SL1-5 and the first line portions SL2-11 to SL2-41 of the second signal lines SL2-1 to SL2-4 may have the same stacking structure, but the first connecting portions CP1 may have a stacking structure different from that of the first line portions SL1-11 to SL1-51 and SL2-11 to SL2-41.

In some embodiments, the first conductive layer IS-CL1 may include the second connecting portions CP2 (e.g., see FIG. 9). Here, the first connecting portions CP1 may be formed from the first conductive layer IS-CL1. Accordingly, each of the first sensing electrodes 1E1-1 to 1E1-5 may have a single body shape.

Although not shown in FIG. 10A, the first insulating layer IS-IL1 may be provided to cover at least the first connecting portions CP1. In the present embodiment, the first insulating layer IS-IL1 may be overlapped with at least a portion of the display and non-display regions DD-DA and DD-NDA. The first insulating layer IS-IL1 may be provided to cover the first line portions SL1-11 to SL1-51 of the first signal lines SL1-1 to SL1-5 and the first line portions SL2-11 to SL2-41 of the second signal lines SL2-1 to SL2-4.

In the present embodiment, the first insulating layer IS-IL1 may be overlapped with the display region DD-DA and the pad region NDA-PD. The first insulating layer IS-IL1 may be fully overlapped with the display region DD-DA and the non-display region DD-NDA.

First connection contact holes CNT-I and second connection contact holes CNT-S may be defined in the first insulating layer IS-IL1. The first connection contact holes CNT-I may be provided to partially expose the first connecting portions CP1, and the second connection contact holes CNT-S may be provided to partially expose the first line portions SL1-11 to SL1-51 of the first signal lines SL1-1 to SL1-5 and the first line portions SL2-11 to SL2-41 of the second signal lines SL2-1 to SL2-4.

As shown in FIG. 10B, the second conductive layer IS-CL2 may include the first sensor portions SP1, the second sensor portions SP2, and the second connecting portions CP2. Each of the second sensing electrodes 1E2-1 to 1E2-4 may have a single-body shape (e.g., may be integrally formed). The first sensor portions SP1 may be spaced apart from the second sensing electrodes 1E2-1 to 1E2-4.

The second conductive layer IS-CL2 may include second line portions SL1-12 to SL1-52 of the first signal lines SL1-1 to SL1-5, pad portions SL-P of the first signal lines SL1-1 to SL1-5, second line portions SL2-12 to SL2-42 of the second signal lines SL2-1 to SL2-4, and pad portions SL-P of the second signal lines SL2-1 to SL2-4. In addition, the second conductive layer IS-CL2 may include the signal pads DP-PD.

The first sensor portions SP1, the second sensor portions SP2, and the second connecting portions CP2 may be formed by the same process. The first sensor portions SP1, the second sensor portions SP2, and the second connecting portions CP2 may include the same material and may have the same stacking structure. The second line portions SL1-12 to SL1-52 of the first signal lines SL1-1 to SL1-5, the pad portions SL-P of the first signal lines SL1-1 to SL1-5, the second line portions SL2-12 to SL2-42 of the second signal lines SL2-1 to SL2-4, the pad portions SL-P of the second signal lines SL2-1 to SL2-4, and the signal pads DP-PD may be formed by a process that is the same as or different from that for forming the first sensor portions SP1, the second sensor portions SP2, and the second connecting portions CP2.

Although not shown in FIG. 10B, the second insulating layer IS-IL2 may be overlapped with at least a portion of the display and non-display regions DD-DA and DD-NDA. In the present embodiment, the second insulating layer IS-IL2 may be provided to expose the pad region NDA-PD.

As shown in FIG. 10C, the first sensor portions SP1 may be electrically connected to respective first connecting portions CP1 through the first connection contact holes CNT-I. The first connecting portion CP1 may be formed of or include a material whose electric resistance is lower than that of the first sensor portions SP1.

The first connecting portion CP1 may be provided to cross the second connecting portion CP2 with respect to the plane in the first and second directions DR1 and DR2, and here, in order to suppress the effect of parasitic capacitance, the first connecting portion CP1 may be configured to have a reduced a width or planar area. In order to improve the sensing sensitivity, the first connecting portion CP1 may include a low resistive material (e.g., the same metal material as the first line portions SL1-11 to SL1-51 of the first signal lines SL1-1 to SL1-5).

In the present embodiment, the first insulating layer IS-IL1 may be a polymer layer (e.g., an acryl polymer layer). The second insulating layer IS-IL2 may also be a polymer layer (e.g., an acryl polymer layer). Even when the input-sensing unit ISU is directly provided on the display panel DP as shown in FIGS. 8 and 10D, the polymer layer may improve flexibility of the display device DD. To improve the flexibility, the first sensor portions SP1 and the second sensor portions SP2 may have a mesh shape and may include a metallic material. The first and second sensor portions SP1 and SP2 may be referred to as 'a metal mesh pattern'.

Three ones (e.g., SL1-1 to SL1-3) of the first signal lines SL1-1 to SL1-5 are exemplarily illustrated in FIG. 10D. Referring to the first signal line SL1-1, the first line portion SL1-11 and the second line portion SL1-12 may be electrically connected to each other through the second connection contact holes CNT-S. This may reduce the electrical resistance of the first signal line SL1-1. The first line portions SL2-11 to SL2-41 and the second line portions SL2-12 to SL2-42 of the second signal lines SL2-1 to SL2-4 may similarly be electrically connected to each other through the second contact holes CNT-S.

In some embodiments, one of the first line portion (e.g., SL1-11) and the second line portion (e.g., SL1-12) for one or more of the first signal lines SL1-1 to SL1-5 may be omitted. In some embodiments, one of the first and second line portions of the second signal lines SL2-1 to SL2-4 may be omitted.

As shown in FIG. 10E, in some embodiments, the first line portion SL1-11 may be omitted. The first signal line SL1-1 may be substantially the same as the structure of FIG. 10D having only the second line portion SL1-12. The first signal line SL1-1 may include a metal layer SL1-12M and a transparent conductive layer SL1-12T, which is directly provided on the metal layer SL1-12M. In some embodiments, the sensing portions (e.g., the first sensing portions SP1 of FIG. 10C) may be configured to include a metal layer but not a transparent conductive layer.

Figure 11A:
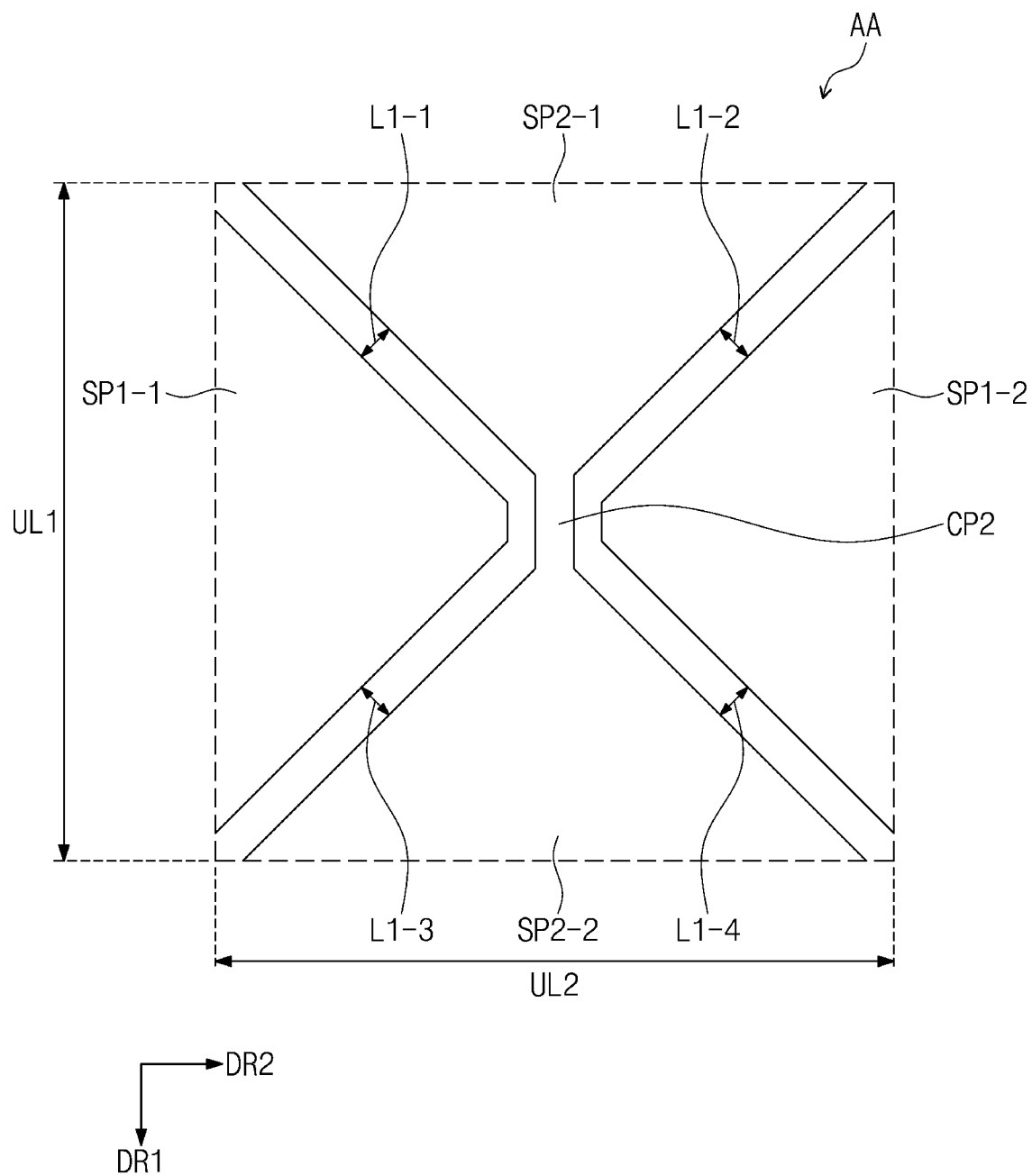
FIG. 11A is an enlarged plan view illustrating a portion 'AA' of FIG. 9 according to some embodiments of the inventive concept.
Figure 11B:
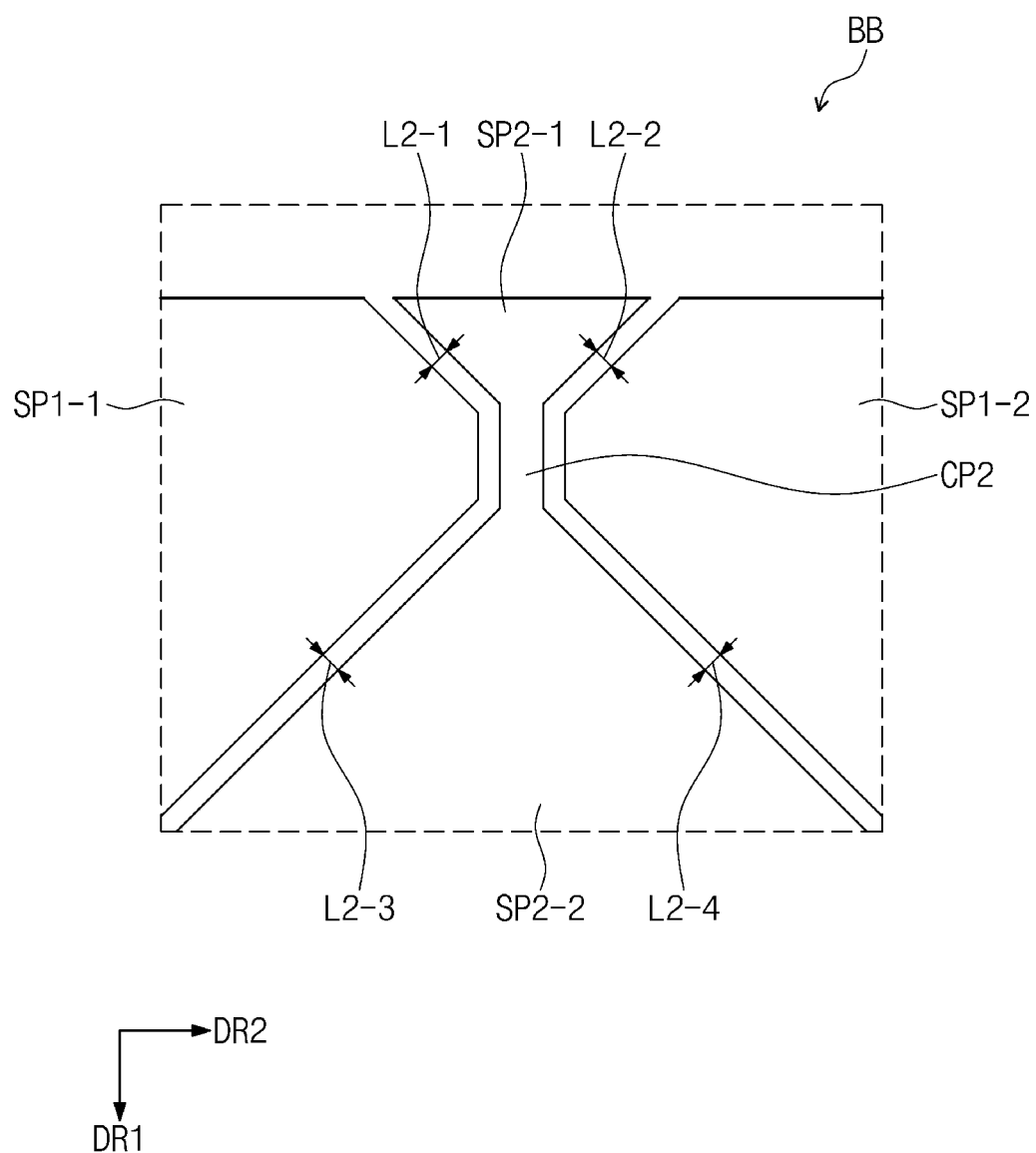
FIG. 11B is an enlarged plan view illustrating a portion 'BB' of FIG. 9 according to some embodiments of the inventive concept.

FIG. 11A is an enlarged plan view illustrating a portion 'AA' of FIG. 9. FIG. 11B is an enlarged plan view illustrating a portion 'BB' of FIG. 9. For convenience in illustration, the first connecting portion CP1 is not illustrated in FIGS. 11A and 11B.

The portion 'AA' shown in FIG. 11A may be defined as a first unit region AA, which is a part of the input-sensing unit ISU and is used to sense an external input. In the first unit region AA, the first sensor portions SP1 may include a left first sensor portion SP1-1 and a right first sensor portion SP1-2, and the second sensor portions SP2 may include an upper second sensor portion SP2-1 and a lower second sensor portion SP2-2.

Distances between the first sensor portions SP1-1 and SP1-2 and the second sensor portions SP2-1 and SP2-2 may be defined as first distances L1-1, L1-2, L1-3, and L1-4, where L1-1 is the distance between SP1-1 and SP2-1, L1-2 is the distance between SP2-1 and SP 1-2, L1-3 is the distance between SP1-1 and SP2-2, and L1-4 is the distance between SP2-2 and SP1-2. The first distances L1-1, L1-2, L1-3, and L1-4 may have substantially the same value, but the inventive concept is not limited thereto. In some embodiments, at least one of the first distances L1-1, L1-2, L1-3, and L1-4 may be changed, as required.

In the first unit region AA, the first sensor portions SP1-1 and SP1-2 and the second sensor portions SP2-1 and SP2-2 may constitute capacitors having first capacitance.

For example, the upper second sensor portion SP2-1, in conjunction with the left first sensor portion SP1-1 and the right first sensor portion SP1-2, may constitute a pair of capacitors having the first capacitance (e.g., where the left first sensor portion SP1-1 and the upper second sensor portion SP2-1 are the electrodes for one capacitor, and the right first sensor portion SP1-2 and the upper second sensor portion SP2-1 are the electrodes for the other capacitor), and the lower second sensor portion SP2-2, in conjunction with the left first sensor portion SP1-1 and the right first sensor portion SP1-2, may constitute a pair of capacitors having the first capacitance (e.g., where the left first sensor portion SP1-1 and the lower second sensor portion SP2-2 are the electrodes for one capacitor, and the right first sensor portion SP1-2 and the lower second sensor portion SP2-2 are the electrodes for the other capacitor).

The first capacitance may be determined by an area of each of the first sensor portions SP1-1 and SP1-2 and the second sensor portions SP2-1 and SP2-2 in the first unit region AA and the first distances L1-1, L1-2, L1-3, and L1-4. In detail, the larger the area of each of the first sensor portions SP1-1 and SP1-2 and the second sensor portions SP2-1 and SP2-2 in the first unit region AA, the greater the first capacitance. Also, the smaller the first distances L1-1, L1-2, L1-3, and L1-4 in the first unit region AA, the greater the first capacitance.

In the first unit region AA, the left first sensor portion SP1-1 and the right first sensor portion SP1-2 may have substantially the same area, and the upper second sensor portion SP2-1 and the lower second sensor portion SP2-2 may also have substantially the same area.

Accordingly, in the first unit region AA, the first sensor portions SP1-1 and SP1-2 and the second sensor portions SP2-1 and SP2-2 may constitute capacitors having substantially the same capacitance.

The portion 'BB' shown in FIG. 11B may be defined as a second unit region BB, which is a part of the input-sensing unit ISU and is used to sense an external input.

In the second unit region BB, the left and right first sensor portions SP1-1 and SP1-2 and the upper and lower second sensor portions SP2-1 and SP2-2 may constitute capacitors having second capacitance.

In FIG. 11B, distances between the first sensor portions SP1-1 and SP1-2 and the second sensor portions SP2-1 and SP2-2 may be defined as second distances L2-1, L2-2, L2-3, and L2-4, where L2-1 is the distance between SP1-1 and SP2-1, L2-2 is the distance between SP2-1 and SP 1-2, L2-3 is the distance between SP1-1 and SP2-2, and L2-4 is the distance between SP2-2 and SP1-2.

Each of the left and right first sensor portions SP1-1 and SP1-2 and the upper second sensor portion SP2-1 shown in FIG. 11B may have a shape whose top portion is removed, when compared with a corresponding one of FIG. 11A (e.g., the first sensor portions SP1-1 and SP1-2 and the upper second sensor portion SP2-1 have a smaller area than their respective counterparts in the first unit region AA).

In the present specification, a sensor portion which has a shape, where the majority of the first sensor portions SP1 and second sensor portions SP2 of the input-sensing unit ISU have substantially the same shape (e.g., the sensor portions SP1-1, SP1-2, SP2-1, and SP2-2 of FIG. 11A), will be referred to as a normal sensor portion. Also, a sensor portion which is a part of the input-sensing unit ISU and has an area smaller than that of the normal sensor portion, (e.g., the sensor portions SP1-1, SP1-2, and SP2-1 of FIG. 11B) will be referred to as a severed sensor portion. The severed sensor portion may have a shape made by cutting or removing a portion of the shape of the normal sensor portion (e.g., the shape of the severed sensor portion may be substantially the same as the shape of a first region of the normal sensor portion, but may omit a second region of the normal sensor portion).

In some embodiments, the normal sensor portion may have a first area, and the severed sensor portion may have a second area. In some embodiments, the ratio of the second area to the first area may range from 0.05 to 0.45. If the ratio of the second area to the first area is less 0.05, it may be difficult to use such an input-sensing unit as a sensor. If the ratio of the second area to the first area is greater than 0.45, there may be no difference in input-sensing ability between the severed sensor portion and the normal sensor portion.

An area of each of the second sensor portions SP2-1 and SP2-2 and the right first sensor portion SP1-2 shown in FIG. 11B may be smaller than an area of a corresponding one in FIG. 11A.

Thus, the second capacitance in FIG. 11B may be less than the first capacitance in FIG. 11A if the second distances L2-1, L2-2, L2-3, and L2-4 are the same as the first distances L1-1, L1-2, L1-3, and L1-4, and this loss in capacitance may be compensated by adjusting distances between the first sensor portions SP1-1 and SP1-2 and the second sensor portions SP2-1 and SP2-2 in FIG. 11B. In some embodiments, the second distances L2-1, L2-2, L2-3, and L2-4 may be smaller than the first distances L1-1, L1-2, L1-3, and L1-4. By reducing the second distances L2-1, L2-2, L2-3, and L2-4, it may be possible to compensate for some or all of the loss in capacitance which may occur when the severed sensor portions are formed to have an area smaller than that of a normal sensor portion (e.g., compensate or reduce the difference in capacitance that would result if the severed sensor portions having the smaller area were separated by a distance equal to the first distances L1-1, L1-2, L1-3, and L1-4.

The second distances L2-1, L2-2, L2-3, and L2-4 may have substantially the same value, but the inventive concept is not limited thereto. In some embodiments, to adjust the second capacitance, at least one of the second distances L2-1, L2-2, L2-3, and L2-4 may be different from the others. For example, since the upper second sensor portion SP2-1 has an area smaller than that of the lower second sensor portion SP2-2, distances L2-1 and L2-2 between the upper second sensor portion SP2-1 and the first sensor portions SP1-1 and SP1-2 may be smaller than distances L2-3 and L2-4 between the lower second sensor portion SP2-2 and the first sensor portions SP1-1 and SP1-2.

In addition, a distance between the first sensor portions SP1-1 and SP1-2 may also affect the sensing sensitivity. For example, a distance between the first sensor portions SP1-1 and SP1-2 shown in FIG. 11B may be smaller than a distance between the first sensor portions SP1-1 and SP1-2 shown in FIG. 11A, and in this case, the sensing sensitivity may be changed depending on such a change in the capacitance between the first sensor portions SP1-1 and SP1-2.

Figure 12A:
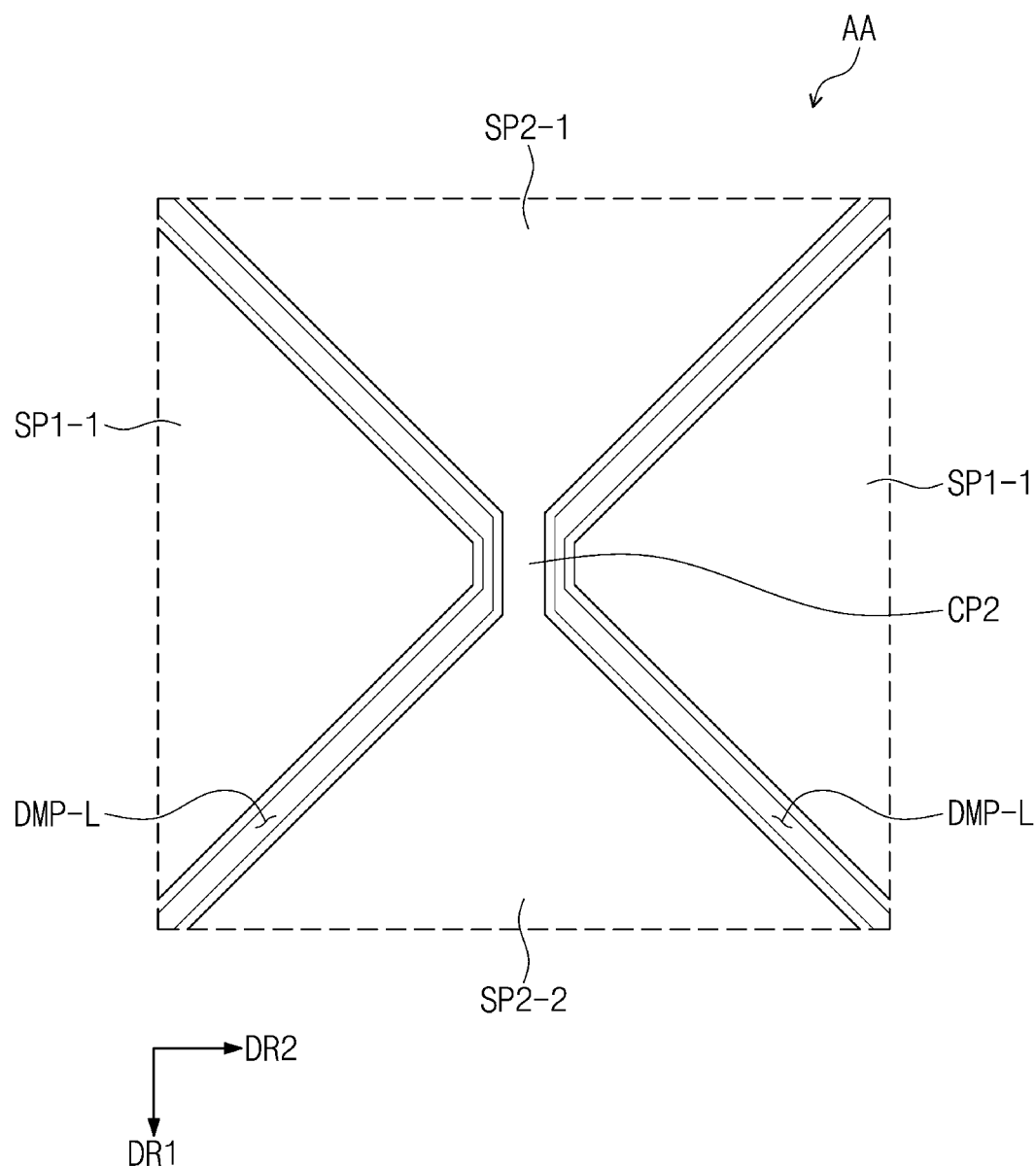
FIG. 12A is an enlarged plan view illustrating a portion 'AA' of FIG. 9 according to some embodiments of the inventive concept.
Figure 12B:
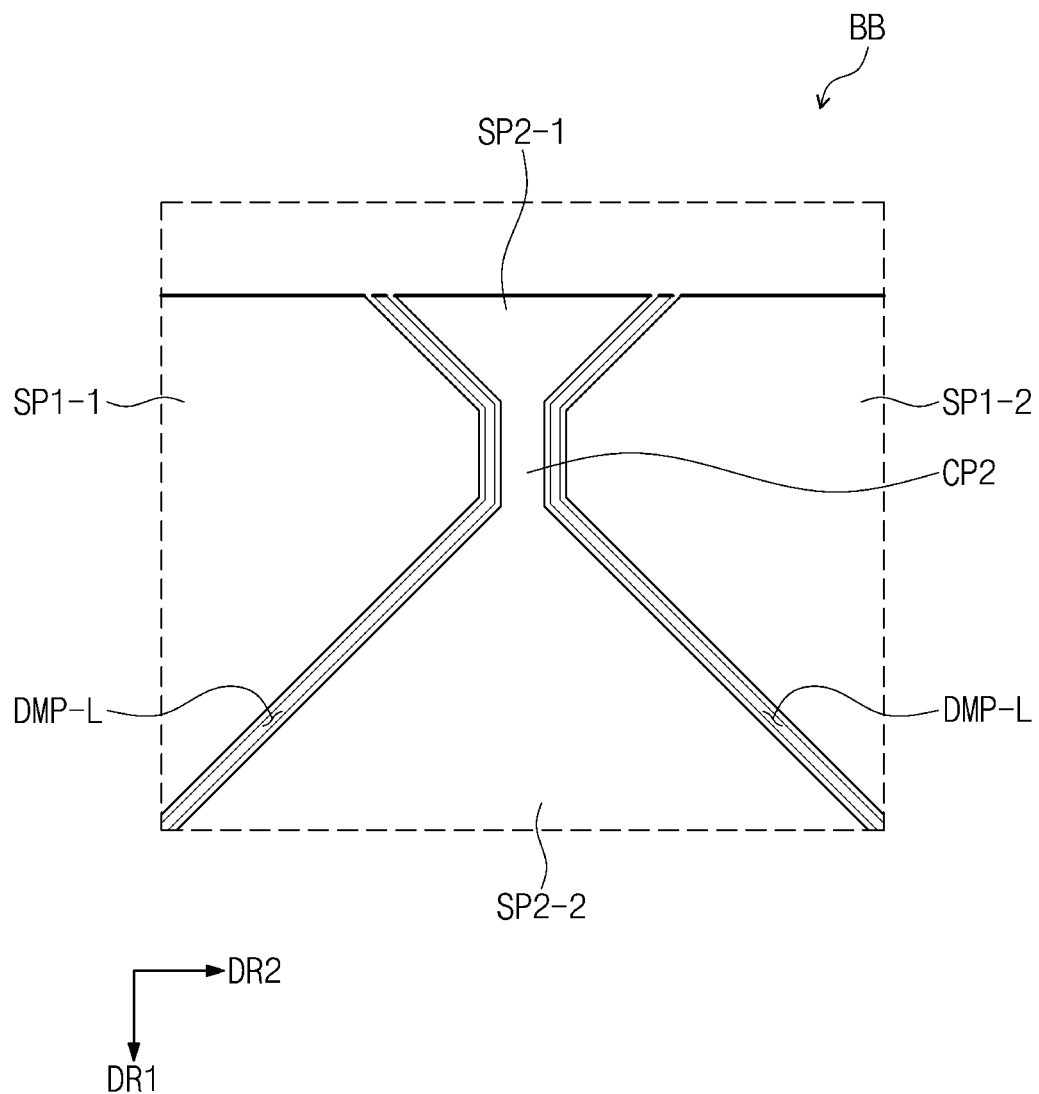
FIG. 12B is an enlarged plan view illustrating a portion 'BB' of FIG. 9 according to some embodiments of the inventive concept.

FIG. 12A is an enlarged plan view illustrating a portion 'AA' of FIG. 9. FIG. 12B is an enlarged plan view illustrating a portion 'BB' of FIG. 9. For convenience in illustration, the first connecting portion CP1 is not illustrated in FIGS. 12A and 12B.

An optical dummy electrode DMP-L is illustrated in FIGS. 12A and 12B. The optical dummy electrode DMP-L may be formed by the same process as that for the first sensor portions SP1 and the second sensor portions SP2, and thus, the optical dummy electrode DMP-L and the first and second sensor portions SP1 and SP2 may include the same material and may have the same stacking structure. The optical dummy electrode DMP-L may be a floating electrode and may not be electrically connected to the first sensor portions SP1 and the second sensor portions SP2. Since the optical dummy electrode DMP-L is provided, visibility of a boundary region between the first sensor portions SP1 and the second sensor portions SP2 may be reduced. Although not shown, input-sensing units of other embodiments to be described below may be configured to have the optical dummy electrode DMP-L.

The optical dummy electrode DMP-L of FIG. 12B may have a thickness smaller than that of the optical dummy electrode DMP-L of FIG. 12A. Such a difference in thickness between the optical dummy electrodes DMP-L may result from the difference between the first distances L1-1, L1-2, L1-3, and L1-4 and the second distances L2-1, L2-2, L2-3, and L2-4, which was described with reference to FIGS. 11A and 11B.

Figure 13:
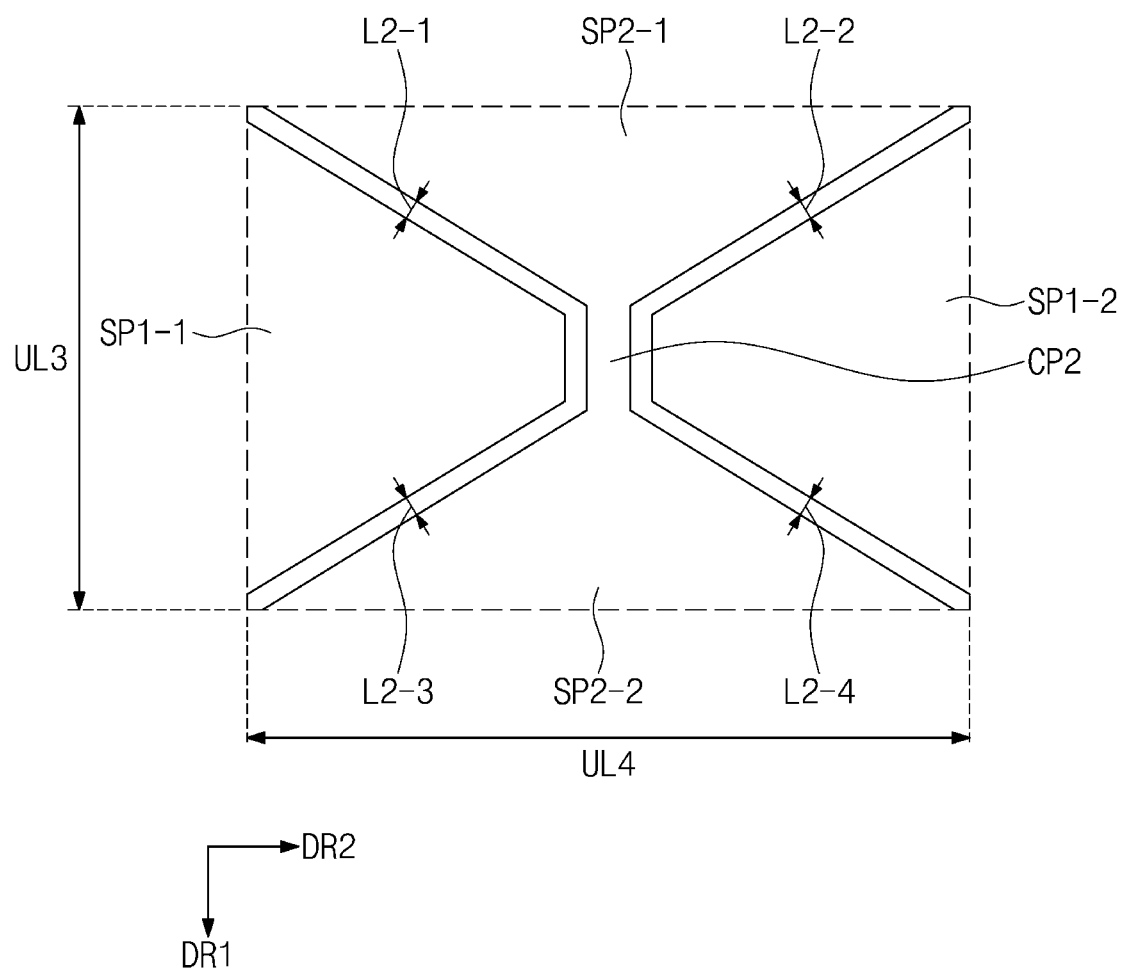
FIG. 13 is an enlarged plan view illustrating a portion 'BB' of FIG. 9 according to some embodiments of the inventive concept.

FIG. 13 is an enlarged plan view illustrating an alternative embodiment of the portion 'BB' of FIG. 9. For convenience in illustration, the first connecting portion CP1 is not illustrated in FIG. 13.

Referring to FIG. 11A, the first unit region AA may have a first unit length UL1 in the first direction DR1 and a second unit length UL2 in the second direction DR2.

The portion 'BB' shown in FIG. 13 may be defined as a second unit region BB, which is a part of the input-sensing unit ISU and is used to sense an external input. The second unit region BB may have a third unit length UL3 in the first direction DR1 and a fourth unit length UL4 in the second direction DR2.

Comparing FIG. 13 with FIG. 11A, the second unit length UL2 may be substantially equal to the fourth unit length UL4, but the inventive concept is not limited thereto. For example, in some embodiments, the second unit length UL2 may be different from the fourth unit length UL4.

Comparing FIG. 13 with FIG. 11A, the first unit length UL1 may be different from the third unit length UL3. For example, the third unit length UL3 may be shorter than the first unit length UL1.

Comparing FIG. 13 with FIG. 11B, the first sensor portions SP1-1 and SP1-2 and the second sensor portions SP2-1 and SP2-2 of FIG. 13 may have a uniform area, compared with the first sensor portions SP1-1 and SP1-2 and the second sensor portions SP2-1 and SP2-2 of FIG. 11B. For example, in the example of FIG. 13, the upper second sensor portion SP2-1 may have substantially the same area as that of the lower second sensor portion SP2-2, and the left first sensor portion SP1-1 may have substantially the same area as that of the right first sensor portion SP1-2. In the case where all of the sensor portions provided at left, right, upper, and lower sides have substantially the same area, the capacitors, which are formed by the sensor portions in the second unit region BB, may have substantially the same capacitance. Thus, even if the third unit length UL3 of the second unit region BB is shorter than the first unit length UL1 as shown in FIG. 13, it may be possible to obtain touch sensitivity in the second unit region BB similar to that of the first unit region AA having the first unit length UL1 as shown in FIG. 11A.

Although, in the example of FIG. 13, the sensor portions SP1-1, SP1-2, SP2-1, and SP2-2 in the second unit region BB are adjusted to have substantially the same area, capacitances between the sensor portions SP1-1, SP1-2, SP2-1, and SP2-2 in the second unit region BB may be smaller than capacitances between the sensor portions SP1-1, SP1-2, SP2-1, and SP2-2 in the first unit region AA (e.g., in FIG. 11A). In this case, the second distances L2-1, L2-2, L2-3, and L2-4 between the sensor portions SP1-1, SP1-2, SP2-1, and SP2-2 in the second unit region BB may be adjusted, for example as described above with reference to FIG. 11B.

A change in capacitance which is caused by adjusting the third unit length UL3 and the second distances L2-1, L2-2, L2-3, and L2-4 in the second unit region BB was simulated, and the following tables 1 and 2 show the result of the simulation.

TABLE 1

|  | First Unit Length (UL1) | First Distance (L1-1, L1-2, L1-3, L1-4) | Capacitance |
| --- | --- | --- | --- |
| Experiment 1 | 4.333 mm | 200 μm | 1.003 pF |

TABLE 2

|  | Third Unit Length (UL3) | Second Distance (L2-1, L2-2, L2-3, L2-4) | Capacitance |
| --- | --- | --- | --- |
| Experiment 2 | 2.667 mm | 75 μm | 1.066 pF |
| Experiment 3 | 2.667 mm | 100 μm | 1.035 pF |
| Experiment 4 | 2.667 mm | 140 μm | 0.998 pF |

In the table 1, data of the experiment 1 show that, when the first unit length UL1 in the first unit region AA was set to 4.333 mm and the first distances L1-1, L1-2, L1-3, and L1-4 were set to 200 μm, the capacitance was 1.003 pF.

In the table 2, data of the experiments 2, 3, and 4 show that, when the third unit length UL3 in the second unit region BB was set to 2.667 mm and the second distances L2-1, L2-2, L2-3, and L2-4 were changed to three different values of 75 μm, 100 μm, and 140 μm, the capacitance had values of 1.066 pF, 1.035 pF, and 0.998 pF, respectively.

That is, by adjusting an area of the electrodes and a distance therebetween in the second unit region BB, it may be possible to maintain the capacitance to a level that is equal or similar to that in the first unit region BB, even when the third unit length UL3 is smaller than the first unit length UL1.

Figure 14:
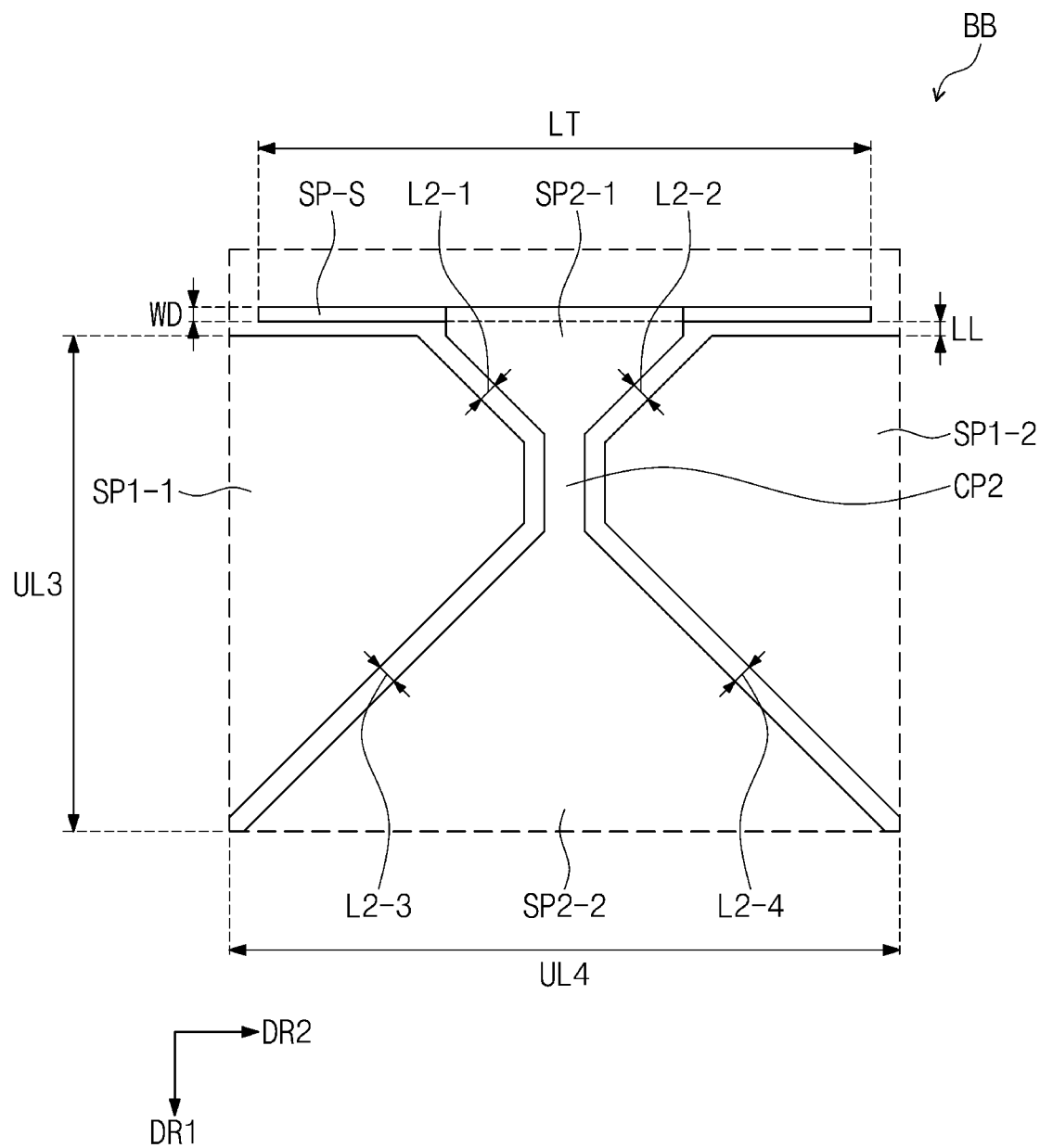
FIG. 14 is an enlarged plan view illustrating a portion 'BB' of FIG. 9 according to some embodiments of the inventive concept.

FIG. 14 is an enlarged plan view illustrating an alternative embodiment of a portion 'BB' of FIG. 9. The portion 'BB' shown in FIG. 14 may be defined as the second unit region BB, which is a part of the input-sensing unit ISU and is used to sense an external input.

In some embodiments, the second unit region BB may further include an auxiliary electrode SP-S. The auxiliary electrode SP-S may have a rod or bar shape.

The auxiliary electrode SP-S may include the same material as the upper second sensor portion SP2-1, but the inventive concept is not limited thereto.

The auxiliary electrode SP-S may be electrically connected to the upper second sensor portion SP2-1. In some embodiments, the upper second sensor portion SP2-1 may be overlapped with and/or in contact with the auxiliary electrode SP-S.

The auxiliary electrode SP-S may be spaced apart from the first sensor portions SP1-1 and SP1-2 by a distance LL. The auxiliary electrode SP-S and the first sensor portions SP1-1 and SP1-2, which are separated from each other by the distance LL, may constitute capacitors. Thus, the auxiliary electrode SP-S may compensate for or reduce the loss in capacitance which may occur when an area of the upper second sensor portion SP2-1 is smaller than that of the lower second sensor portion SP2-2 (e.g., the capacitance of the capacitors formed between the first sensor portions SP1-1 and SP1-2 and the upper second sensor portion SP2-1 may be the same as the capacitance of the capacitors formed between the first sensor portions SP1-1 and SP1-2 and the lower second sensor portion SP2-2, even though the area of the upper second sensor portion SP2-1 may be smaller than the area of the lower second sensor portion SP2-2).

A thickness WD of the auxiliary electrode SP-S may be adjusted as required, the thickness WD being measured in the second direction DR2. The capacitance of capacitors in the second unit region BB depend on the thickness WD.

A change in capacitance, which is caused by disposing the auxiliary electrode SP-S in the second unit region BB and adjusting the thickness WD, was simulated, and the following table 3 shows the results of the simulation.

TABLE 3

|  | Kind of Second Sensor Portion | Condition of Auxiliary Electrode | Capacitance |
| --- | --- | --- | --- |
| Experiment 1 | Lower Second Sensor Portion (Normal Sensor Portion) | — | 1.003 pF |
| Experiment 2 | Upper Second Sensor Portion (Severed Sensor Portion) | — | 0.779 pF |
| Experiment 3 | Upper Second Sensor Portion (Severed Sensor Portion) | Thickness WD = 13 μm | 1.052 pF |
| Experiment 4 | Upper Second Sensor Portion (Severed Sensor Portion) | Thickness WD = 100 μm | 1.089 pF |
| Experiment 5 | Upper Second Sensor Portion (Severed Sensor Portion) | Thickness WD = 150 μm | 1.106 pF |

In the simulation performed to obtain the data of the table 3, the third and fourth unit distances UL3 and UL4 were set to 2.667 mm and 4.333 mm, respectively, the distance LL was set to 0.01 mm, and a length LT was set to 4.328 mm.

In the table 3, data of the experiment 1 show that capacitance between the lower second sensor portion SP2-2 having the unsevered shape and each of the first sensor portions SP1-1 and SP1-2 adjacent thereto was 1.003 pF. Data of the experiment 2 show that capacitance between the upper second sensor portion SP2-1 having the severed shape and each of the first sensor portions SP1-1 and SP1-2 adjacent thereto was 0.779 pF.

In the table 3, data of the experiments 3, 4, and 5 show that in the case where the thickness WD of the auxiliary electrode was changed to three different values of 13 μm, 100 μm, and 150 μm, the capacitance had values of 1.052 pF, 1.089 pF, and 1.106 pF, respectively.

In the case where the auxiliary electrode SP-S is connected to the severed sensor portion, it may be possible to maintain the capacitance to a level that is equal or similar to that in the first unit region AA, even when the severed sensor portion has an area smaller than that of the normal sensor portion.

Although, in the example of FIG. 14, the auxiliary electrode SP-S is provided in the second unit region BB, in some embodiments, the capacitances between the sensor portions SP1-1, SP1-2, SP2-1, and SP2-2 in the second unit region BB may be smaller than capacitances between the sensor portions SP1-1, SP1-2, SP2-1, and SP2-2 in the first unit region AA shown in FIG. 11A. In this case, distances between the sensor portions SP1-1, SP1-2, SP2-1, and SP2-2 in the second unit region BB may be adjusted, for example as described above with reference to FIG. 11B.

Figure 15A:
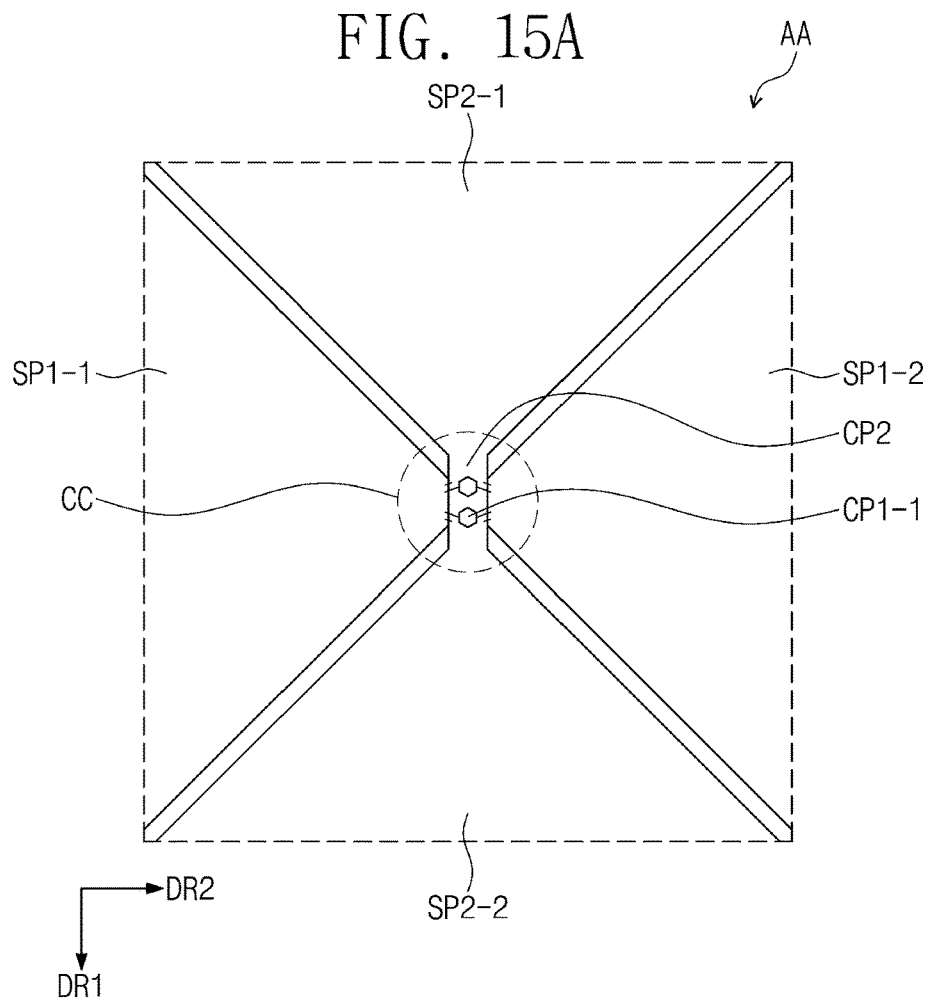
FIG. 15A is an enlarged plan view illustrating a portion 'AA' of FIG. 9 according to some embodiments of the inventive concept.
Figure 15B:
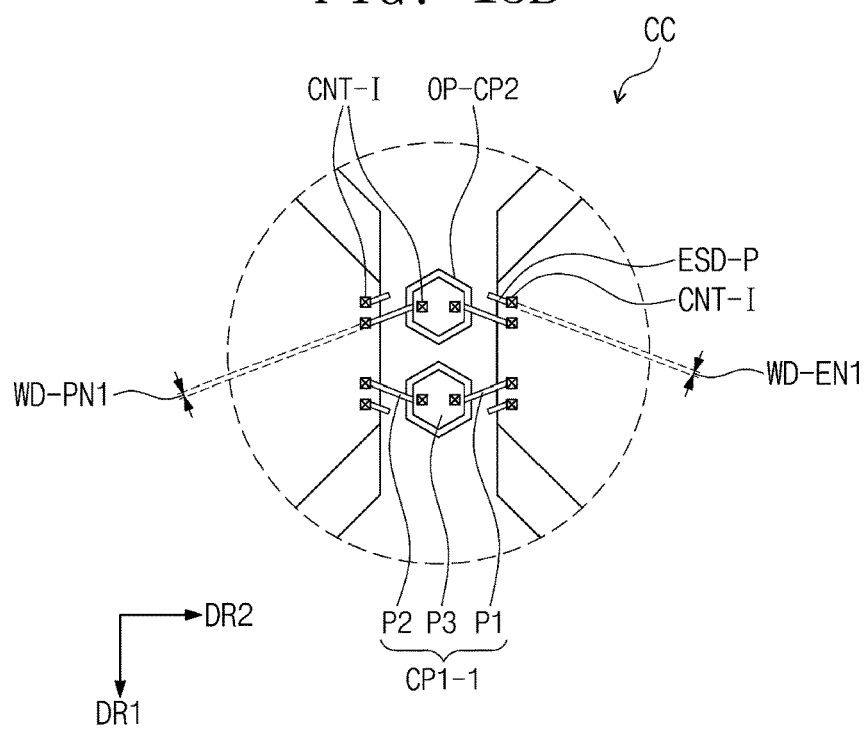
FIG. 15B is an enlarged plan view illustrating a portion 'CC' of FIG. 15A.
Figure 15C:
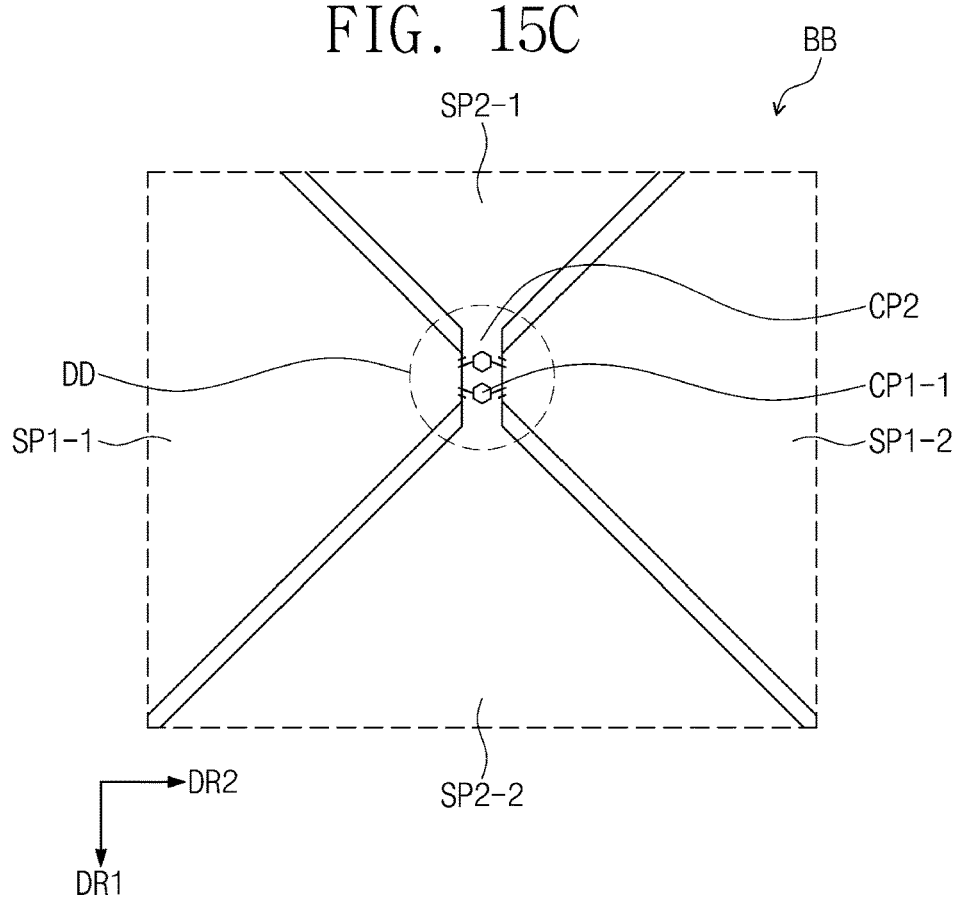
FIG. 15C is an enlarged plan view illustrating a portion 'BB' of FIG. 9 according to some embodiments of the inventive concept.
Figure 15D:
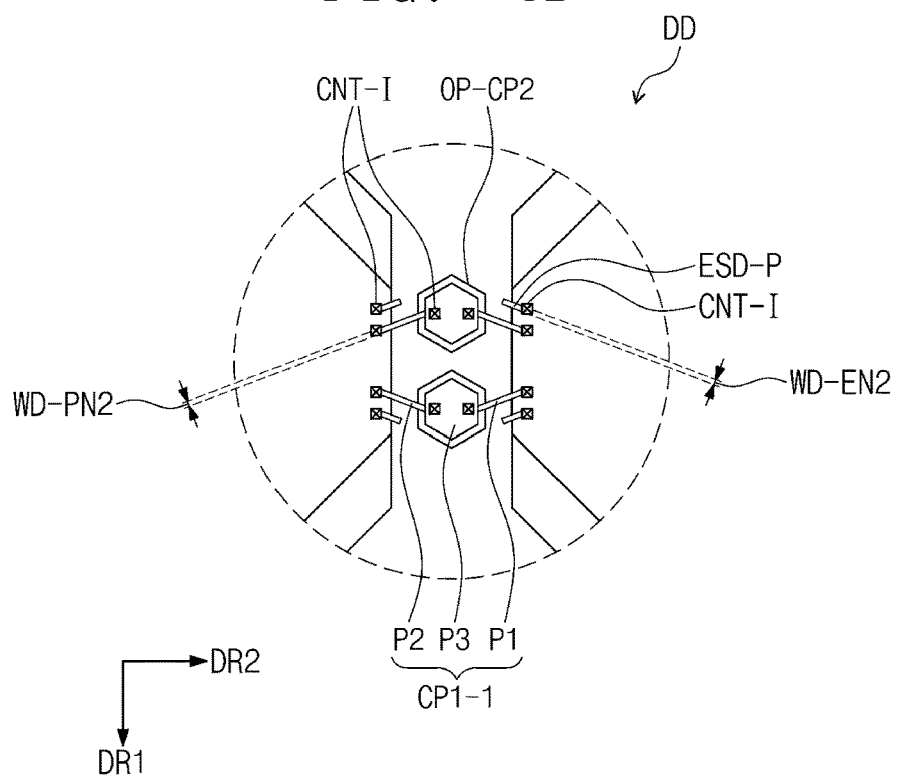
FIG. 15D is an enlarged plan view illustrating a portion 'DD' of FIG. 15C.

FIG. 15A is an enlarged plan view illustrating an alternative embodiment of a portion 'AA' of FIG. 9. FIG. 15B is an enlarged plan view illustrating a portion 'CC' of FIG. 15A. FIG. 15C is an enlarged plan view illustrating an alternative embodiment of a portion 'BB' of FIG. 9. FIG. 15D is an enlarged plan view illustrating a portion 'DD' of FIG. 15C. FIGS. 15A to 15D illustrate examples in which a first connecting portion CP1-1 is provided in the form of a bridge.

The left first sensor portion SP1-1 and the right first sensor portion SP1-2 may be electrically connected to each other by the first connecting portion CP1-1. The first connecting portion CP1-1 may include a plurality of patterns P1, P2, and P3.

A first pattern P1 and a second pattern P2 may be formed from the first conductive layer IS-CL1 (e.g., see FIG. 10A), and a third pattern P3 may be formed from the second conductive layer IS-CL2 (e.g., see FIG. 10B). Each of the first pattern P1 and the second pattern P2 may be provided to electrically connect the third pattern P3 to the first sensor portions SP1 through the first connection contact holes CNT-I.

An opening OP-CP2 may be defined in the second connecting portion CP2.

The third pattern P3 may be provided in the opening OP-CP2. The first pattern P1 and the second pattern P2 may be formed of or include a material having lower resistance than that of the third pattern P3. The third pattern P3 and the first and second sensor portions SP1 and SP2 may be formed by the same process, and thus, they may have the same stacking structure and may include the same material. The third pattern P3 and the first and second sensor portions SP1 and SP2 may be formed of or include a transparent conductive material. The first pattern P1 and the second pattern P2 may be formed of or include a metallic material.

The first and second patterns P1 and P2 may extend in a diagonal direction crossing the first and second directions DR1 and DR2. Human visual characteristics may make objects in the diagonal direction less noticeable or recognizable than in the first and second directions DR1 and DR2, and thus, the first pattern P1 and the second pattern P2 including the metallic material may be minimally visible or not noticeable or recognizable to a user.

In the present embodiment, the opening OP-CP2 has been described to be defined in the second connecting portion CP2, but in some embodiments, the opening OP-CP2 may be defined in the second sensor portion SP2-1 or SP2-2. Here, the third pattern P3 may be provided in the opening defined in the second sensor portion SP2-1 or SP2-2.

An electro-static discharge (ESD) prevention pattern ESD-P may be connected to each of the left first sensor portion SP1-1 and the right first sensor portion SP1-2.

The electrostatic discharge pattern ESD-P may be connected to the first sensor portions SP1-1 and SP1-2 through the first connection contact holes CNT-I.

An end of the electrostatic discharge pattern ESD-P may be overlapped with the second connecting portion CP2. In certain embodiments, an end of the electrostatic discharge pattern ESD-P may be overlapped with the second sensor portion SP2-1 or SP2-2.

A vertex for easily causing an electrostatic discharge phenomenon (e.g., for having a lower threshold for electrostatic discharge) may be formed at the end of the electrostatic discharge pattern ESD-P. In other words, the electrostatic discharge pattern ESD-P may be shaped like a needle, and a sharp portion of the electrostatic discharge pattern ESD-P may be placed to be overlapped with the second connecting portion CP2 or the second sensor portion SP2-1 or SP2-2. In the electrostatic discharge pattern ESD-P, the electrostatic discharge phenomenon may be induced by the vertex, and this may make it possible to prevent the first connecting portion CP1-1 from being cut or damaged.

Referring to FIG. 15B, the first pattern P1 or the second pattern P2 may have a first pattern width WD-PN1. Referring to FIG. 15D, the first pattern P1 or the second pattern P2 may have a second pattern width WD-PN2. In some embodiments, the second pattern width WD-PN2 may be larger than the first pattern width WD-PN1.

Capacitance between the first and second patterns P1 and P2 (e.g., see FIG. 15D) having the second pattern width WD-PN2 and an electrode overlapped therewith may be greater than capacitance between the first and second patterns P1 and P2 (e.g., see FIG. 15B) having the first pattern width WD-PN1 and an electrode overlapped therewith. Thus, in the example of FIG. 15C, if the second pattern width WD-PN2 is larger than the first pattern width WD-PN1, it may be possible to compensate for some or all of the loss in capacitance which is caused by the severed sensor portion (i.e., the upper second sensor portion SP2-1) as compared to the normal portion.

Referring to FIG. 15B, the electrostatic discharge pattern ESD-P may have a first prevention pattern width WD-EN1. Referring to FIG. 15D, the electrostatic discharge pattern ESD-P may have a second prevention pattern width WD-EN2. In some embodiments, the second prevention pattern width WD-EN2 may be larger than the first prevention pattern width WD-EN1.

Capacitance between the electrostatic discharge pattern ESD-P (e.g., see FIG. 15D) having the second prevention pattern width WD-EN2 and an electrode overlapped therewith may be greater than capacitance between the electrostatic discharge pattern ESD-P (e.g., see FIG. 15B) having the first prevention pattern width WD-EN1 and an electrode overlapped therewith. Thus, in the example of FIG. 15C, if the second prevention pattern width WD-EN2 is larger than the first prevention pattern width WD-EN1, it may be possible to compensate for some or all of the the loss in capacitance which is caused by the severed sensor portion (i.e., the upper second sensor portion SP2-1) as compared to the normal portion.

Figure 16:
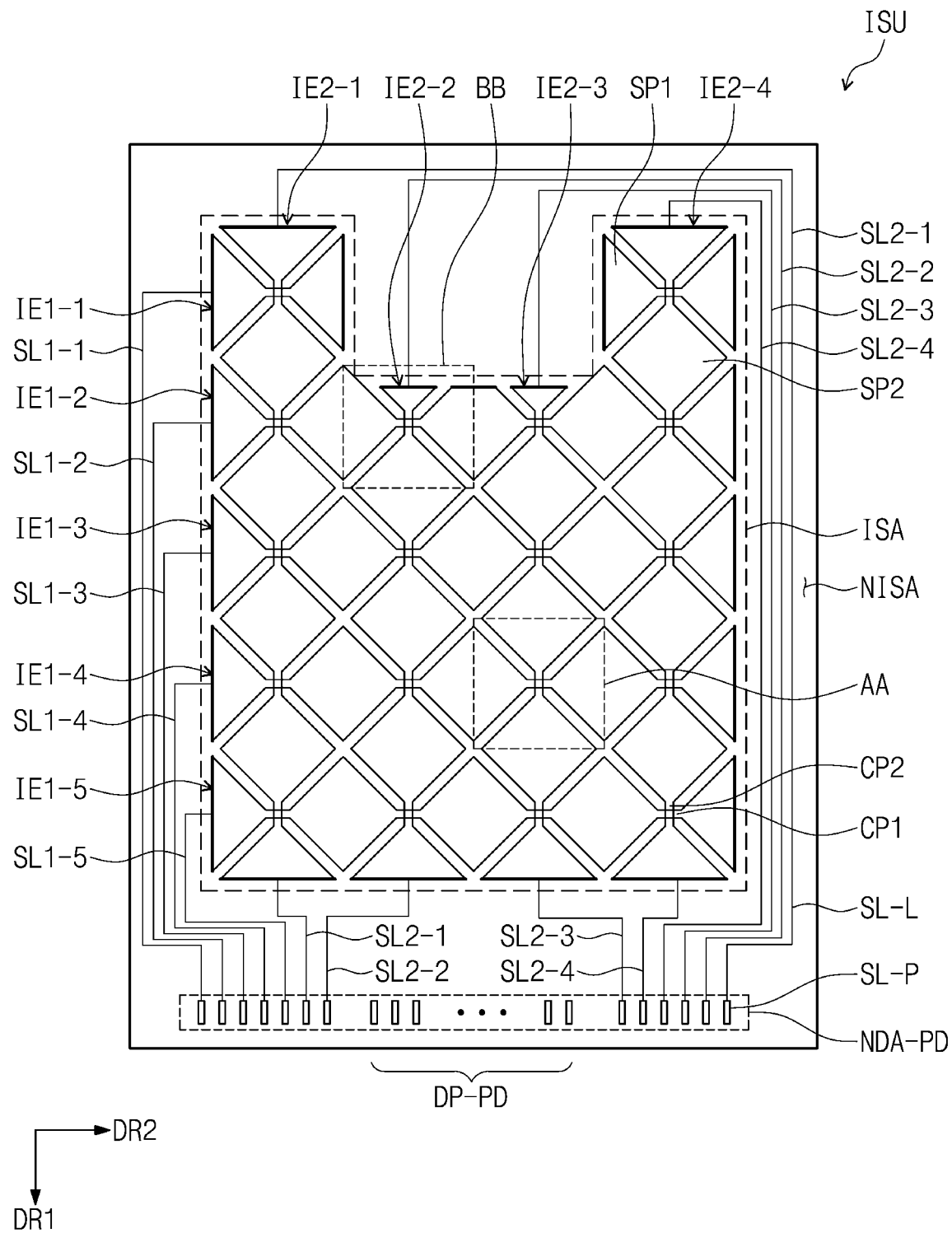
FIG. 16 is a plan view illustrating an input-sensing unit according to some embodiments of the inventive concept.

FIG. 16 is a plan view illustrating an input-sensing unit ISU according to some embodiments of the inventive concept. The input-sensing unit ISU of FIG. 16 may differ from that of FIG. 9 in terms of a position of the second unit region BB. In the example of FIG. 9, the electrodes may be arranged with reference to the second sensing electrodes 1E2-2 and 1E2-3 which are short in the first direction DR1, and thus, the severed sensor portion may be formed at end portions of the long second electrodes 1E2-1 and 1E2-4. By contrast, in the example of FIG. 16, the electrodes may be arranged with reference to the second sensing electrodes 1E2-1 and 1E2-4 which are long in the first direction DR1, and thus, the severed sensor portion may be formed at end portions of the short second electrodes 1E2-2 and 1E2-3.

Except for the above features, the first and second unit regions AA and BB of FIG. 16 may be configured to be substantially the same as those of the previous embodiments described with reference to FIGS. 9 to 15D, and may function or be configured as described above with reference to those embodiments.

Figure 17:
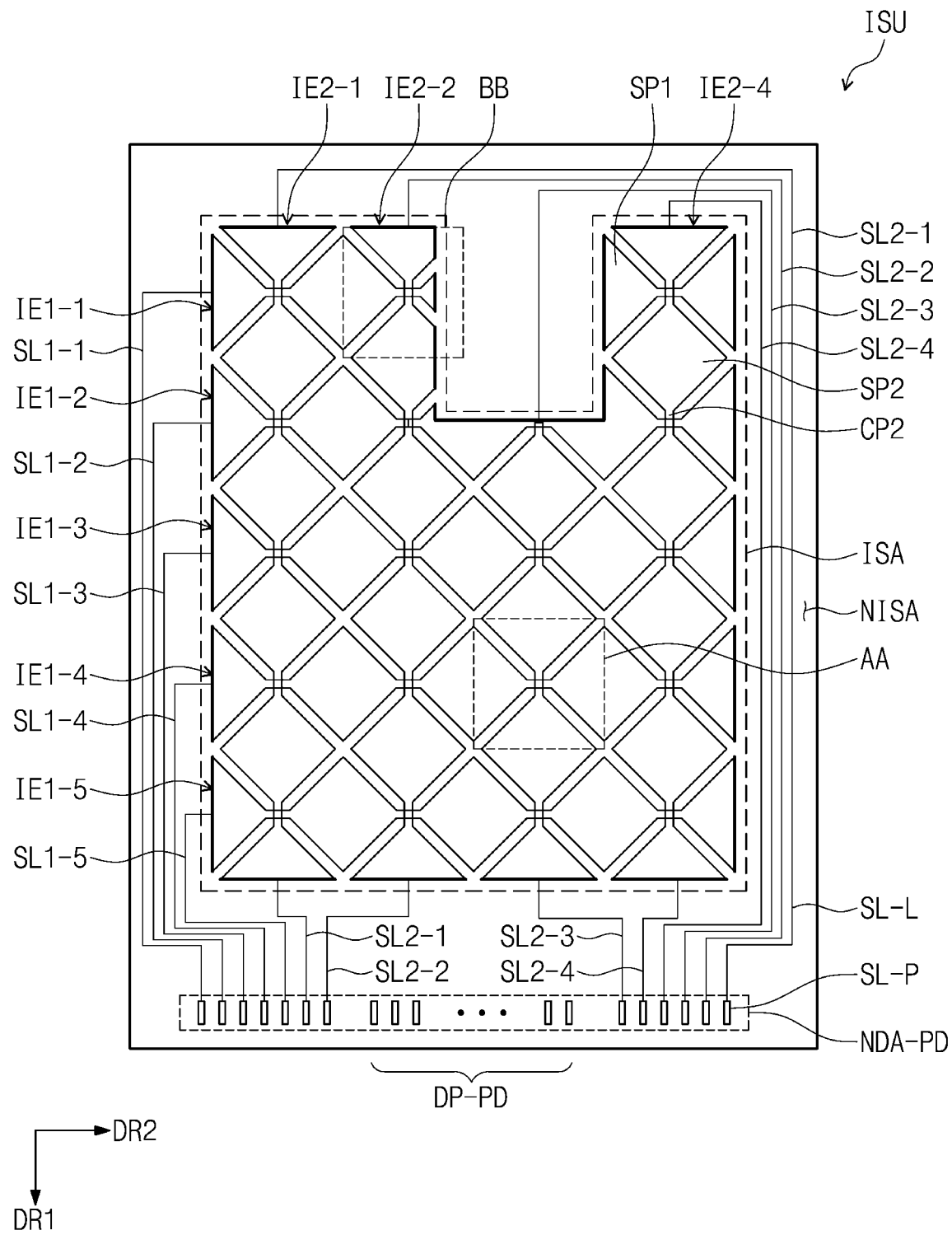
FIG. 17 is a plan view illustrating an input-sensing unit according to some embodiments of the inventive concept.

FIG. 17 is a plan view illustrating an input-sensing unit ISU according to some embodiments of the inventive concept. In the above-described embodiments, the severed sensor portion is formed at an upper portion of the second unit region BB (e.g., the severed sensor portion or portions were considered severed based on a missing region at the upper portion of the unit region BB), but as shown in FIG. 17, the severed sensor portion may be formed at a right portion of the second unit region BB (e.g., the severed sensor portion or portions may be considered severed based on a missing region at the right portion of the unit region BB). However, the inventive concept is not limited thereto, and in some embodiments, the severed sensor portion may be formed at a left portion of the second unit region BB.

Figure 18A:
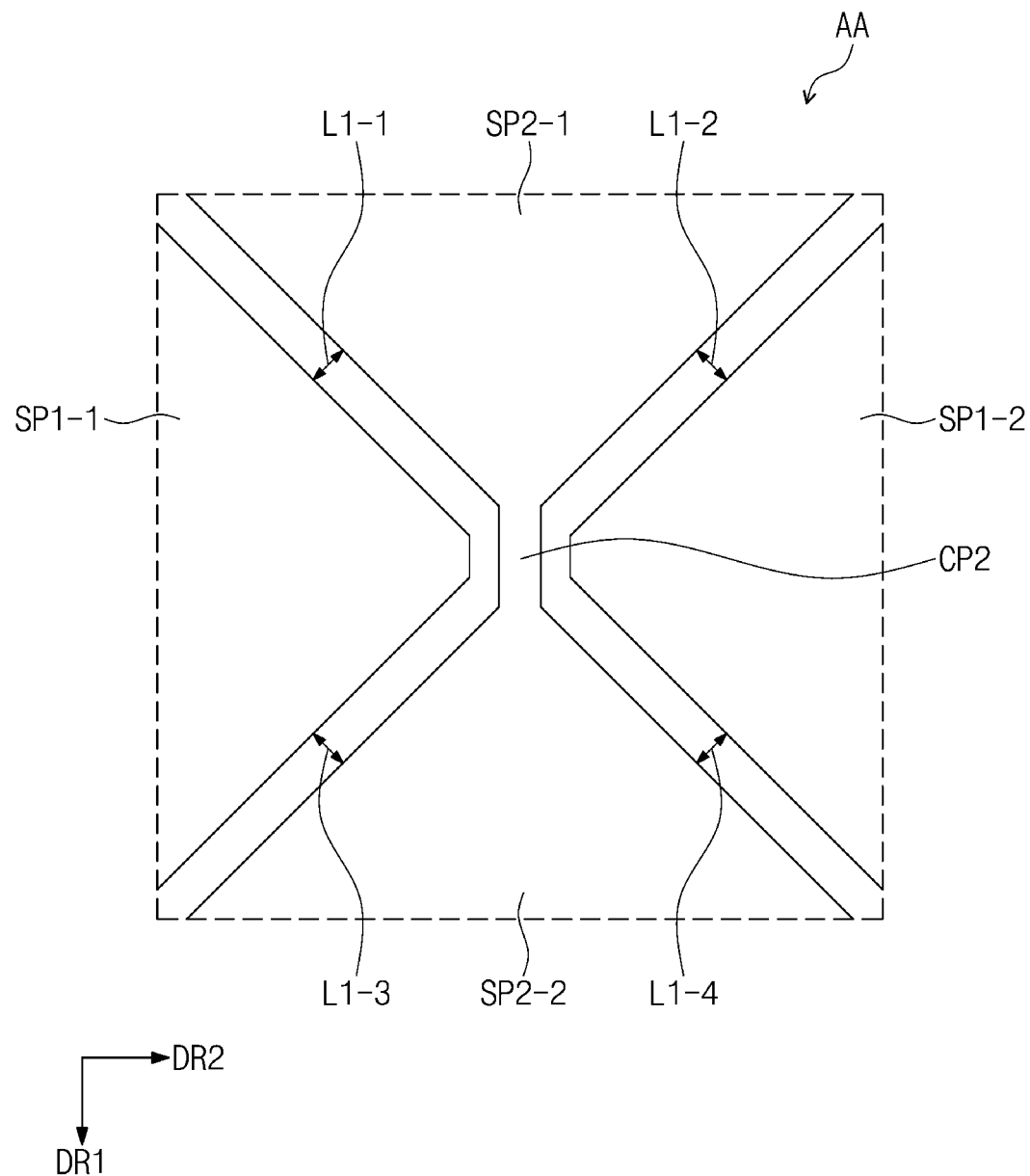
FIG. 18A is an enlarged plan view illustrating a portion 'AA' of FIG. 17 according to some embodiments of the inventive concept.
Figure 18B:
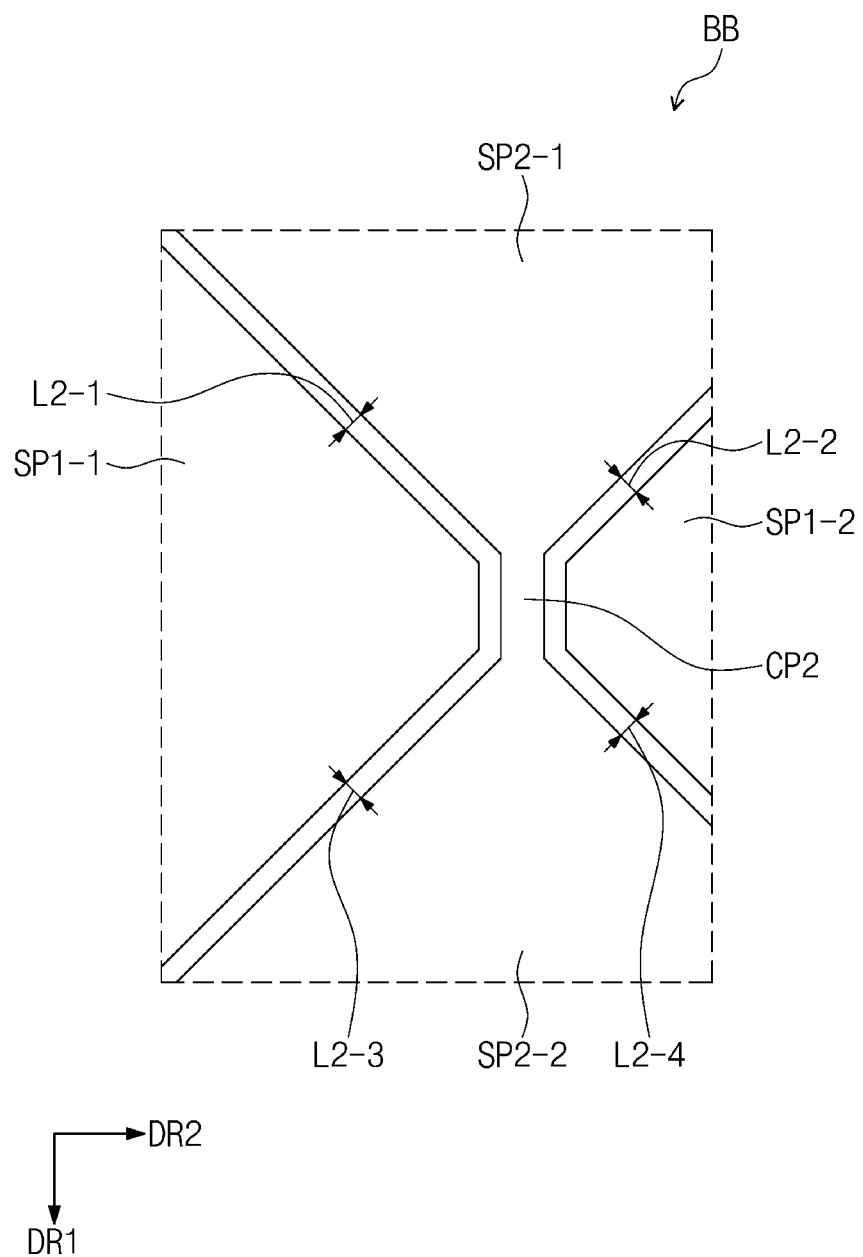
FIG. 18B is an enlarged plan view illustrating a portion 'BB' of FIG. 17 according to some embodiments of the inventive concept.

FIG. 18A is an enlarged plan view illustrating a portion 'AA' of FIG. 17. FIG. 18B is an enlarged plan view illustrating a portion 'BB' of FIG. 17. For convenience in illustration, the first connecting portion CP1 is not illustrated in FIGS. 18A and 18B.

The portion 'AA' shown in FIG. 18A may be defined as a first unit region AA, which is a part of the input-sensing unit ISU and is used to sense an external input. In the first unit region AA, the first sensor portions SP1-1 and SP1-2 and the second sensor portions SP2-1 and SP2-2 may constitute capacitors having first capacitance. The remaining portion of FIG. 18A may be substantially the same as that described with reference to FIG. 11A, and a detailed description thereof will be omitted.

Referring to FIG. 18B, in the second unit region BB, the first sensor portions SP1-1 and SP1-2 and the second sensor portions SP2-1 and SP2-2 may constitute capacitors having second capacitance.

In FIG. 18B, distances between the first sensor portions SP1-1 and SP1-2 and the second sensor portions SP2-1 and SP2-2 may be defined as the second distances L2-1, L2-2, L2-3, and L2-4, where L2-1 is the distance between SP1-1 and SP2-1, L2-2 is the distance between SP2-1 and SP 1-2, L2-3 is the distance between SP1-1 and SP2-2, and L2-4 is the distance between SP2-2 and SP1-2.

Each of the second sensor portions SP2-1 and SP2-2 and the right first sensor portion SP1-2 shown in FIG. 18B may have a partially cut or severed shape (e.g., a shaped with a reduced area), compared with a corresponding one of the first sensor portions SP1-1 and SP1-2 and the second sensor portion SP2-1 shown in FIG. 18A. That is, in FIG. 18B, the second sensor portions SP2-1 and SP2-2 and the right first sensor portion SP1-2 may be severed sensor portions.

An area of each of the second sensor portions SP2-1 and SP2-2 and the right first sensor portion SP1-2 shown in FIG. 18B may be smaller than an area of a corresponding one in FIG. 18A.

Thus, the second capacitance in FIG. 18B may be less than the first capacitance in FIG. 18A if the second distances L2-1, L2-2, L2-3, and L2-4 are the same as the first distances L1-1, L1-2, L1-3, and L1-4, and this loss in capacitance may be compensated by adjusting distances between the first sensor portions SP1-1 and SP1-2 and the second sensor portions SP2-1 and SP2-2 in FIG. 18B. In some embodiments, the second distances L2-1, L2-2, L2-3, and L2-4 may be smaller than the first distances L1-1, L1-2, L1-3, and L1-4. By reducing the second distances L2-1, L2-2, L2-3, and L2-4, it may be possible to compensate for some or all of the loss in capacitance which may occur when the severed sensor portions are formed to have an area smaller than that of a normal sensor portion.

The second distances L2-1, L2-2, L2-3, and L2-4 may have substantially the same value, but the inventive concept is not limited thereto. In some embodiments, to adjust the second capacitance, at least one of the second distances L2-1, L2-2, L2-3, and L2-4 may be different from the others. For example, since the right first sensor portion SP1-2 has an area smaller than that of the left first sensor portion SP1-1, the second distances L2-2 and L2-4 between the right first sensor portion SP1-2 and the second sensor portions SP2-1 and SP2-2 may be smaller than distances L2-1 and L2-3 between the left first sensor portion SP1-1 and the second sensor portions SP2-1 and SP2-2.

Each or both of the first and second unit regions AA and BB of FIG. 17 may be configured to include the optical dummy electrode DMP-L, as shown in FIGS. 12A and 12B.

Figure 19:
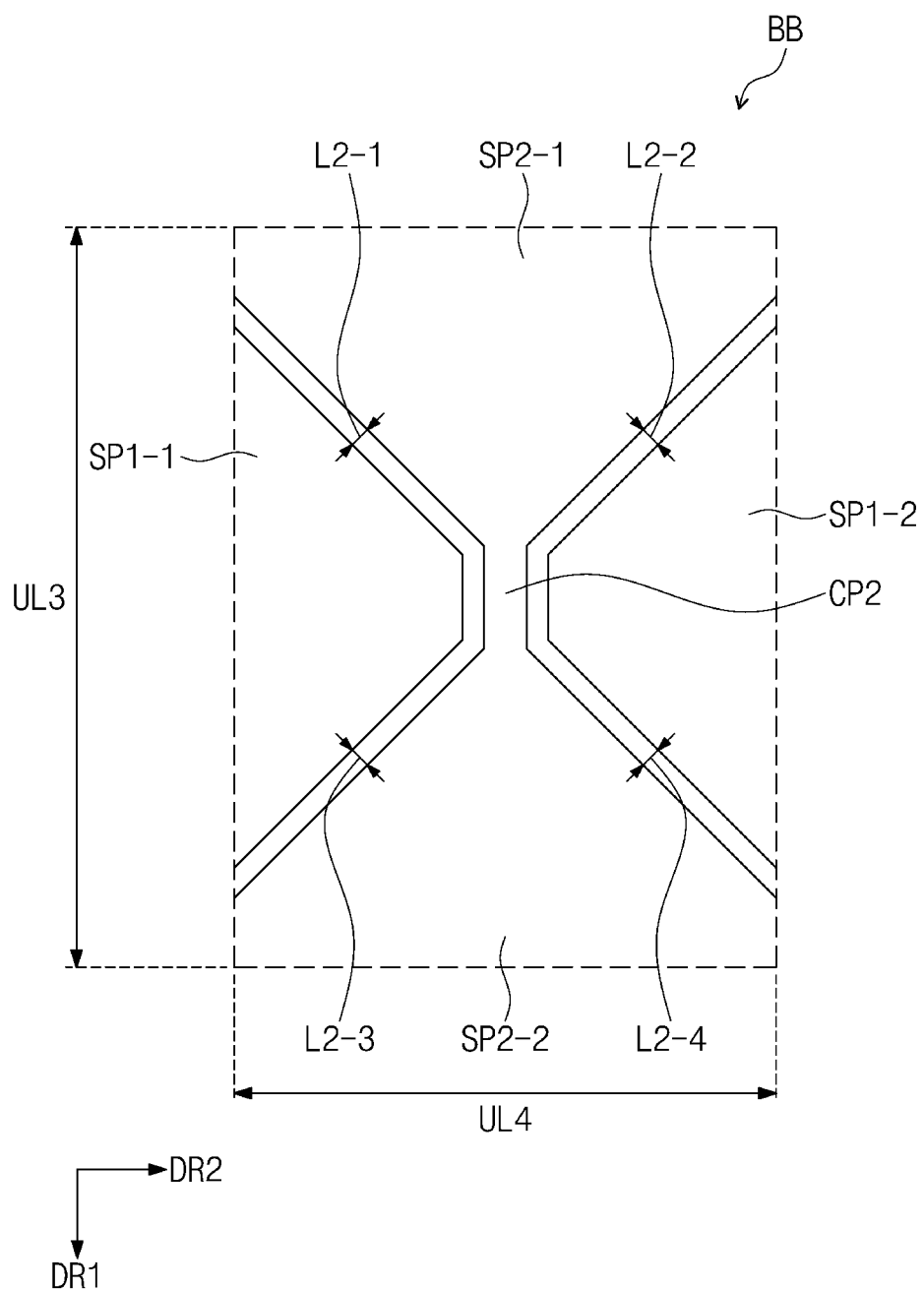
FIG. 19 is an enlarged plan view illustrating a portion 'BB' of FIG. 17 according to some embodiments of the inventive concept.

FIG. 19 is an enlarged plan view illustrating an alternative embodiment of the portion 'BB' of FIG. 17. For convenience in illustration, the first connecting portion CP1 is not illustrated in FIG. 19.

Referring to FIG. 18A, the first unit region AA may have the first unit length UL1 in the first direction DR1 and the second unit length UL2 in the second direction DR2.

Referring to FIG. 19, the second unit region BB may have the third unit length
UL3 in the first direction DR1 and the fourth unit length
UL4 in the second direction DR2.

Comparing FIG. 19 with FIG. 18A, the first unit length UL1 may be substantially equal to the third unit length UL3. However, the inventive concept is not limited thereto. In some embodiments, the first unit length UL1 may be different from the third unit length UL3.

Comparing FIG. 19 with FIG. 18A, the second unit length UL2 may be different from the fourth unit length UL4. For example, the fourth unit length UL4 may be shorter than the second unit length UL2.

Comparing FIG. 19 with FIG. 18B, the first sensor portions SP1-1 and SP1-2 and the second sensor portions SP2-1 and SP2-2 of FIG. 19 may have a uniform area, compared with the first sensor portions SP1-1 and SP1-2 and the second sensor portions SP2-1 and SP2-2 of FIG. 18B. For example, in the example of FIG. 19, the upper second sensor portion SP2-1 may have substantially the same area as that of the lower second sensor portion SP2-2, and the left first sensor portion SP1-1 may have substantially the same area as that of the right first sensor portion SP1-2. In the case where all of the sensor portions provided at left, right, upper, and lower sides have substantially the same area, the capacitors which are formed by the sensor portions in the second unit region BB may have substantially the same capacitance. Accordingly, even if the fourth unit length UL4 of the second unit region BB is shorter than the second unit length UL2 as shown in FIG. 19, it may be possible to obtain touch sensitivity in the second unit region BB similar to that of the first unit region AA having the second unit length UL2 as shown in FIG. 18A.

Although, in the example of FIG. 19, the sensor portions SP1-1, SP1-2, SP2-1, and SP2-2 in the second unit region BB are adjusted to have substantially the same area, capacitances between the sensor portions SP1-1, SP1-2, SP2-1, and SP2-2 in the second unit region BB may be smaller than capacitances between the sensor portions SP1-1, SP1-2, SP2-1, and SP2-2 in the first unit region AA shown in FIG. 18A. In this case, the second distances L2-1, L2-2, L2-3, and L2-4 between the sensor portions SP1-1, SP1-2, SP2-1, and SP2-2 in the second unit region BB may be adjusted, for example by reducing the second distances L2-1, L2-2, L2-3, and L2-4 to reduce or eliminate the difference in capacitance between the second capacitance of FIG. 19 and the first capacitance of FIG. 18A.

Figure 20:
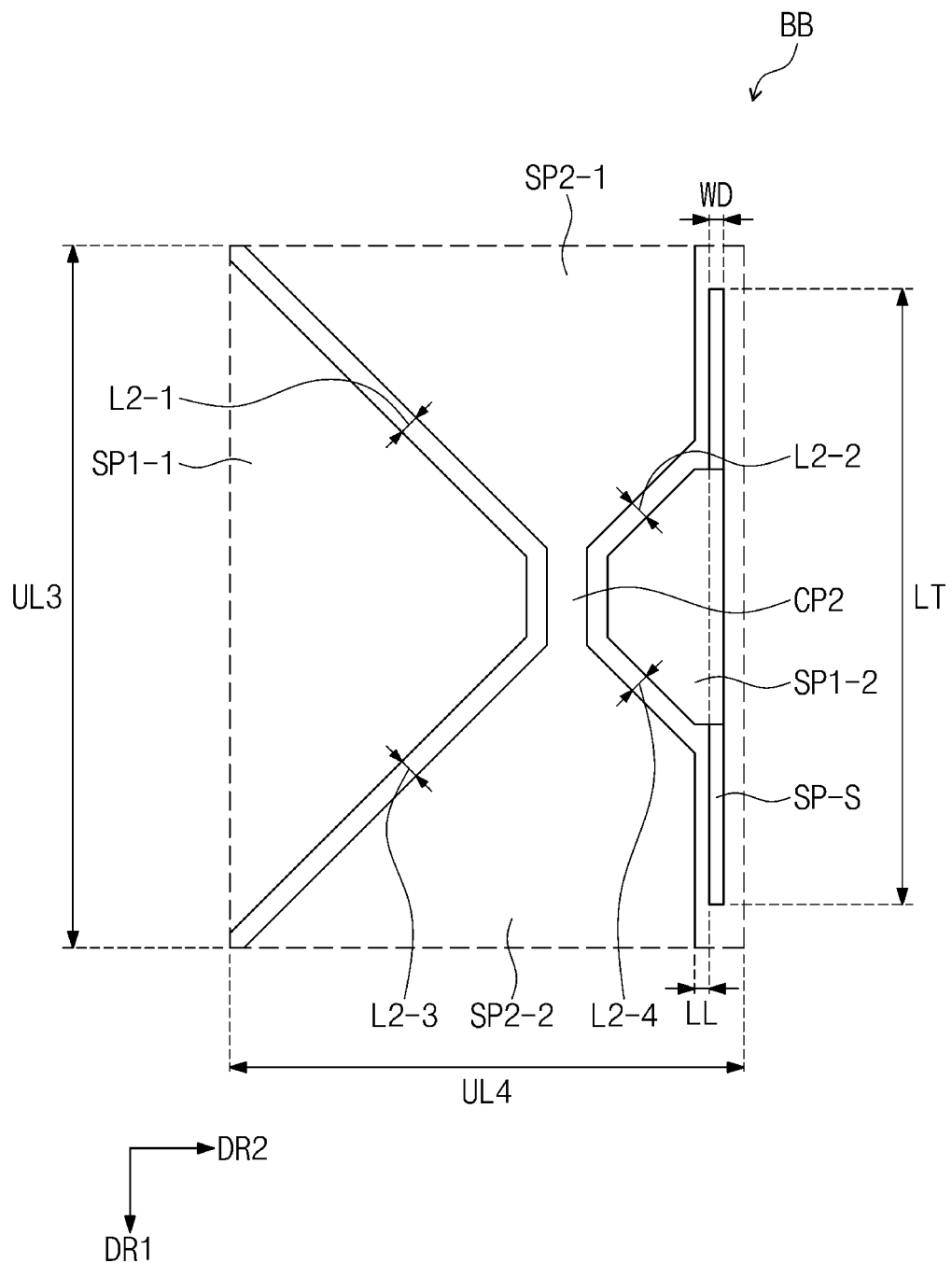
FIG. 20 is an enlarged plan view illustrating a portion 'BB' of FIG. 17 according to some embodiments of the inventive concept.

FIG. 20 is an enlarged plan view illustrating an alternative embodiment of a portion 'BB' of FIG. 17.

In some embodiments, the second unit region BB may further include the auxiliary electrode SP-S. The auxiliary electrode SP-S may be electrically connected to the right first sensor portion SP1-2. For example, the right first sensor portion SP1-2 may be overlapped with and/or in contact with the auxiliary electrode SP-S.

The auxiliary electrode SP-S may be spaced apart from the second sensor portions SP2-1 and SP2-2 by a distance LL. Accordingly, the auxiliary electrode SP-S, in conjunction with the second sensor portions SP2-1 and SP2-2, may constitute a capacitor having a specific capacitance. Thus, the auxiliary electrode SP-S may compensate for or reduce the loss in capacitance which may occur when the area of the right first sensor portion SP1-2 is smaller than that of the left first sensor portion SP1-1 (e.g., the capacitance of the capacitors formed between the second sensor portions SP2-1 and SP2-2 and the right first sensor portion SP1-2 may be the same as the capacitance of the capacitors formed between the second sensor portions SP2-1 and SP2-2 and the left first sensor portion SP1-1, even though the area of the right first sensor portion SP1-2 may be smaller than the area of the left first sensor portion SP1-1).

Except for the above features, the auxiliary electrode SP-S of FIG. 20 may be substantially the same as that described with reference to FIG. 14.

In some embodiments, the first and second unit regions AA and BB of FIG. 17 may include the first connecting portion CP1-1 and the electrostatic discharge pattern ESD-P described with reference to FIGS. 15A to 15D.

Figure 21:
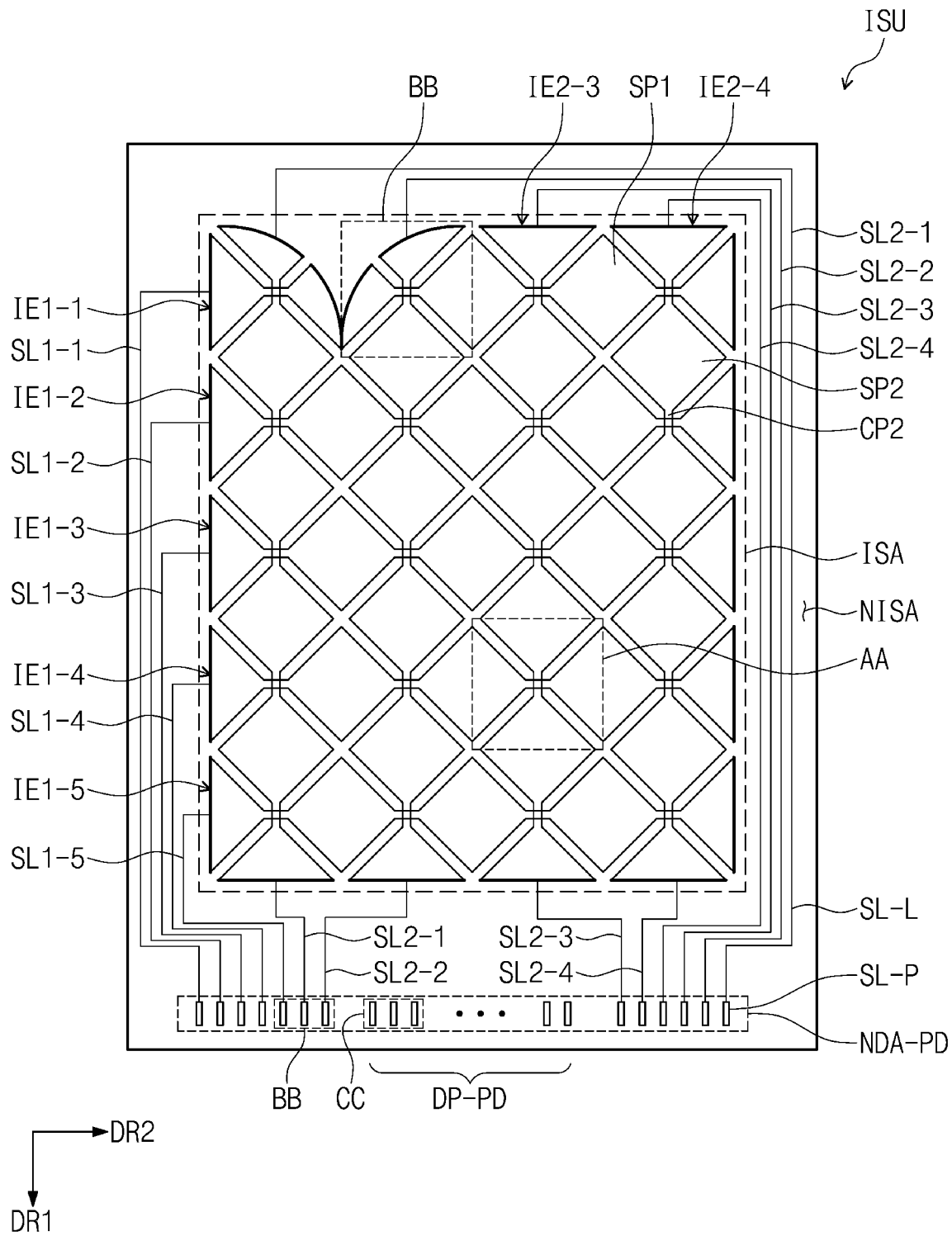
FIG. 21 is a plan view illustrating an input-sensing unit according to some embodiments of the inventive concept.

FIG. 21 is a plan view illustrating an input-sensing unit ISU according to some embodiments of the inventive concept. In some embodiments, the second unit region BB may include a severed sensor portion having a curved shape.

Figure 22A:
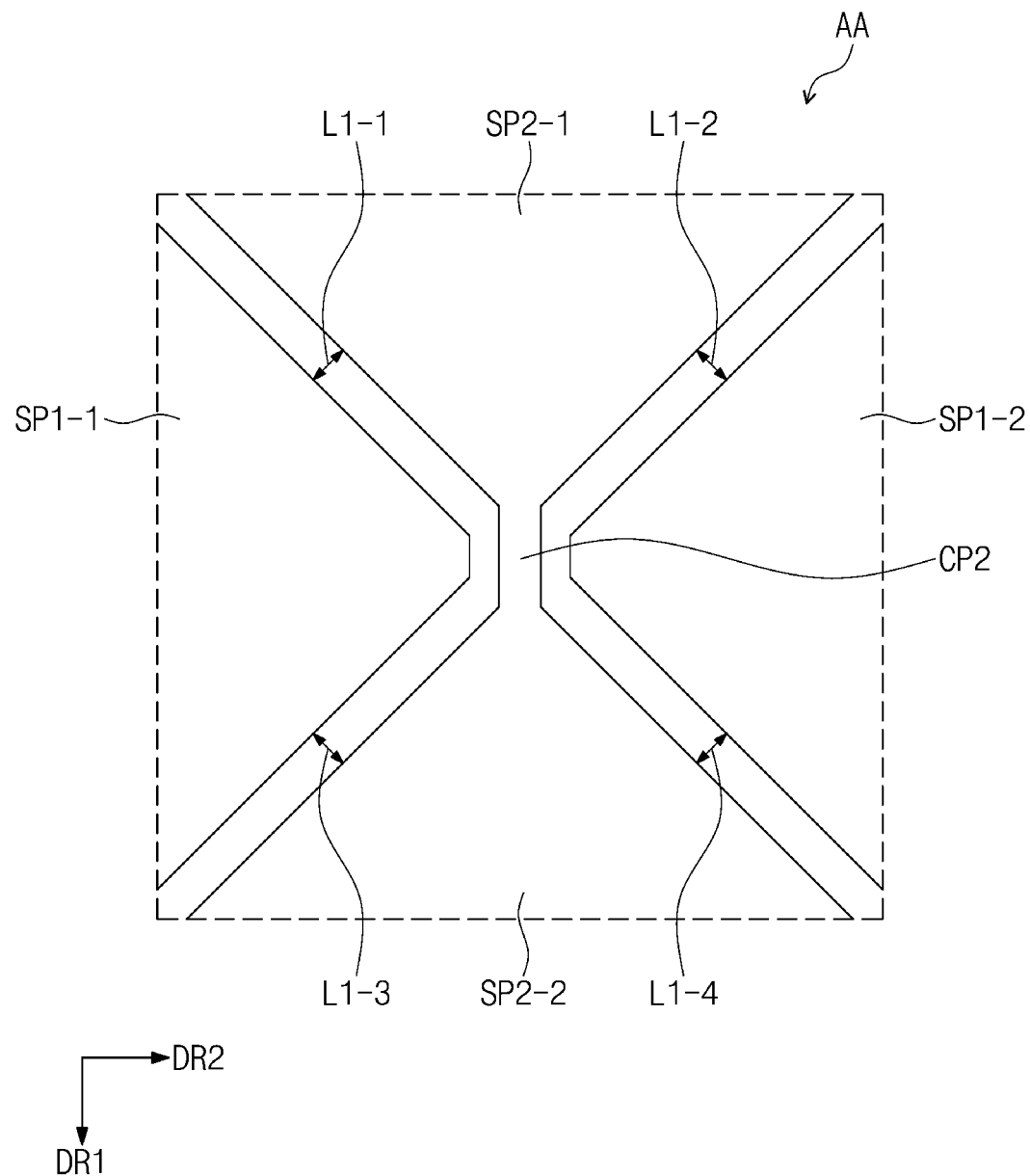
FIG. 22A is an enlarged plan view illustrating a portion 'AA' of FIG. 21 according to some embodiments of the inventive concept.
Figure 22B:
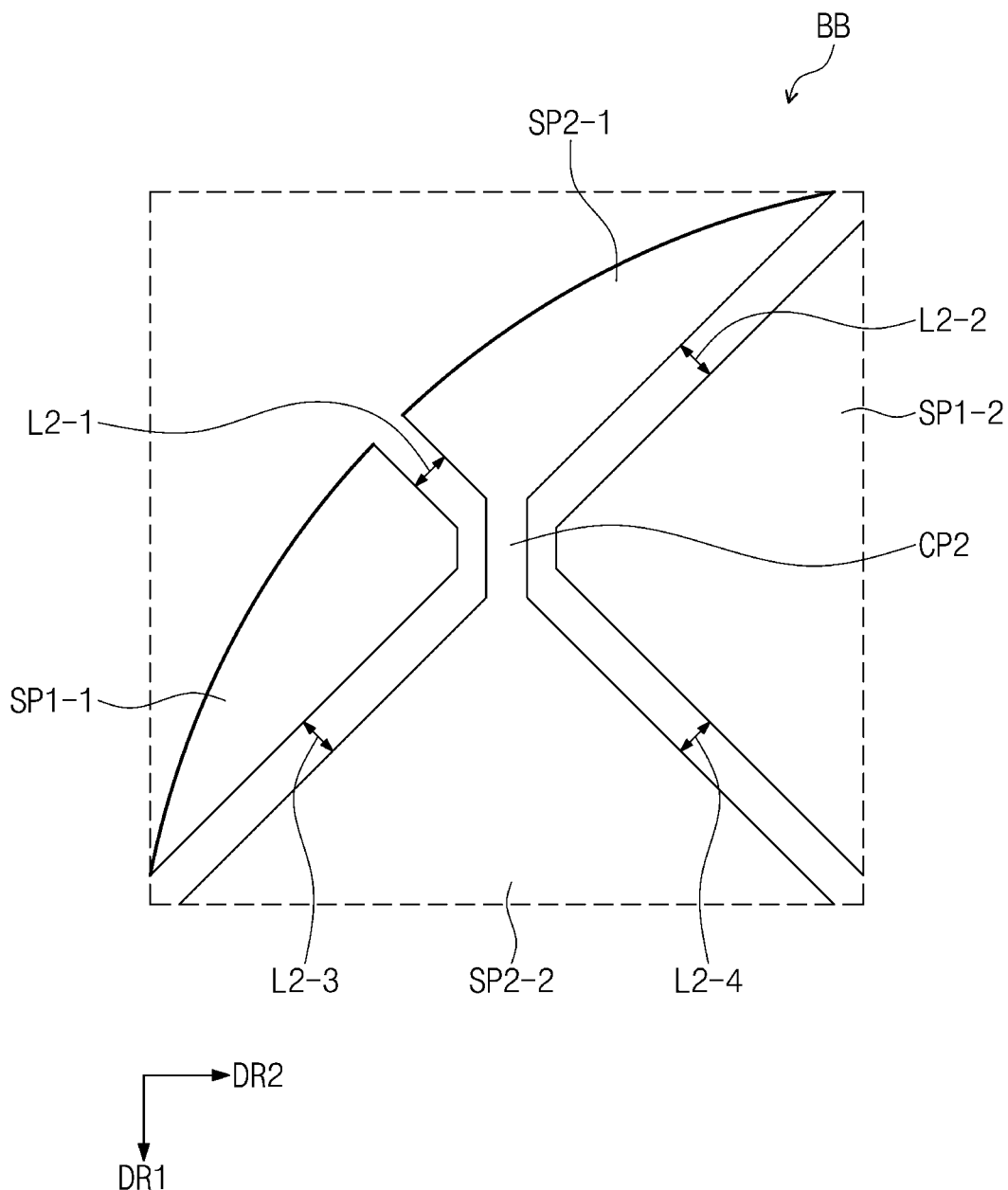
FIG. 22B is an enlarged plan view illustrating a portion 'BB' of FIG. 21 according to some embodiments of the inventive concept.

FIG. 22A is an enlarged plan view illustrating a portion 'AA' of FIG. 21. FIG. 22B is an enlarged plan view illustrating a portion 'BB' of FIG. 21. For convenience in illustration, the first connecting portion CP1 is not illustrated in FIGS. 22A and 22B.

The portion 'AA' shown in FIG. 22A may be defined as a first unit region AA, which is a part of the input-sensing unit ISU and is used to sense an external input. In the first unit region AA, the first sensor portions SP1-1 and SP1-2 and the second sensor portions SP2-1 and SP2-2 may constitute capacitors having a first capacitance. Except for the above features, the structure of FIG. 24A may be substantially the same as that described with reference to FIG. 11A.

Referring to FIG. 22B, in the second unit region BB, the first sensor portions

SP1-1 and SP1-2 and the second sensor portions SP2-1 and SP2-2 may constitute capacitors having a second capacitance.

In FIG. 22B, distances between the first sensor portions SP1-1 and SP1-2 and the second sensor portions SP2-1 and SP2-2 may be defined as the second distances L2-1, L2-2, L2-3, and L2-4, where L2-1 is the distance between SP1-1 and SP2-1, L2-2 is the distance between SP2-1 and SP 1-2, L2-3 is the distance between SP1-1 and SP2-2, and L2-4 is the distance between SP2-2 and SP1-2.

Each of the left first sensor portion SP1-1 and the upper second sensor portion SP2-1 shown in FIG. 22B may have a partially cut or severed shape, compared with a corresponding one of the left first sensor portion SP1-1 and the upper second sensor portion SP2-1 shown in FIG. 22A. That is, in FIG. 22B, the left first sensor portion SP1-1 and the upper second sensor portion SP2-1 may be severed sensor portions.

An area of each of the left first sensor portion SP1-1 and the upper second sensor portion SP2-1 shown in FIG. 22B may be smaller than an area of a corresponding one in FIG. 22A.

Thus, the second capacitance in FIG. 22B may be less than the first capacitance in FIG. 22A if the second distances L2-1, L2-2, L2-3, and L2-4 are the same as the first distances L1-1, L1-2, L1-3, and L1-4, and this loss in capacitance may be compensated by adjusting distances between the first sensor portions SP1-1 and SP1-2 and the second sensor portions SP2-1 and SP2-2 in FIG. 22B. In some embodiments, the second distances L2-1, L2-2, L2-3, and L2-4 may be smaller than the first distances L1-1, L1-2, L1-3, and L1-4. By reducing the second distances L2-1, L2-2, L2-3, and L2-4, it may be possible to compensate for some or all of the loss in capacitance which may occur when the severed sensor portions are formed to have an area smaller than that of a normal sensor portion.

The second distances L2-1, L2-2, L2-3, and L2-4 may have substantially the same value, but the inventive concept is not limited thereto. In some embodiments, to adjust the second capacitance, at least one of the second distances L2-1, L2-2, L2-3, and L2-4 may be different from the others. For example, since the left first sensor portion SP1-1 and the upper second sensor portion SP2-1 have areas smaller than those of the right first sensor portion SP1-2 and the lower second sensor portion SP2-2, the second distances L2-1, L2-2, and L2-3 between the left first and upper second sensor portions SP1-1 and SP2-1 and the neighboring sensor portions may be smaller than the distance L2-4 between the right first sensor portion SP1-2 and the lower second sensor portion SP2-2.

In some embodiments, each or both of the first and second unit regions AA and BB of FIG. 21 may be configured to include the optical dummy electrode DMP-L, as shown in FIGS. 12A and 12B.

Figure 23:
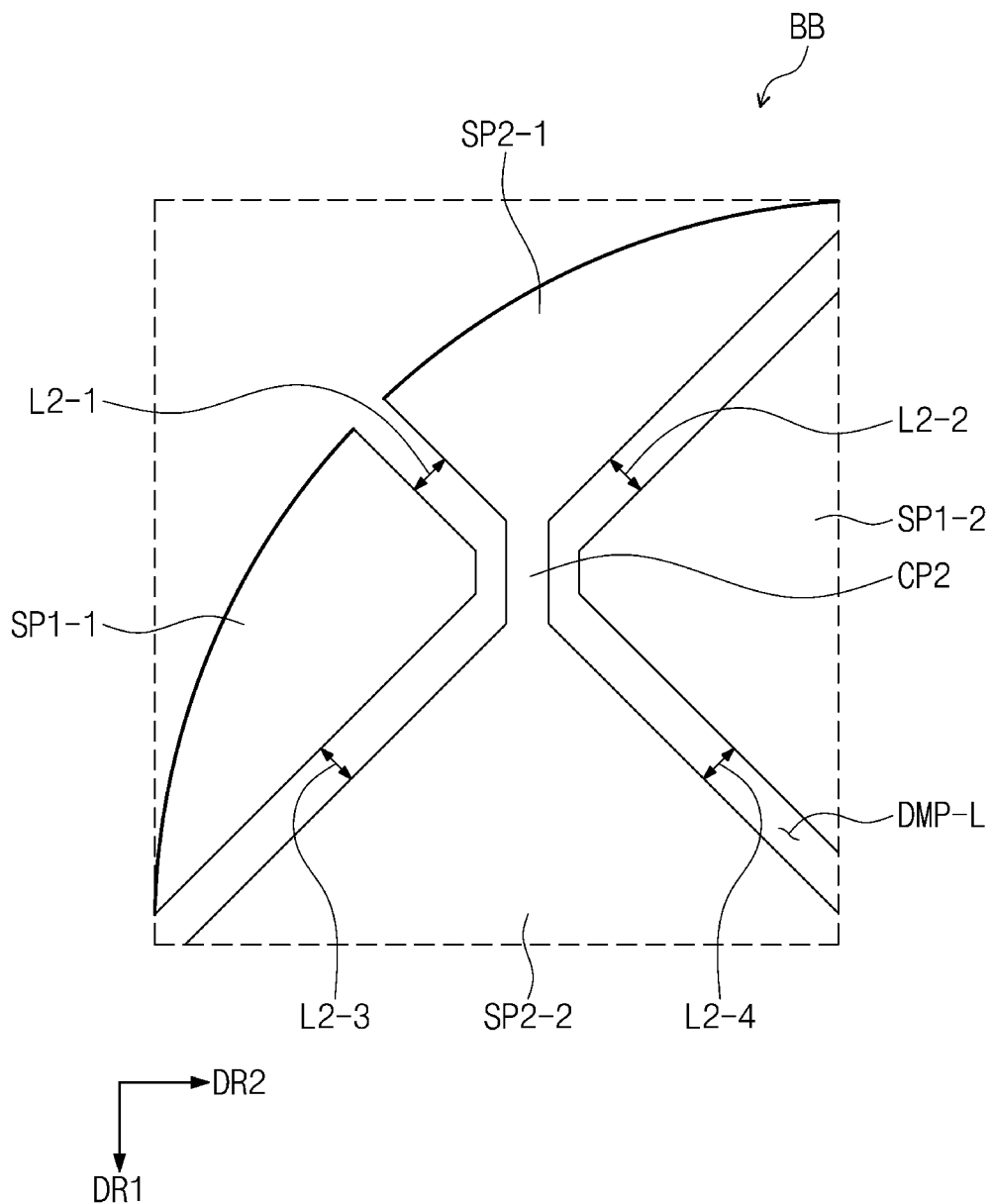
FIG. 23 is an enlarged plan view illustrating a portion 'BB' of FIG. 21 according to some embodiments of the inventive concept.

FIG. 23 is an enlarged plan view illustrating an alternative embodiment of the portion 'BB' of FIG. 21. For convenience in illustration, the first connecting portion CP1 is not illustrated in FIG. 23.

Comparing FIG. 23 with FIG. 22A, a total area of the sensor portions SP1-1, SP1-2, SP2-1, and SP2-2 provided in the second unit region BB may be smaller than a total area of the sensor portions SP1-1, SP1-2, SP2-1, and SP2-2 provided in the first unit region AA.

Comparing FIG. 23 with FIG. 22B, the first sensor portions SP1-1 and SP1-2 and the second sensor portions SP2-1 and SP2-2 of FIG. 23 may have a uniform area, compared with the first sensor portions SP1-1 and SP1-2 and the second sensor portions SP2-1 and SP2-2 of FIG. 22B. For example, in the example of FIG. 23, the upper second sensor portion SP2-1 may have substantially the same area as that of the lower second sensor portion SP2-2, and the left first sensor portion SP1-1 may have substantially the same area as that of the right first sensor portion SP1-2. In the case where all of the sensor portions provided at left, right, upper, and lower sides have substantially the same area, the capacitors which are formed by the sensor portions in the second unit region BB may have substantially the same capacitance. Thus, although the total area of the sensor portions SP1-1, SP1-2, SP2-1, and SP2-2 provided in the second unit region BB is smaller than the total area of the sensor portions SP1-1, SP1-2, SP2-1, and SP2-2 provided in the first unit region AA, the second unit region BB may provide touch sensitivity similar to that of the first unit region AA.

Although, in the example of FIG. 23, the sensor portions SP1-1, SP1-2, SP2-1, and SP2-2 in the second unit region BB are adjusted to have substantially the same area, capacitances between the sensor portions SP1-1, SP1-2, SP2-1, and SP2-2 in the second unit region BB may be smaller than capacitances between the sensor portions SP1-1, SP1-2, SP2-1, and SP2-2 in the first unit region AA shown in FIG. 22A. In this case, the second distances L2-1, L2-2, L2-3, and L2-4 between the sensor portions SP1-1, SP1-2, SP2-1, and SP2-2 in the second unit region BB may be adjusted, for example by reducing the second distances L2-1, L2-2, L2-3, and L2-4 to reduce or eliminate the difference in capacitance between the second capacitance of FIG. 23 and the first capacitance of FIG. 22A.

Figure 24:
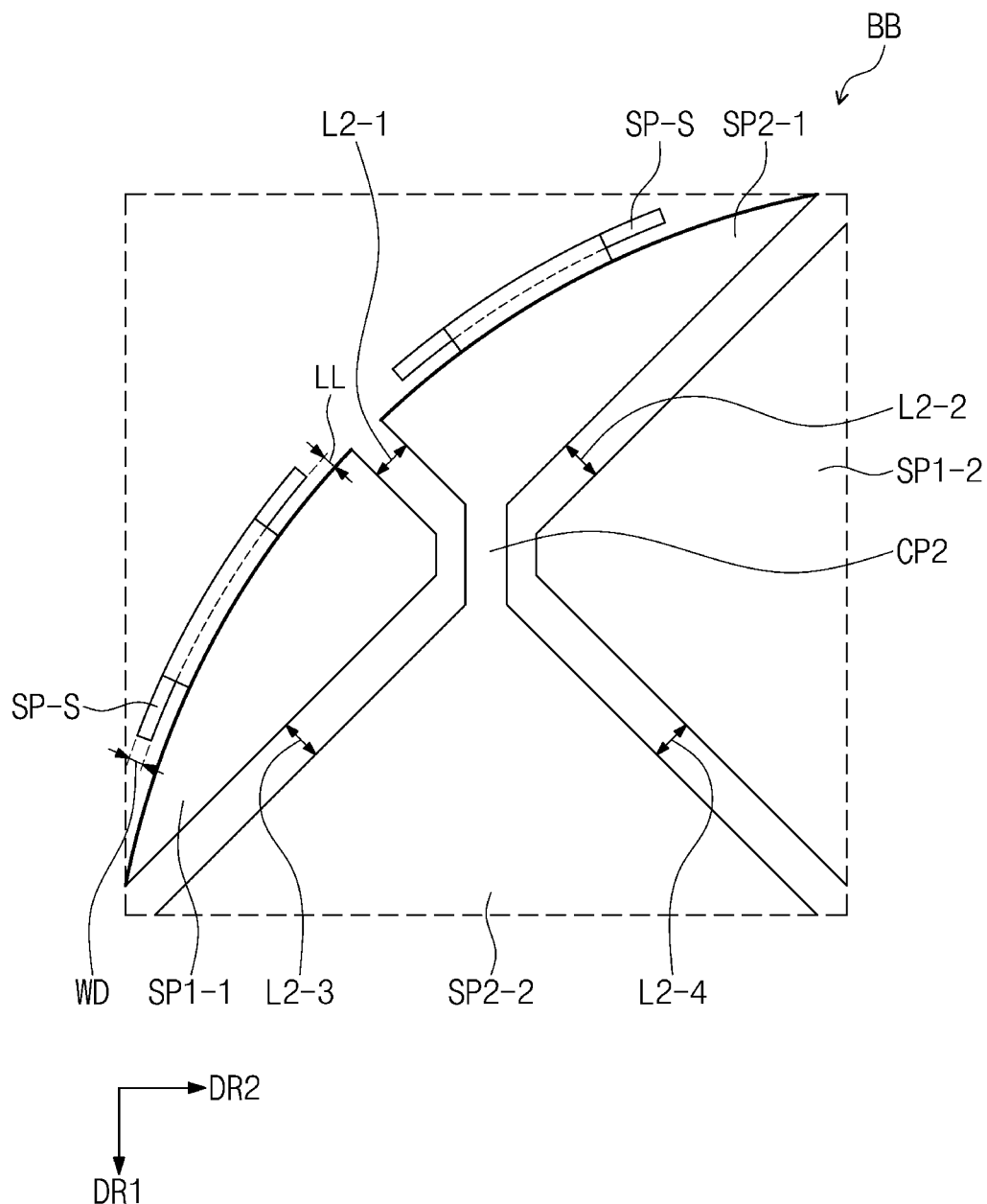
FIG. 24 is an enlarged plan view illustrating a portion 'BB' of FIG. 21 according to some embodiments of the inventive concept.

FIG. 24 is an enlarged plan view illustrating an alternative embodiment of a portion 'BB' of FIG. 21.

In some embodiments, the second unit region BB may further include the auxiliary electrodes SP-S. The auxiliary electrodes SP-S may be electrically connected to the left first sensor portion SP1-1 and/or the upper second sensor portion SP2-1, respectively. For example, each of the left first sensor portion SP1-1 and the upper second sensor portion SP2-1 may be overlapped with and/or in contact with a corresponding one of the auxiliary electrodes SP-S.

The auxiliary electrodes SP-S may be spaced apart from the left first sensor portion SP1-1 and the upper second sensor portion SP2-1 by a distance LL. Accordingly, the auxiliary electrodes SP-S, in conjunction with the left first sensor portion SP1-1 and the upper second sensor portion SP2-1, may constitute capacitors having specific capacitance. Thus, the auxiliary electrode SP-S may compensate for or reduce the loss in capacitance which may occur when areas of the left first sensor portion SP1-1 and the upper second sensor portion SP2-1 are smaller than those of the right first sensor portion SP1-2 and the lower second sensor portion SP2-2.

Except for the above features, the auxiliary electrodes SP-S of FIG. 24 may be substantially the same as that described with reference to FIG. 14.

In some embodiments, each or both of the first and second unit regions AA and BB of FIG. 21 may be configured to include the first connecting portion CP1-1 and the electrostatic discharge pattern ESD-P described with reference to FIGS. 15A to 15D.

Figure 25:
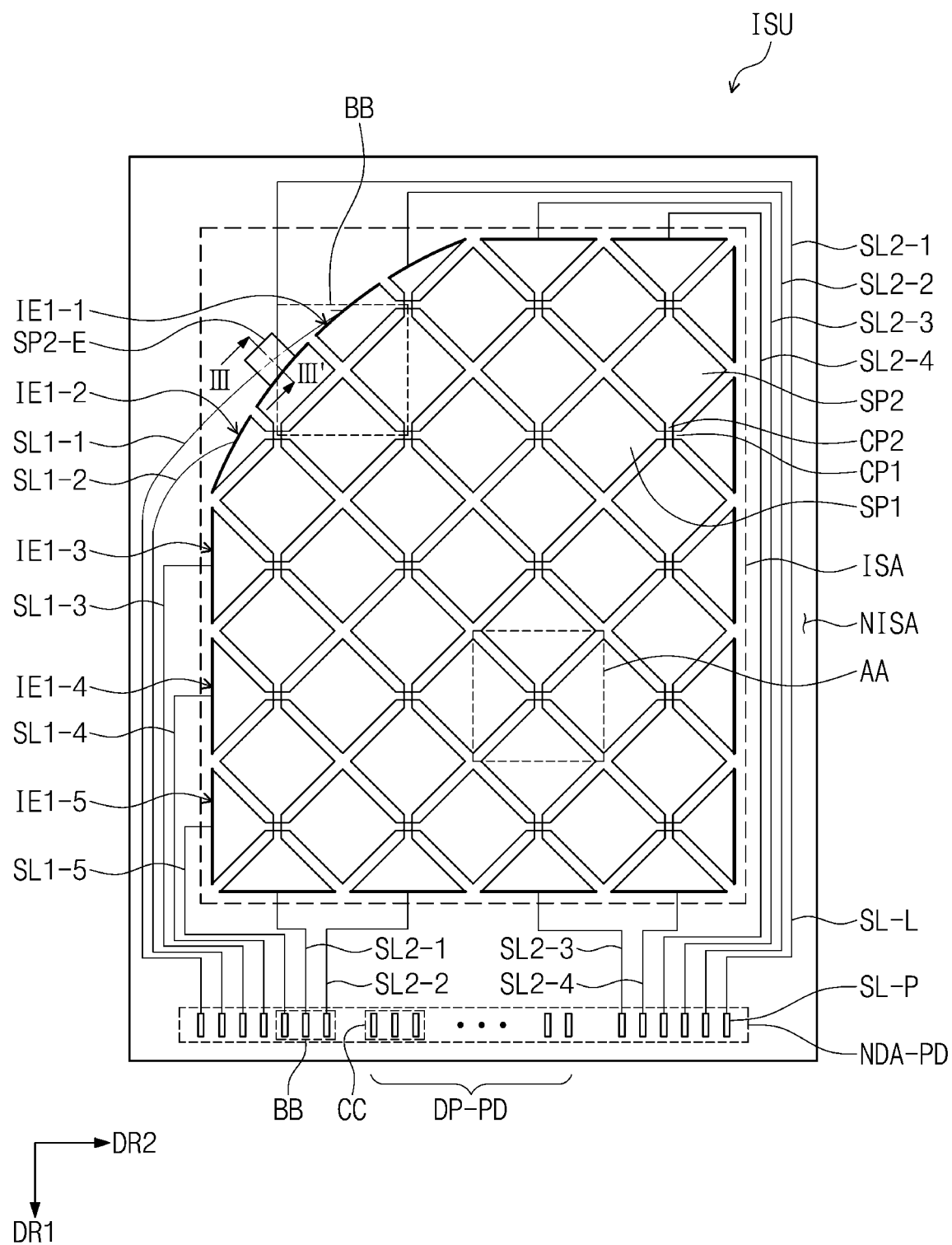
FIG. 25 is a plan view illustrating an input-sensing unit according to some embodiments of the inventive concept.
Figure 26:
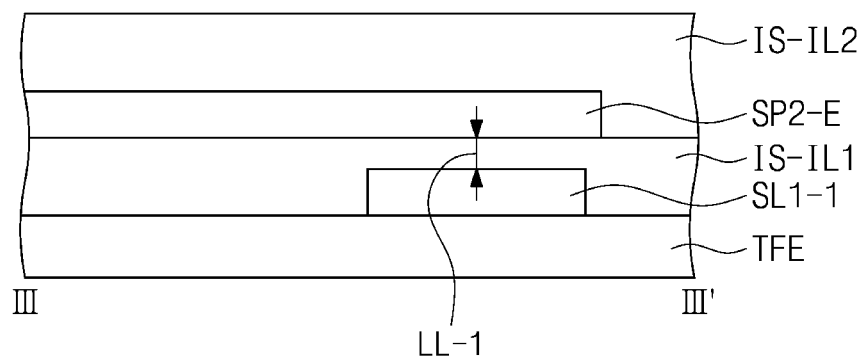
FIG. 26 is a sectional view taken along line III-Ill' of FIG. 25.

FIG. 25 is a plan view illustrating an input-sensing unit ISU according to some embodiments of the inventive concept. FIG. 26 is a sectional view taken along line III-Ill' of FIG. 25.

FIG. 25 illustrates an example of the input-sensing unit ISU in which some of the sensor portions SP1 and SP2 connected to the signal lines SL1-1 to SL1-5 and SL2-1 to SL2-4 are provided to form a curved shape. Signal lines SL1-1 and SL1-2, which are connected to the first sensor portions SP1 forming the curved shape, may have a shape (e.g., a curved shape) corresponding to the curved shape.

The input-sensing unit ISU may include an extension electrode SP2-E electrically connected to the second sensor portion SP2 (e.g., one of the second sensor portions SP2 provided to form the curved shape).

In some embodiments, the extension electrode SP2-E and the second sensor portion SP2 may form a single body. In other words, the extension electrode SP2-E may be an extended portion of the second sensor portion SP2. However, the inventive concept is not limited thereto, and in some embodiments, the extension electrode SP2-E and the second sensor portion SP2 may be separate elements. In this case, the extension electrode SP2-E may be formed by a separate process, and then it may be electrically connected to the second sensor portion SP2.

Referring to FIG. 26, the extension electrode SP2-E may be overlapped with the signal line SL1-1. The extension electrode SP2-E and the signal line SL1-1 may be spaced apart from each other by a distance LL-1, thereby forming a capacitor.

Areas of the sensor portions SP1 and SP2 may be smaller in the second unit region BB than in the first unit region AA, and this may lead to a difference in touch sensitivity. The capacitor which is formed by the extension electrode SP2-E and the signal line SL1-1 may be used (e.g., configured) to compensate for some or all of such a difference in touch sensitivity.

FIGS. 25 and 26 illustrate an example in which the extension electrode SP2-E is electrically connected to the second sensor portion SP2 and is overlapped with at least one of the signal lines, but the inventive concept is not limited thereto. In certain embodiments, the extension electrode may be electrically connected to the first sensor portion and may be overlapped with at least one of the signal lines.

Figure 27:
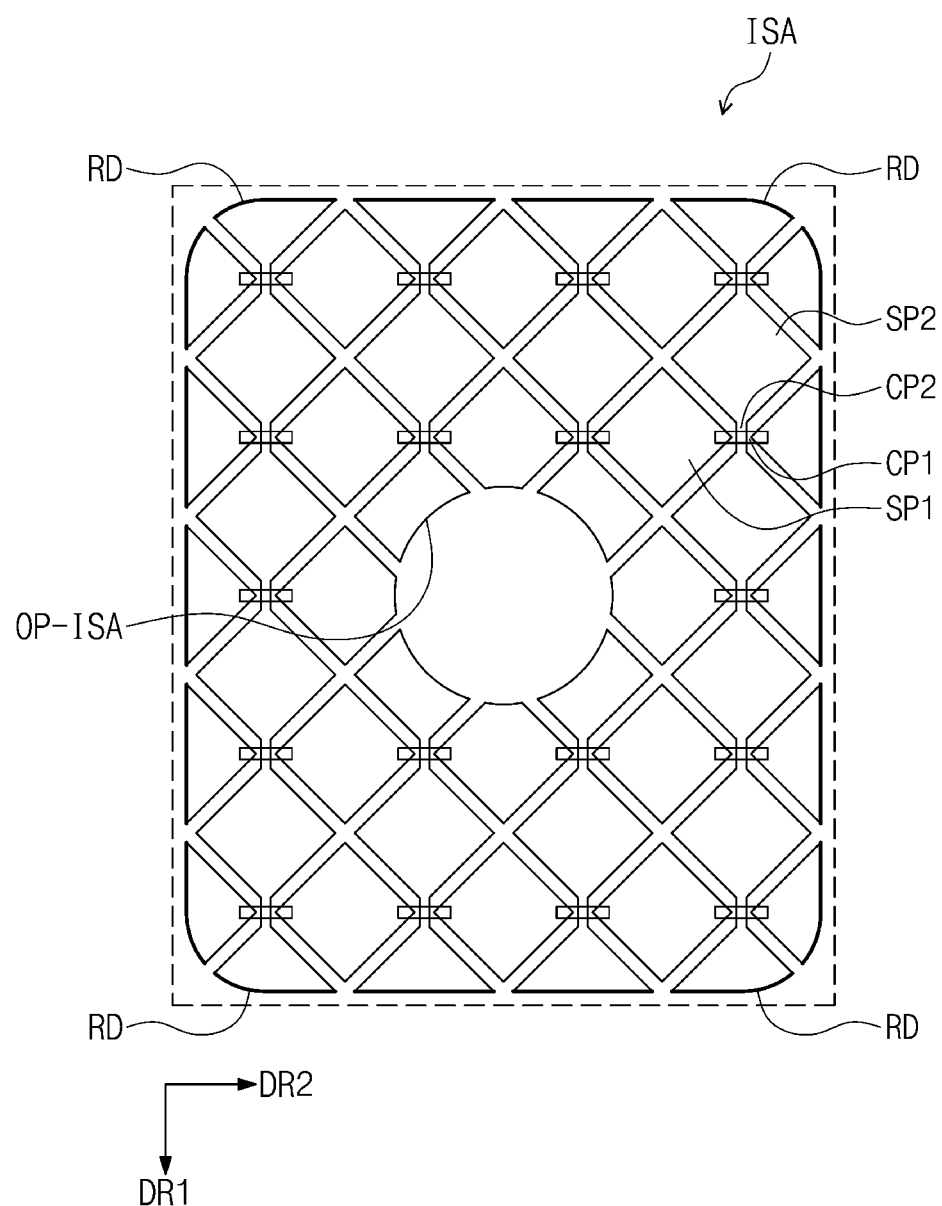
FIG. 27 illustrates an input-sensing region according to some embodiments of the inventive concept.

FIG. 27 illustrates an input-sensing region ISA according to some embodiments of the inventive concept.

Referring to FIG. 27, each corner of the input-sensing region ISA may have a rounded edge RD. FIG. 27 illustrates an example in which all of the four corners of the input-sensing region ISA have the rounded edge RD, but the inventive concept is not limited thereto. In certain embodiments, only at least one of the corners may have the rounded edge RD.

Due to the presence of the rounded edge RD, at least one of the sensor portions SP1 and SP2 may have an area that is smaller than the others. The methods in the above-described embodiments may be used to compensate for some or all of the reduction in capacitance which may be caused by the rounded edge RD.

An opening OP-ISA may be defined in the input-sensing region ISA. A size and a position of the opening OP-ISA may be changed.

Due to the presence of the opening OP-ISA, at least one of the sensor portions SP1 and SP2 may have an area that is smaller than the others. Similarly, the methods in the above-described embodiments may be used to compensate for some or all of the reduction in capacitance which may be caused by the opening OP-ISA.

Figure 28:
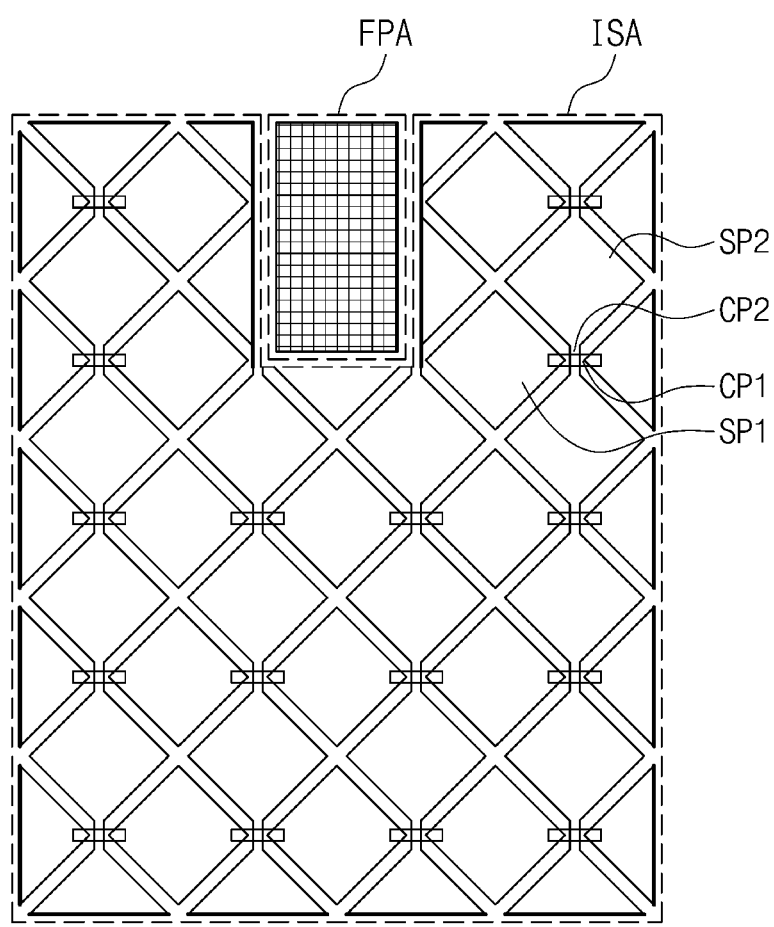
FIG. 28 illustrates an input-sensing region and a fingerprint-sensing region according to some embodiments of the inventive concept.

FIG. 28 illustrates an input-sensing region ISA and a fingerprint-sensing region FPA according to some embodiments of the inventive concept.

In some embodiments, a round portion, a cut portion, an opening, and/or so forth may be defined in the input-sensing region ISA, and the fingerprint-sensing region FSA may be defined to be adjacent thereto (e.g., disposed within the round portion, the cut portion, or the opening. The fingerprint-sensing region FPA may be configured to sense a user's fingerprint and may be used for security purposes (e.g., to unlock the display device DD or a device including or utilizing the display device DD).

The fingerprint-sensing region FPA is illustrated in FIG. 28, but the inventive concept is not limited thereto. In certain embodiments, the region which is adjacent to the round portion, the cut portion, or the opening of the input-sensing region ISA may be used for other purposes.

Figure 29A:
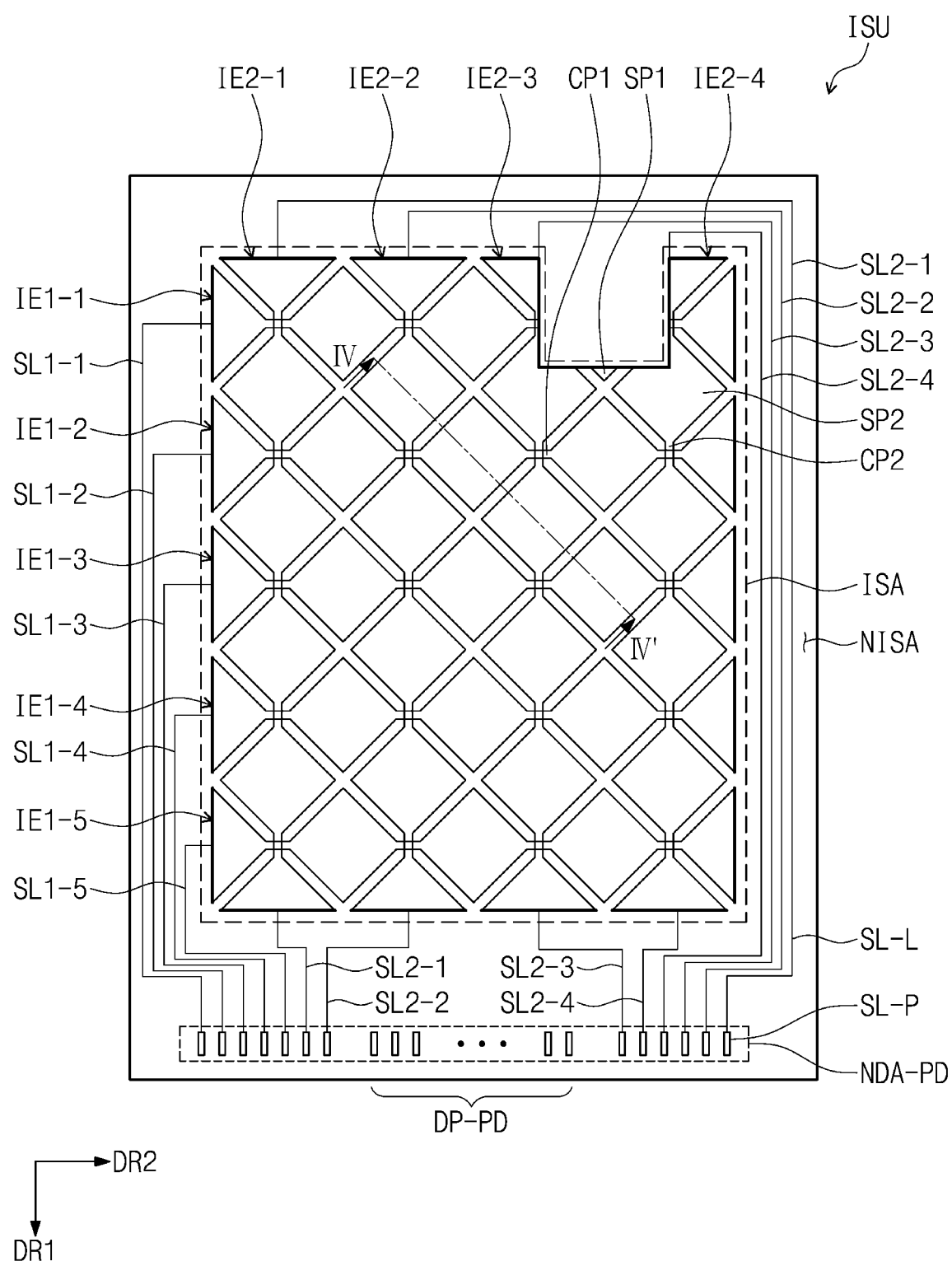
FIG. 29A is a plan view illustrating an input-sensing unit according to some embodiments of the inventive concept.
Figure 29B:
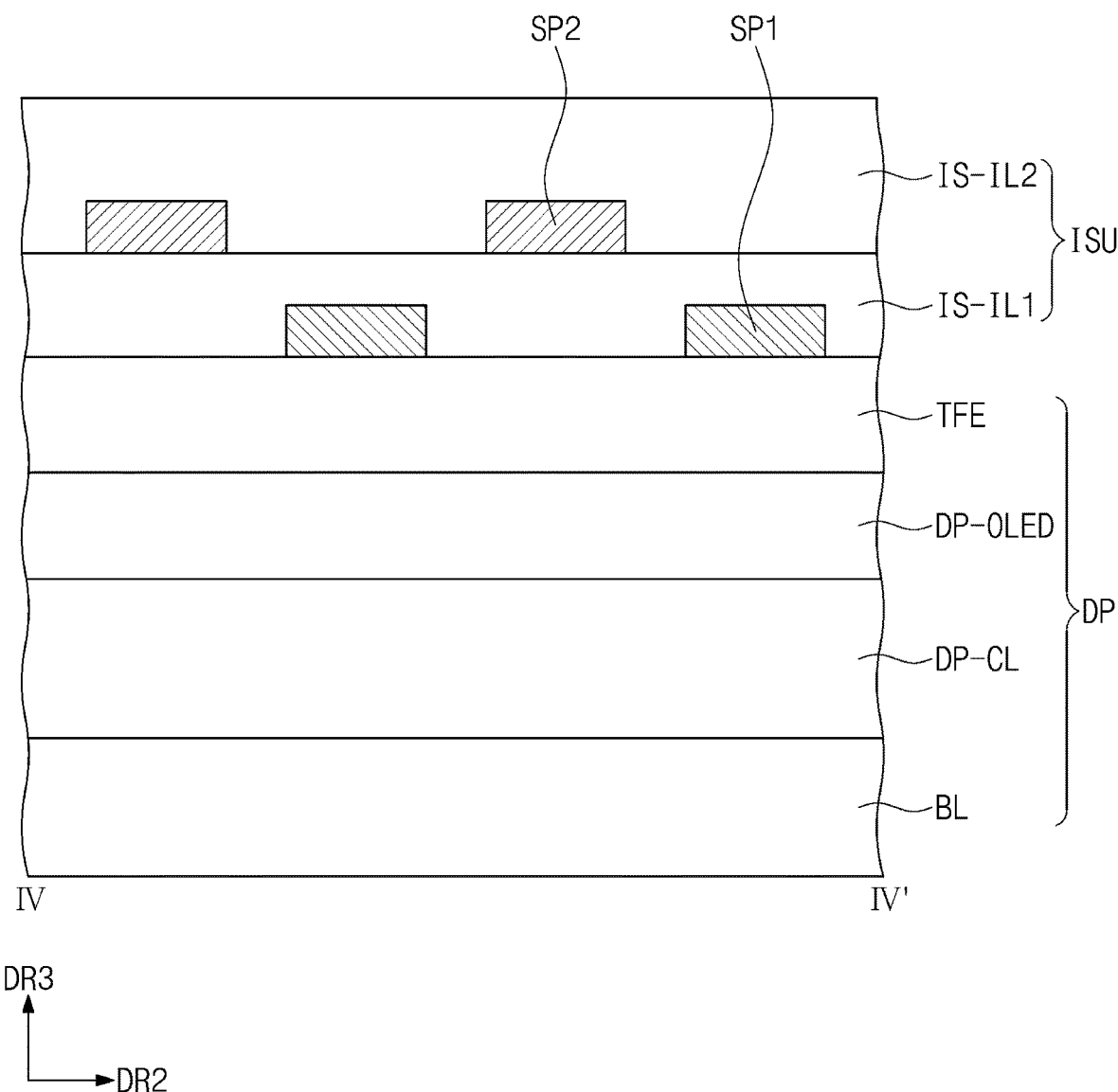
FIG. 29B is a sectional view taken along line IV-IV' of FIG. 29A.

FIG. 29A is a plan view illustrating an input-sensing unit ISU according to some embodiments of the inventive concept. FIG. 29B is a sectional view taken along line IV-IV' of FIG. 29A.

In the previous embodiments, the first sensor portion SP1 and the second sensor portion SP2 are illustrated to be placed on the same layer or at the same level, but in some embodiments, the first sensor portion SP1 and the second sensor portion SP2 may be placed on different layers or at different levels, as shown in FIGS. 29A and 29B. Accordingly, the first sensor portion SP1 and the second sensor portion SP2 may constitute capacitors.

Since the first sensor portion SP1 and the second sensor portion SP2 are placed on different layers from each other, the stacking structure of the signal lines SL1-1 to SL1-5 and SL2-1 to SL2-4 may be changed.

FIG. 29B illustrates an example, in which the first insulating layer IS-IL1 is formed to have a flat top surface, but in some embodiments, the first insulating layer IS-IL1 may be formed to have a stepwise portion. In the present embodiment, refractive indices of the first and second insulating layers IS-IL1 and IS-IL2 may be adjusted to reduce a difference in reflectance between the first sensing electrodes 1E1-1 to 1E1-5 and the second sensing electrodes 1E2-1 to 1E2-4 placed on different layers from each other.

The first insulating layer IS-IL1 may have a refractive index that is close to that of the first sensing electrodes 1E1-1 to 1E1-5. The second insulating layer IS-IL2 may have a refractive index that is less than that of the first insulating layer IS-IL1. For example, in the case where the first sensing electrodes 1E1-1 to 1E1-5 are ITO electrodes, the first insulating layer IS-IL1 may have a refractive index ranging from 1.7 to 1.8 (for light having a wavelength of 550 nm), and the second insulating layer IS-IL2 may have a refractive index between those of the air and the first insulating layer IS-IL1 (e.g., 1.5 to 1.65).

In the case where the first and second insulating layers IS-IL1 and IS-IL2 having different refractive indices are provided on the sensing electrodes, it may be possible to reduce reflectance of external light and to reduce a difference in reflectance between the first sensing electrodes 1E1-1 to 1E1-5 and the second sensing electrodes 1E2-1 to 1E2-4 placed on different layers.

Figure 30:
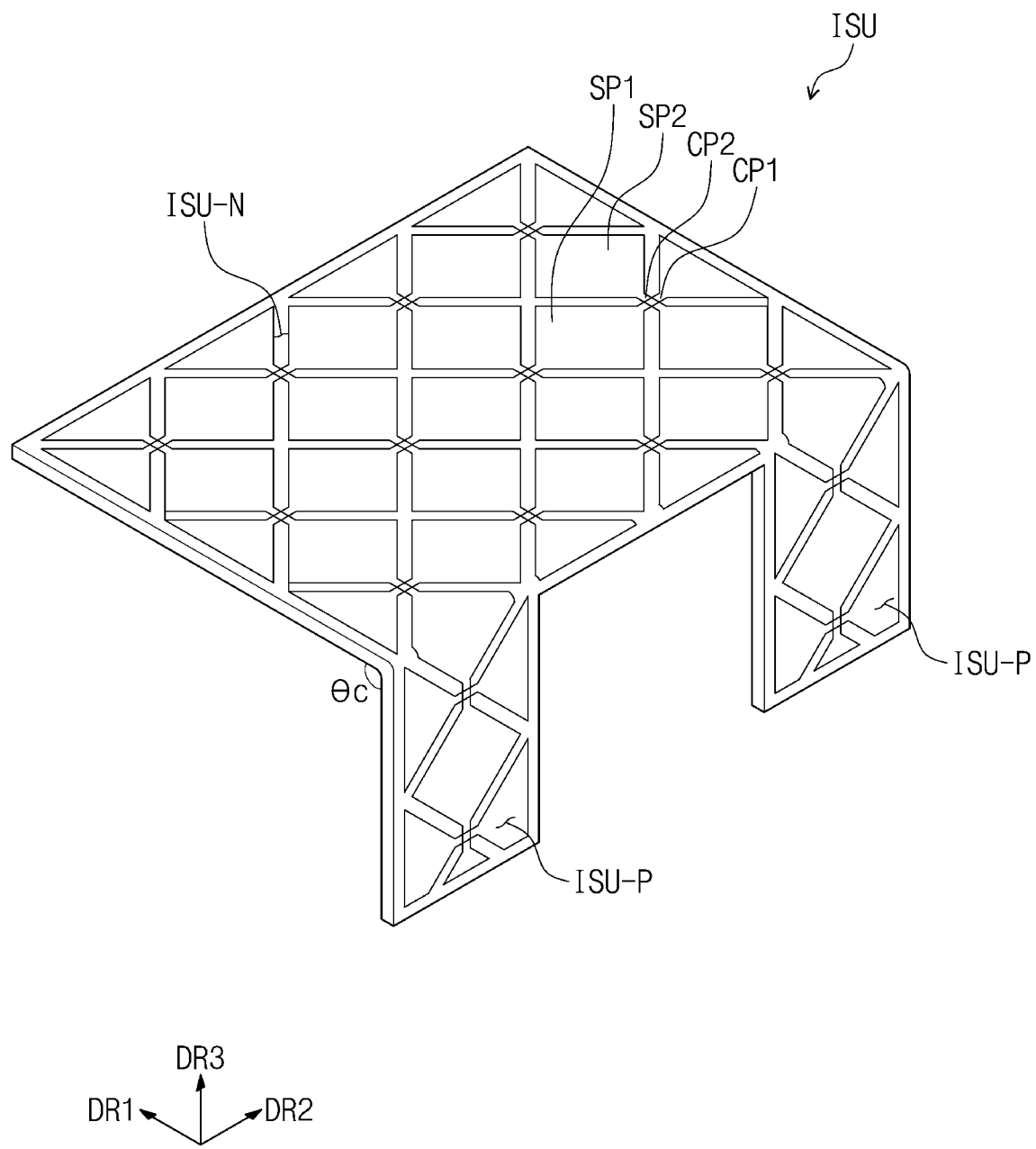
FIG. 30 is a perspective view illustrating an input-sensing unit according to some embodiments of the inventive concept.

FIG. 30 is a perspective view illustrating an input-sensing unit ISU according to some embodiments of the inventive concept. For convenience in illustration, only the sensor portions SP1 and SP2 and the connecting portions CP1 and CP2 of the input-sensing unit ISU are illustrated in FIG. 30.

The input-sensing unit ISU may include a planar portion ISU-N and protruding portions ISU-P. At least one of the protruding portions ISU-P may be at an angle θc (hereinafter, a bending angle) relative to the planar portion ISU-N. The bending angle θc may be a fixed value or a variable value. The bending angle θc may be adjusted to realize the input-sensing unit ISU in various shapes (e.g., the protruding portion ISU-P may be movable with respect to the planar portion ISU-N).

Figure 31:
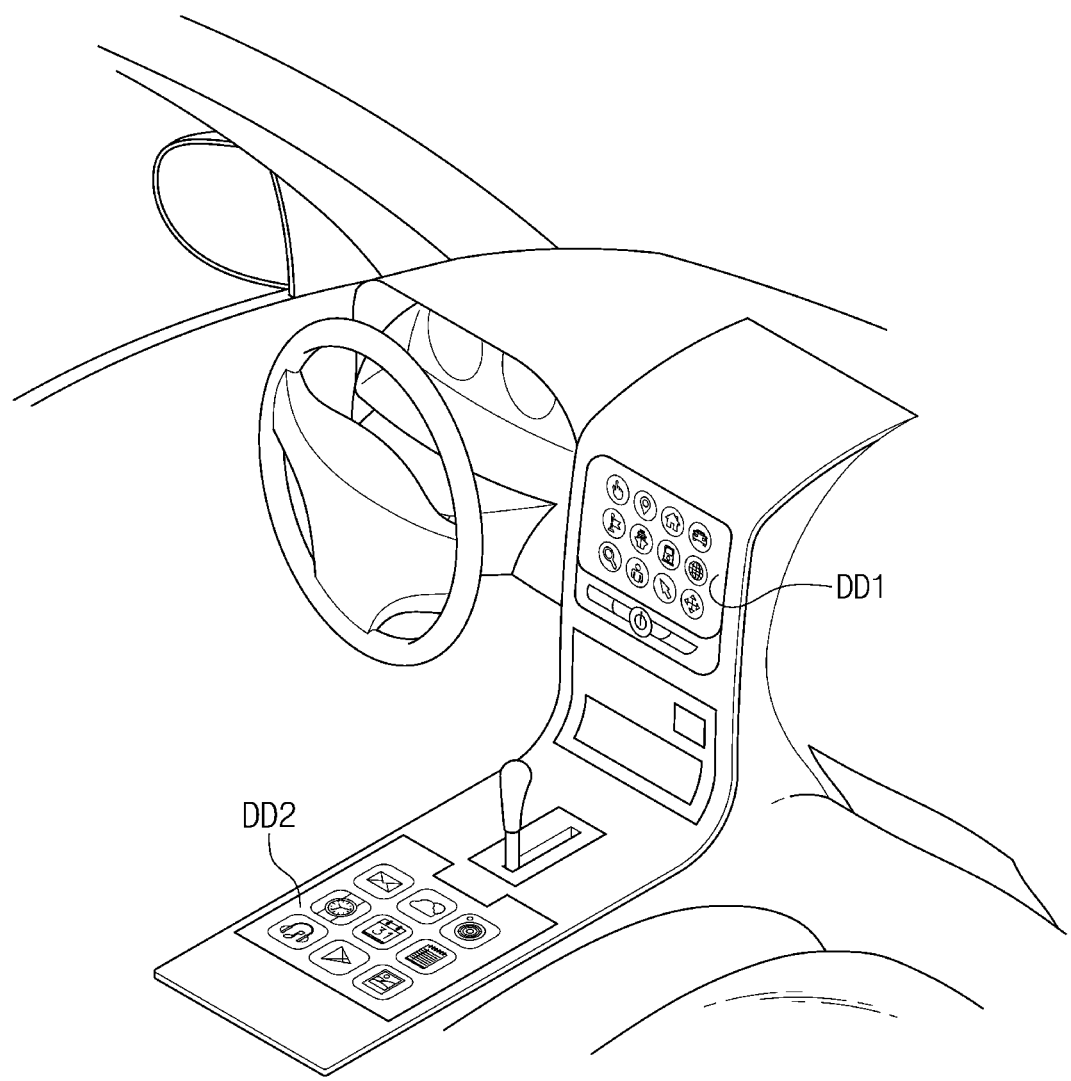
FIGS. 31 and 32 illustrate display devices according to some embodiments of the inventive concept.
Figure 32:
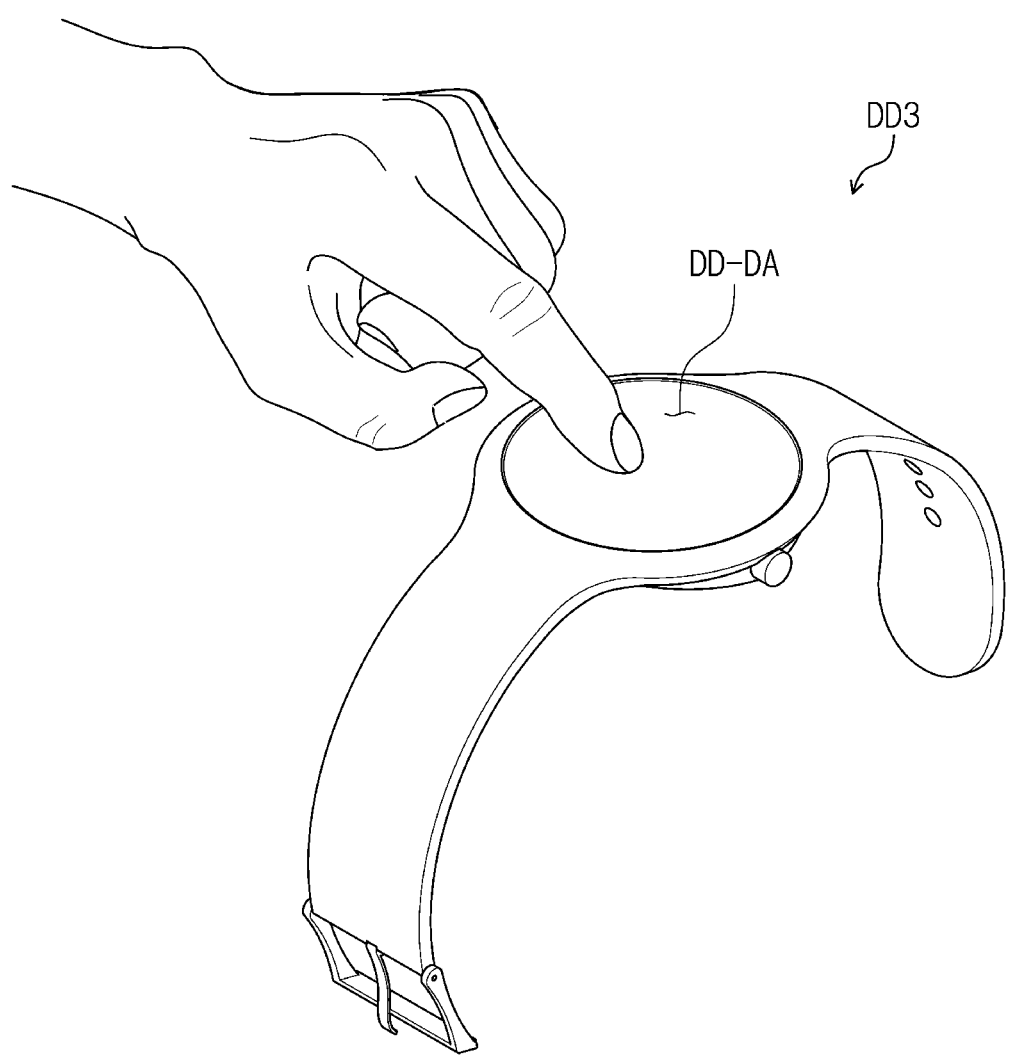

FIGS. 31 and 32 illustrate display devices DD1, DD2, and DD3 according to some embodiments of the inventive concept. Various display devices DD1 and DD2 may be used in a car.

As an example, FIG. 31 illustrates a display device DD1, which is used as a part of an embedded navigation system, and a display device DD2, which is placed near a gear lever.

The shapes of the display devices DD1 and DD2 may be changed, depending on the car design. For example, the display device may be configured to have rounded corners (e.g., as in the display device DD1 for the embedded navigation system) or a severed top portion (e.g., as in the display device DD2 near the gear lever).

In addition, although not shown, a rounded display device may be used for a dashboard of a car.

If the above-described input-sensing unit ISU is used for the display devices DD1 and DD2, it may be possible to improve an input-sensing ability of the display devices DD1 and DD2.

Referring to FIG. 32, the display device DD3 may be a wearable device that can be worn on the human body. In FIG. 32, a clock-type device is illustrated as an example of the display device DD3, but the inventive concept is not limited thereto. A shape of the display device DD3 may be variously changed to be worn on the human body.

To allow the wearable device to be worn on the human body, a shape of the display region DD-DA may be changed, as required. If the above-described input-sensing unit ISU is used for the display device DD3, it may be possible to improve an input-sensing ability of the display device DD3.

According to some embodiments of the inventive concept, a display device may include an input-sensing unit, in which capacitance between sensors is uniformly controlled.

Accordingly, it may be possible to achieve high uniformity in sensing sensitivity between the sensors of the input-sensing unit.

In addition, even when there is a change in shape of the sensors, it may be possible to secure uniform sensing sensitivity. Thus, the shapes of the sensors may be variously changed.

While example embodiments of the inventive concepts have been particularly shown and described, it will be understood by one of ordinary skill in the art that variations in form and detail may be made therein without departing from the spirit and scope of the attached claims and their equivalents.

What is claimed is:

1. A display device comprising:
a display panel; and
an input-sensing unit on the display panel,
wherein the input-sensing unit comprises:
a plurality of first electrodes extending in a first direction; and
a plurality of second electrodes extending in a second direction crossing the first direction,
wherein each of the plurality of first electrodes comprises
a plurality of first sensor portions and a plurality of first connecting portions connecting the plurality of first sensor portions to each other, wherein each of the plurality of second electrodes comprises a plurality of second sensor portions and a plurality of second connecting portions connecting the plurality of second sensor portions to each other, and wherein the plurality of first sensor portions of one of the plurality of first electrodes comprises:
- a first normal sensor portion having a first area and being spaced apart from an adjacent one of the second sensor portions by a first distance; and
- a first severed sensor portion having a second area different from the first area and being spaced apart from an adjacent one of the second sensor portions by a second distance that is different from the first distance.

2. The display device of claim 1, wherein the first severed sensor portion has a shape which can be made by removing a portion of a shape of the first normal sensor portion, and
the second area is smaller than the first area, and the second distance is smaller than the first distance.

3. The display device of claim 2, wherein the second area is less than or larger than half of the first area.

4. The display device of claim 2, wherein the plurality of first sensor portions of the one of the first electrodes comprises a plurality of first normal sensor portions comprising the first normal sensor portion,
wherein the plurality of first normal sensor portions are arranged in the first direction, and
wherein the first severed sensor portion is outside the plurality of first normal sensor portions in the first direction.

5. The display device of claim 1, further comprising an optical dummy electrode located between the plurality of first sensor portions and the plurality of second sensor portions and electrically disconnected from the plurality of first sensor portions and the plurality of second sensor portions,
wherein a width of the optical dummy electrode between the first severed sensor portion and one of the plurality of second sensor portions that is adjacent to the first severed sensor portion is smaller than a width of the optical dummy electrode between the first normal sensor portion and one of the plurality of second sensor portions that is adjacent to the first normal sensor portion.

6. The display device of claim 4, wherein a length from an end of the first severed sensor portion to another end of a first sensor portion adjacent to the first severed sensor portion measured in the first direction is smaller than a length from an end of a first normal sensor portion of the plurality of first normal sensor portions to another end of a first sensor portion adjacent to the first normal sensor portion measured in the first direction, and
an area of the first sensor portion adjacent to the first severed sensor portion is substantially the same as the second area.

7. The display device of claim 1, wherein the plurality of first electrodes comprises another first electrode with a length in the first direction that is different from a length in the first direction of the one of the first electrodes, and which includes a plurality of first sensor portions, and
the plurality of first sensor portions of the another first electrode comprise:
a second normal sensor portion having the first area; and
a second severed sensor portion having a third area different from the first area and the second area.

8. The display device of claim 7, wherein an end of the first severed sensor portion is connected to an end of an adjacent one of the plurality of first sensor portions of the one of the first electrodes by a corresponding one of the first connecting portions,
an end of the second severed sensor portion is connected to an end of an adjacent one of the plurality of first sensor portions of the another first electrode by a corresponding one of the first connecting portions, and
a length from another end of the first severed sensor portion to another end of the adjacent one of the plurality of first sensor portions of the one of the first electrodes is smaller than a length from another end of the second severed sensor portion to another end of the adjacent one of the plurality of first sensor portions of the another first electrode.

9. The display device of claim 7, wherein the third area is half the first area.

10. The display device of claim 1, further comprising an auxiliary electrode connected to the first severed sensor portion,
wherein a side edge of the auxiliary electrode faces a side edge of one of the plurality of second sensor portions that is adjacent to the first severed sensor portion.

11. The display device of claim 10, wherein the auxiliary electrode has a rod shape, and a length of the auxiliary electrode is smaller than a width of the first normal sensor portion.

12. The display device of claim 1, wherein the second area is smaller than the first area, and the second distance is smaller than the first distance.

13. The display device of claim 1, wherein the first normal sensor portion is spaced apart from an adjacent one of the second sensor portions by the first distance, and the first severed sensor portion is spaced apart from an adjacent one of the second sensor portions by the second distance that is smaller than the first distance.

14. A display device comprising:
a display panel; and
an input-sensing unit on the display panel,
wherein the input-sensing unit comprises:
a plurality of first electrodes extending in a first direction; and
a plurality of second electrodes extending in a second direction crossing the first direction,
wherein each of the plurality of first electrodes comprises a plurality of first sensor portions and a plurality of first connecting portions connecting the plurality of first sensor portions to each other,
wherein each of the plurality of second electrodes comprises a plurality of second sensor portions and a plurality of second connecting portions connecting the plurality of second sensor portions to each other, and
wherein the plurality of first sensor portions of one of the plurality of first electrodes comprises:
a first normal sensor portion having a first area and being spaced apart from an adjacent one of the second sensor portions by a first distance; and
a first severed sensor portion having a second area different from the first area and being spaced apart from an adjacent one of the second sensor portions by a second distance that is different from the first distance, and
wherein at least one of edges of the first severed sensor portion has a predetermined curvature.

* * * * *